(12) United States Patent
Yamazaki et al.

(10) Patent No.: US 7,968,884 B2
(45) Date of Patent: Jun. 28, 2011

(54) SEMICONDUCTOR DEVICE AND MANUFACTURING METHOD THEREOF

(75) Inventors: Shunpei Yamazaki, Tokyo (JP); Kazuko Ikeda, Kanagawa (JP); Shinya Sasagawa, Kanagawa (JP); Hideomi Suzawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 197 days.

(21) Appl. No.: 11/945,739

(22) Filed: Nov. 27, 2007

(65) Prior Publication Data

US 2008/0128808 A1 Jun. 5, 2008

(30) Foreign Application Priority Data

Dec. 5, 2006 (JP) ................................. 2006-327921

(51) Int. Cl.
*H01L 29/10* (2006.01)
*H01L 29/76* (2006.01)
*H01L 31/036* (2006.01)
*H01L 31/112* (2006.01)

(52) U.S. Cl. ........ 257/66; 257/69; 257/72; 257/E51.005

(58) Field of Classification Search .................... 257/66, 257/69, 72, E51.005
See application file for complete search history.

(56) References Cited

U.S. PATENT DOCUMENTS

| | | |
|---|---|---|
| 5,650,339 A | 7/1997 | Saito et al. |
| 5,652,453 A | 7/1997 | Iwamatsu et al. |
| 5,773,330 A | 6/1998 | Park |
| 5,989,998 A | 11/1999 | Sugahara et al. |
| 6,030,873 A | 2/2000 | Iwamatsu et al. |
| 6,087,698 A | 7/2000 | Saito et al. |
| 6,100,558 A | 8/2000 | Krivokapic et al. |
| 6,104,065 A | 8/2000 | Park |
| 6,388,291 B1 | 5/2002 | Zhang et al. |
| 6,433,361 B1 | 8/2002 | Zhang et al. |
| 6,555,843 B1 | 4/2003 | Yamazaki et al. |
| 6,558,756 B2 | 5/2003 | Sugahara et al. |

(Continued)

FOREIGN PATENT DOCUMENTS

EP 0 532 314 A1 3/1993

(Continued)

OTHER PUBLICATIONS

Office Action re Chinese application No. CN 200710196482.2, dated Mar. 9, 2011 (with English translation).

*Primary Examiner* — Phat X Cao
(74) *Attorney, Agent, or Firm* — Husch Blackwell LLP

(57) ABSTRACT

A semiconductor device manufactured utilizing an SOI substrate, in which defects due to an end portion of an island-shaped silicon layer are prevented and the reliability is improved, and a manufacturing method thereof. The following are included: an SOI substrate in which an insulating layer and an island-shaped silicon layer are stacked in order over a support substrate; a gate insulating layer provided over one surface and a side surface of the island-shaped silicon layer; and a gate electrode which is provided over the island-shaped silicon layer with the gate insulating layer interposed therebetween. The gate insulating layer is formed such that the dielectric constant in the region which is in contact with the side surface of the island-shaped silicon layer is lower than that over the one surface of the island-shaped silicon layer.

27 Claims, 31 Drawing Sheets

U.S. PATENT DOCUMENTS

| | | |
|---|---|---|
| 6,559,548 B1 | 5/2003 | Matsunaga et al. |
| 6,864,583 B2 | 3/2005 | Matsunaga et al. |
| 6,876,039 B2 | 4/2005 | Okihara |
| 7,060,323 B2 | 6/2006 | Sugahara et al. |
| 7,115,903 B2 | 10/2006 | Isobe et al. |
| 7,183,211 B2 | 2/2007 | Konno et al. |
| 2003/0096462 A1 | 5/2003 | Tanabe |
| 2004/0026696 A1* | 2/2004 | Yamazaki et al. .............. 257/66 |
| 2005/0116305 A1 | 6/2005 | Hwang et al. |
| 2007/0034871 A1* | 2/2007 | Itoh et al. ....................... 257/59 |
| 2007/0123035 A1 | 5/2007 | Sugimoto et al. |
| 2007/0252179 A1 | 11/2007 | Isobe et al. |
| 2007/0281400 A1 | 12/2007 | Yamazaki et al. |
| 2008/0128703 A1 | 6/2008 | Ikeda et al. |
| 2008/0132066 A1 | 6/2008 | Phan et al. |

FOREIGN PATENT DOCUMENTS

| | | |
|---|---|---|
| EP | 0 826 791 B1 | 4/2002 |
| EP | 1 333 476 A2 | 8/2003 |
| EP | 1 182 275 B1 | 2/2004 |
| EP | 1 050 599 B1 | 6/2004 |
| EP | 1 207 217 B1 | 11/2004 |
| EP | 1 536 482 A1 | 6/2005 |
| JP | 59-150469 | 8/1984 |
| JP | 7-176753 | 7/1995 |
| JP | 8-18055 | 1/1996 |
| JP | 8-335702 | 12/1996 |
| JP | 9-23010 | 1/1997 |
| JP | 11-258636 | 9/1999 |
| JP | 2005-19859 | 1/2005 |
| JP | 2005-167207 | 6/2005 |

* cited by examiner

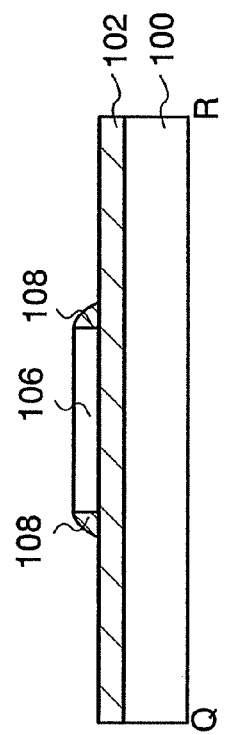
FIG. 3A-1
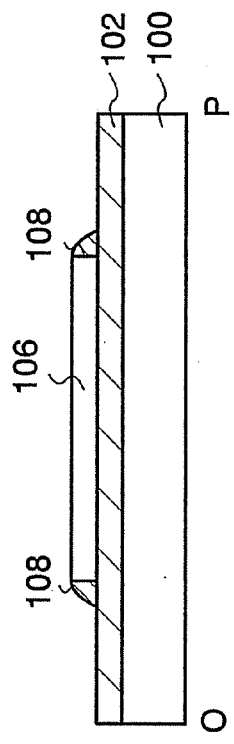
FIG. 3B-1
FIG. 3C-1
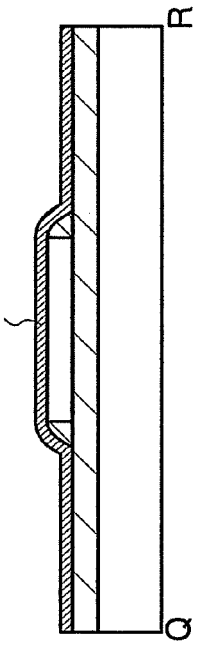
FIG. 3A-2
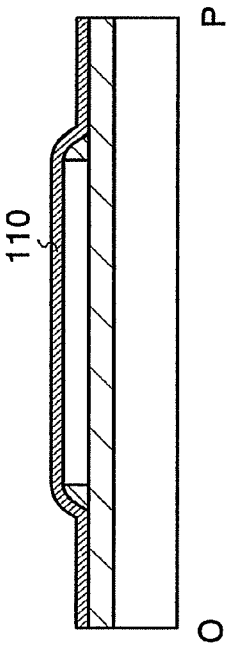
FIG. 3B-2
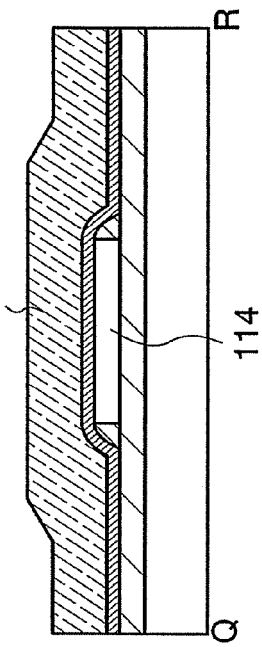
FIG. 3C-2
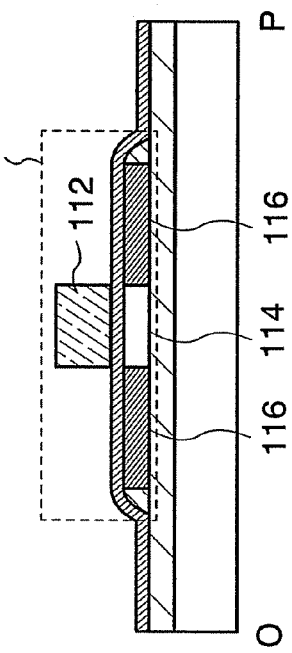

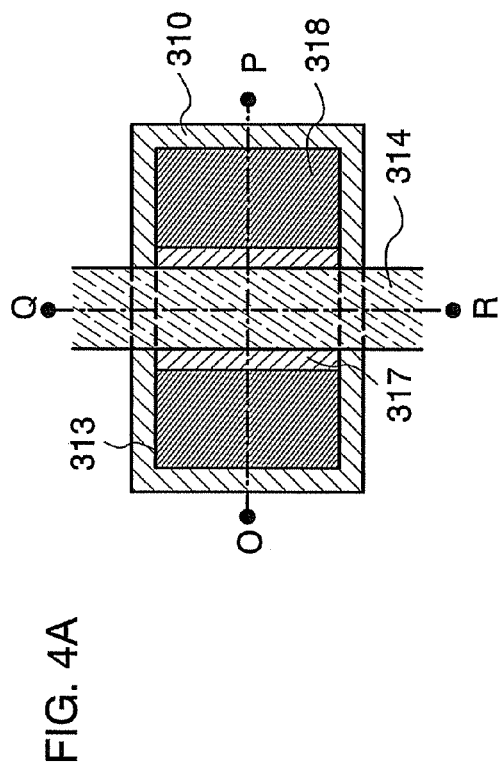
FIG. 4A
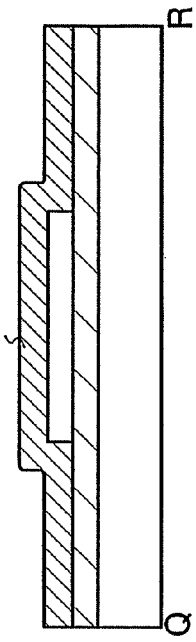
FIG. 4B-1
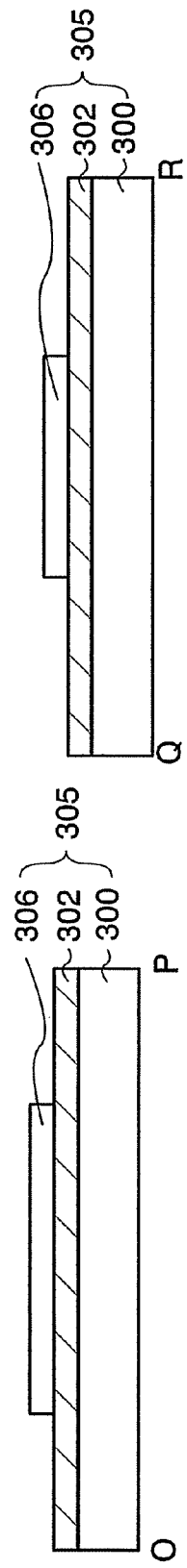
FIG. 4B-2
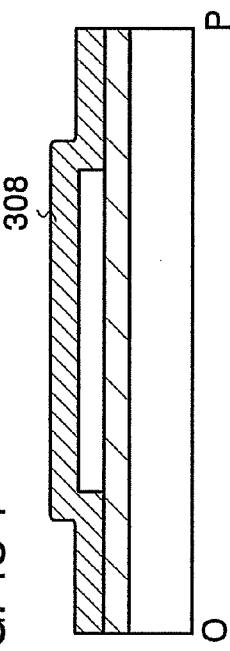
FIG. 4C-1
FIG. 4C-2

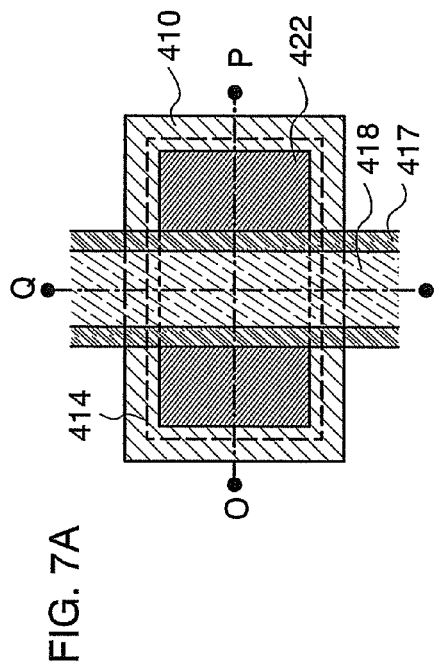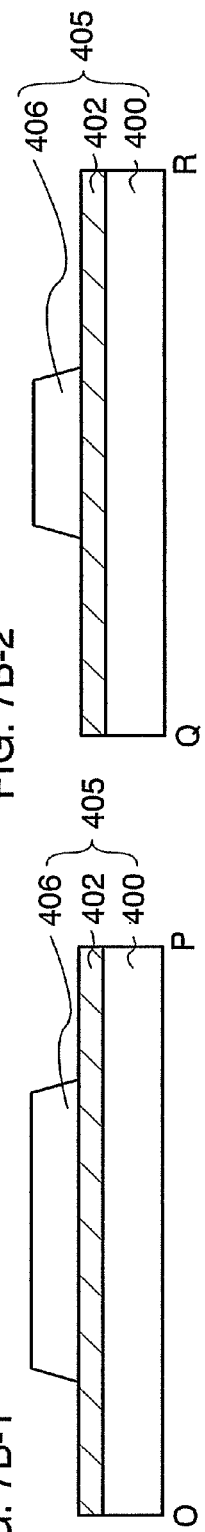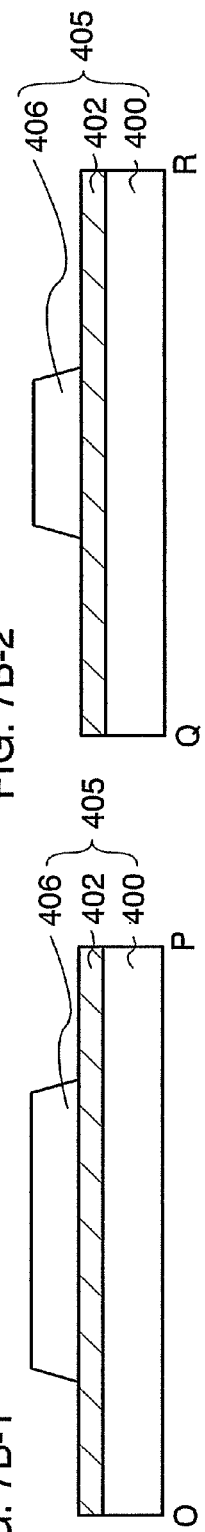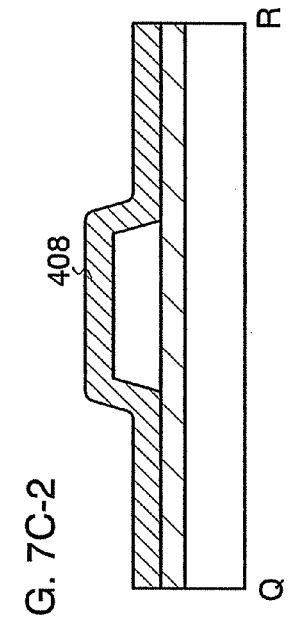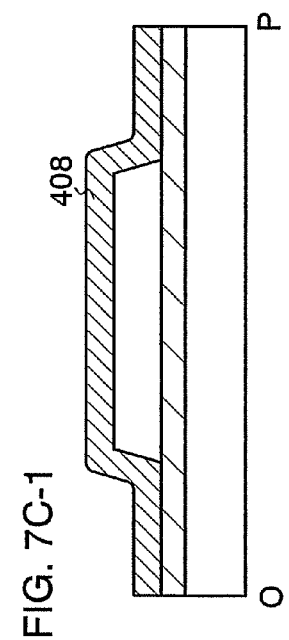

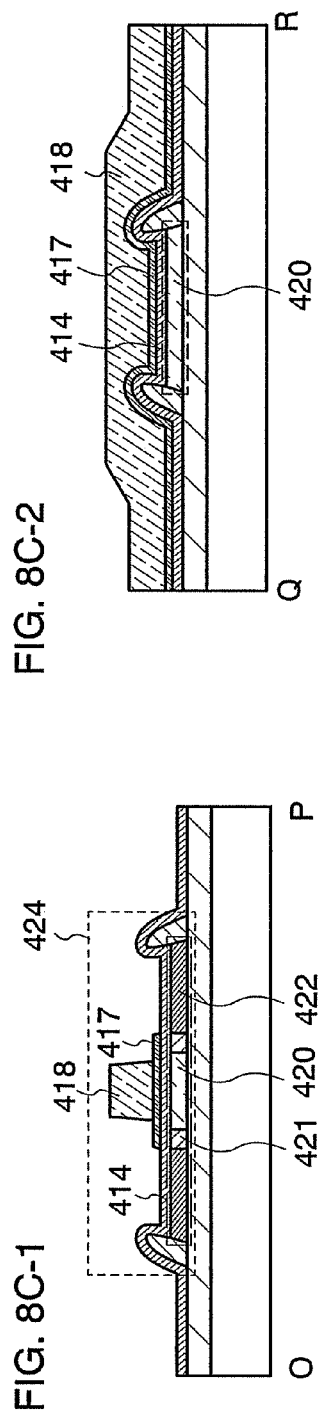
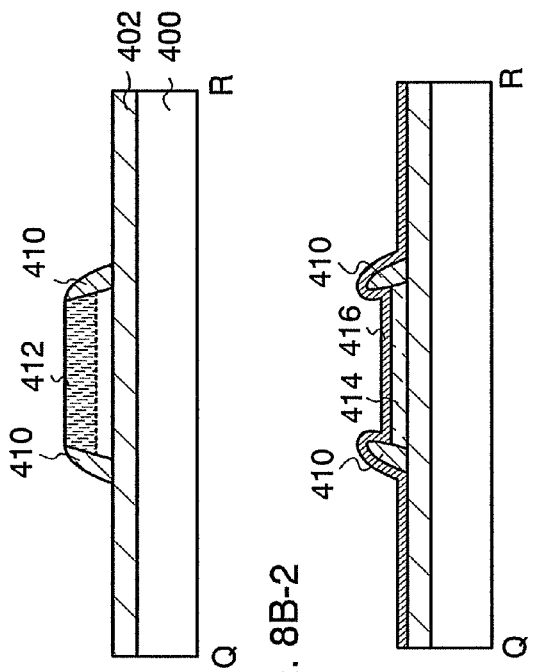
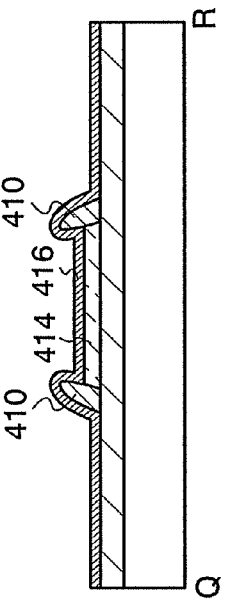
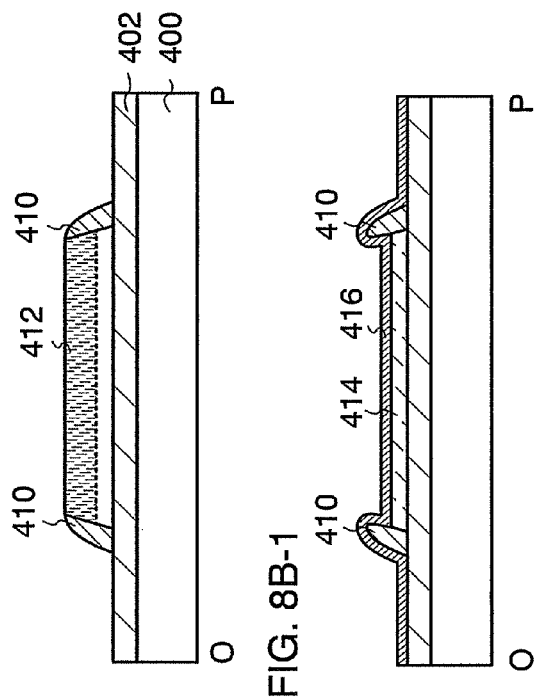
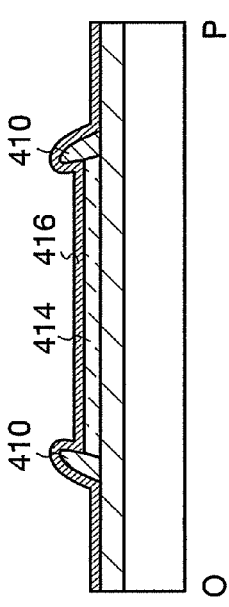

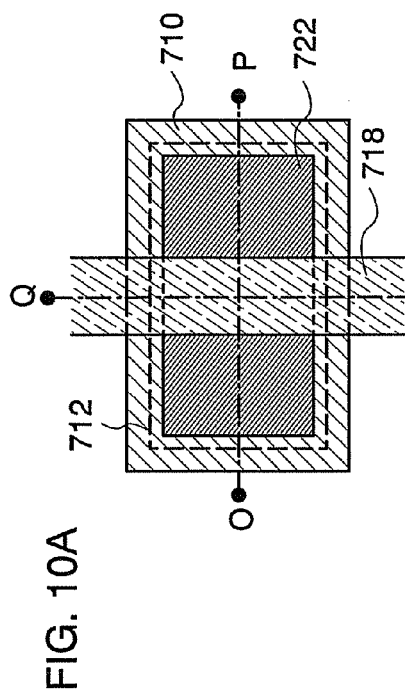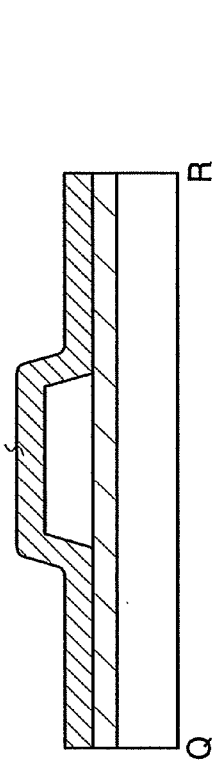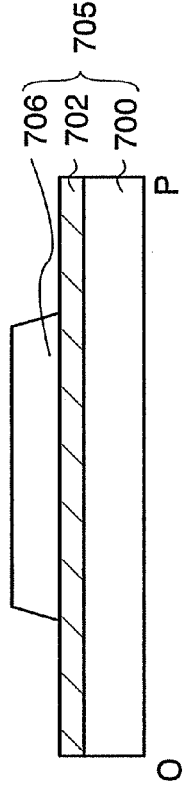

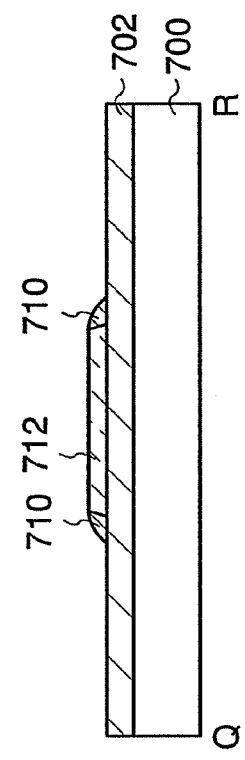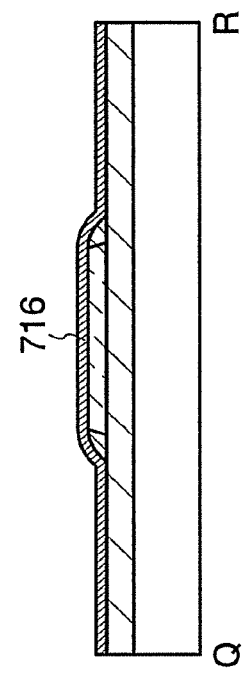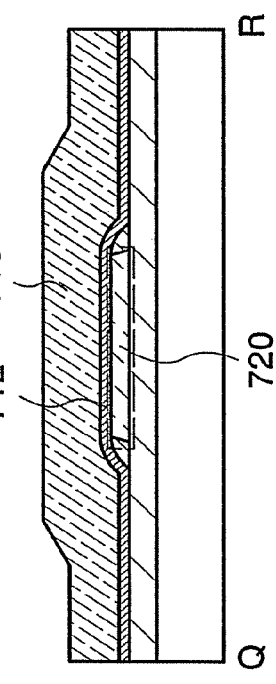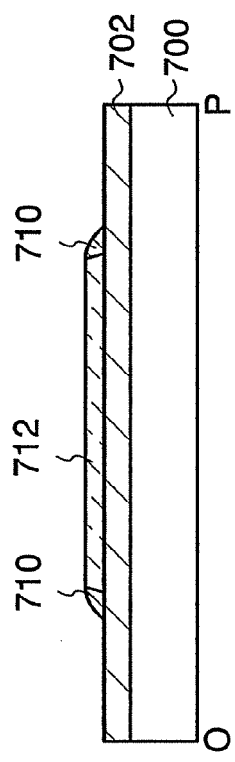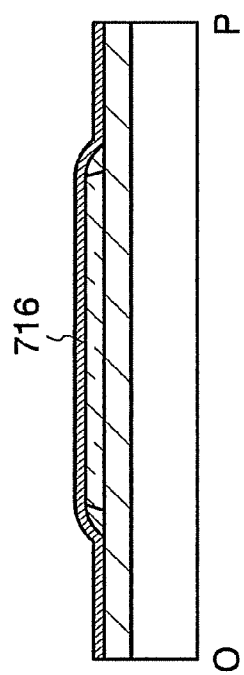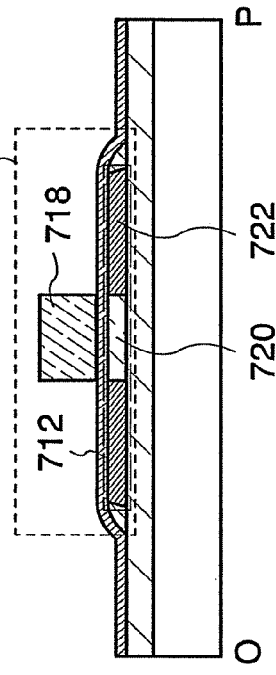

SEMICONDUCTOR DEVICE AND MANUFACTURING METHOD THEREOF

BACKGROUND OF THE INVENTION

1. Field of the Invention

The present invention relates to a semiconductor device manufactured using an SOI (Silicon On Insulator) substrate and a manufacturing method thereof.

2. Description of the Related Art

In recent years, VLSI technology has been drastically progressed, and an SOI structure by which speeding up and low power consumption are realized has been attracted attention. In this technology, an active region (a channel formation region) of a field effect transistor (FET), which has been conventionally formed of a bulk single crystal silicon, is formed of a thin-film single crystal silicon.

In a substrate used for the SOI structure, a thin-film silicon layer is formed over a single crystal silicon substrate with a buried oxide film layer interposed therebetween. Therefore, it has been known that when a MOS (Metal Oxide Semiconductor) field effect transistor (MOSFET) is manufactured using an SOI substrate, the parasitic capacitance can be reduced than the conventional case of using a bulk single crystal silicon substrate, and such a MOSFET is advantageous for speeding up.

Pattern diagrams of a conventional thin film transistor using an SOI substrate are FIGS. 12A to 12C. FIG. 12A is a top diagram of the thin film transistor, FIG. 12B is a cross-sectional diagram along a dashed line O-P in FIG. 12A, and FIG. 12C is a cross-sectional diagram along a dashed line Q-R in FIG. 12A. Note that in FIG. 12A, a thin film and the like included in the thin film transistor are partially omitted.

The thin film transistor shown in FIGS. 12A to 12C is formed using an SOI substrate 9005 in which an insulating layer 9002 and a silicon layer 9006 are stacked in order over a support substrate 9000. The silicon layer 9006 is formed into an island shape, and a conductive layer 9012 which functions as a gate electrode is formed over the silicon layer 9006 with a gate insulating layer 9004 interposed therebetween. Further, the silicon layer 9006 includes a channel formation region 9008 which is formed in a region overlapping with the conductive layer 9012 with the gate insulating layer 9004 interposed therebetween, and an impurity region 9010 which functions as a source or drain region.
Japanese Published Patent Application No. 2005-019859

However, in the above-described thin film transistor using an SOI substrate, various defects occur due to an end portion of the island-shaped silicon layer. For example, in the case of using an SOI substrate, a gate insulating layer can be formed by oxidizing a surface of a silicon layer with a thermal oxidation method. With the use of the thermal oxidation method, a good insulating layer can be obtained whereas there is a problem in that oxidation also progresses from an end portion of the silicon layer so that the gate insulating layer 9004 enters the end portion of the silicon layer as shown by a dashed line 9007 in FIG. 12B.

Further, due to an effect of an etching process, a washing process using hydrofluoric acid or the like, or the like in shaping the silicon layer into an island shape, an insulating layer provided under the silicon layer may be removed. In particular, in the case where the silicon layer is made into a thin film, that effect becomes remarkable. In this case, as shown by a dashed line 9009 in FIG. 12C, coverage with the gate insulating layer tends to decrease near the end portion of the silicon layer.

On the other hand, in the case where the gate insulating layer is formed by using a CVD method or a sputtering method instead of a thermal oxidation method, coverage with the gate insulating layer tends to decrease at the end portion of the silicon layer because there is a step at the end portion of the silicon layer.

When the coverage with the gate insulating layer at the end portion of the silicon layer is not enough, there may be short-circuiting with a conductive layer forming a gate electrode or occurrence of a leakage current. Further, insufficiency of coverage with the gate insulating layer also causes electro-static discharge (ESD) or the like of an element or the gate insulating layer. In particular, for low power consumption or high operating speed of a thin film transistor, making the gate insulating layer a thinner film has been desired, and the insufficiency of coverage with the gate insulating layer becomes a more significant problem in the case where the gate insulating layer is made thin. Furthermore, as the gate insulating layer is made thinner, the problem of electro-static discharge becomes serious.

Further, at the end portion of the silicon layer, particularly at a region where the conductive layer forming the gate electrode overlaps with the silicon layer, there is also a problem in that a leakage current due to concentration of electric field tends to occur at a corner portion (a corner).

SUMMARY OF THE INVENTION

Because of such a problem due to the end portion of the island-shaped silicon layer, operating characteristics of a thin film transistor are deteriorated and the reliability is also reduced. Further, the yield is decreased in manufacturing a semiconductor device, which leads to increase of manufacturing cost. The present invention is made in view of the foregoing problems, and it is an object of the present invention to provide a semiconductor device having a novel structure in which the reliability is increased and a manufacturing method thereof.

According to a structure of a semiconductor device of the present invention, an SOI substrate in which an insulating layer and an island-shaped silicon layer are stacked in order over a support substrate, a gate insulating layer provided over one surface and a side surface of the island-shaped silicon layer, and a gate electrode which is provided over the island-shaped silicon layer with the gate insulating layer interposed therebetween and which is provided so as to get across the island-shaped silicon layer are included, and as for the gate insulating layer, the dielectric constant in the region which is in contact with the side surface of the island-shaped silicon layer is lower than that over the one surface of the island-shaped silicon layer.

According to another structure of the semiconductor device of the present invention, an SOI substrate in which an insulating layer and an island-shaped silicon layer are stacked in order over a support substrate, a gate insulating layer provided over one surface and a side surface of the island-shaped silicon layer, and a gate electrode which is provided over the island-shaped silicon layer with the gate insulating layer interposed therebetween and which is provided so as to get across the island-shaped silicon layer are included, and as for the gate insulating layer at least in the region which overlaps with the gate electrode, the dielectric constant in the region which is in contact with the side surface of the island-shaped silicon layer is lower than that over the one surface of the island-shaped silicon layer.

According to another structure of the semiconductor device of the present invention, an SOI substrate in which an insulating layer and an island-shaped silicon layer are stacked in order over a support substrate, a gate insulating layer provided over one surface and a side surface of the island-shaped silicon layer, and a gate electrode which is provided over the island-shaped silicon layer with the gate insulating layer interposed therebetween and which is provided so as to get across the island-shaped silicon layer are included, and as for the gate insulating layer, the thickness in the region which is in contact with the side surface of the island-shaped silicon layer is larger and the dielectric constant in the same region is lower than those over the one surface of the island-shaped silicon layer.

According to another structure of the semiconductor device of the present invention, an SOI substrate in which an insulating layer and an island-shaped silicon layer are stacked in order over a support substrate, a gate insulating layer provided over one surface and a side surface of the island-shaped silicon layer, and a gate electrode which is provided over the island-shaped silicon layer with the gate insulating layer interposed therebetween and which is provided so as to get across the island-shaped silicon layer are included, and as for the gate insulating layer at least in the region which overlaps with the gate electrode, the thickness in the region which is in contact with the side surface of the island-shaped silicon layer is larger and the dielectric constant in the same region is lower than those over the one surface of the island-shaped silicon layer.

Further, in the above-described structure, the thickness of the gate insulating layer in the region which is in contact with the side surface of the island-shaped silicon layer is preferably larger than that over the one surface of the island-shaped silicon layer and equal to or less than three times as large as the same. That is, as for the gate insulating layer, provided that the thickness over the one surface of the island-shaped silicon layer is t1 and the thickness in the region which is in contact with the side surface of the island-shaped silicon layer is t2, it is preferable to satisfy t1<t2≦3t1.

Further, in the above-described structure, the gate insulating layer provided over the one surface and the side surface of the island-shaped silicon layer may be formed of a first insulating layer provided on the one surface of the island-shaped silicon layer and a second insulating layer provided on the side surface of the island-shaped silicon layer.

Further, in the above-described structure, the gate insulating layer provided over the one surface and the side surface of the island-shaped silicon layer may be formed of a first insulating layer provided over the one surface of the island-shaped silicon layer and a second insulating layer and a third insulating layer provided over the side surface of the island-shaped silicon layer.

Further, in the above-described structure, the taper angle of the end portion of the island-shaped silicon layer is preferably 45° or more and less than 95°.

Further, in the above-described structure, an SIMOX (separation by implanted oxygen) substrate may be used or a bonded substrate may be used as the SOI substrate.

According to one aspect of a manufacturing method of a semiconductor device of the present invention, a silicon layer of an SOI substrate is formed into an island shape, a first insulating layer is formed on one surface and a side surface of the island-shaped silicon layer, the first insulating layer is selectively removed until the one surface of the island-shaped silicon layer is exposed to form a second insulating layer so as to be in contact with the side surface of the island-shaped silicon layer, a third insulating layer is formed in contact with the one surface of the island-shaped silicon layer and the second insulating layer, and a gate electrode layer is formed over the one surface of the island-shaped silicon layer with the third insulating layer interposed therebetween, so as to get across the island-shaped silicon layer.

Further, in the above-described manufacturing method, the island-shaped silicon layer is preferably formed such that the taper angle of the end portion is 45° or more and less than 95°.

According to another aspect of the manufacturing method of the semiconductor device of the present invention, a silicon layer of an SOI substrate is formed into an island shape to form a first silicon layer, a first insulating layer is formed on one surface and a side surface of the first silicon layer, the first insulating layer is selectively removed until the one surface of the island-shaped first silicon layer is exposed to form a second insulating layer so as to be in contact with the side surface of the first silicon layer and an amorphous region in a top layer of the first silicon layer, the amorphous region formed in the first silicon layer is removed to form an island-shaped second silicon layer, a third insulating layer is formed in contact with the second silicon layer and the second insulating layer, and a gate electrode layer is formed over one surface of the second silicon layer with the third insulating layer interposed therebetween, so as to get across the second silicon layer.

According to another aspect of the manufacturing method of the semiconductor device of the present invention, a silicon layer of an SOI substrate is formed into an island shape to form a first silicon layer, a first insulating layer is formed in contact with one surface and a side surface of the first silicon layer, the first silicon layer and the first insulating layer are made thin films by anisotropic etching mainly in a perpendicular direction to form an island-shaped second silicon layer and a second insulating layer so as to be in contact with a side surface of the second silicon layer, a third insulating layer is formed in contact with the second silicon layer and the second insulating layer, and a gate electrode layer is formed over one surface of the second silicon layer with the third insulating layer interposed therebetween, so as to get across the second silicon layer.

Further, in the above-described manufacturing method, the first silicon layer can be formed to a thickness in the range of 60 to 70 nm, and the second silicon layer can be formed to a thickness in the range of 20 to 30 nm.

Further, it is preferable to form such that the taper angle of an end portion of the second silicon layer is 45° or more and less than 95°.

Further, in the above-described manufacturing method, the second insulating layer and the third insulating layer are formed as a gate insulating layer. Further, as the second insulating layer, a layer of which dielectric constant is lower than that of the third insulating layer is preferably formed.

Further, in the above-described manufacturing method, thermal treatment may be performed after the gate electrode layer is formed.

Further, a substrate formed by a SIMOX method may be used or a substrate formed by wafer bonding may be used as the SOI substrate.

By employing the present invention, defects due to an end portion of a silicon layer including a channel formation region can be reduced. Therefore, an adverse effect on a semiconductor device due to characteristics of the end portion of the silicon layer can be reduced, whereby a semiconductor device in which the reliability is improved can be provided. Further, in manufacturing a semiconductor device, the yield can be improved.

BRIEF DESCRIPTION OF THE DRAWINGS

FIGS. 3A-1 and 3A-2, 3B-1 and 3B-2, and 3C-1 and 3C-2 are diagrams showing an example of a manufacturing method of a semiconductor device of the present invention.

FIGS. 4A, 4B-1 and 4B-2, and 4C-1 and 4C-2 are diagrams showing an example of a manufacturing method of a semiconductor device of the present invention.

FIGS. 5A-1 and 5A-2, 5B-1 and 5B-2, and 5C-1 and 5C-2 are diagrams showing an example of a manufacturing method of a semiconductor device of the present invention.

FIGS. 7A, 7B-1 and 7B-2, and 7C-1 and 7C-2 are diagrams showing an example of a manufacturing method of a semiconductor device of the present invention.

FIGS. 8A-1 and 8A-2, 8B-1 and 8B-2, and 8C-1 and 8C-2 are diagrams showing an example of a manufacturing method of a semiconductor device of the present invention.

FIGS. 10A, 10B-1 and 10B-2, and 10C-1 and 10C-2 are diagrams showing an example of a manufacturing method of a semiconductor device of the present invention.

FIGS. 11A-1 and 11A-2, 11B-1 and 11B-2, and 11C-1 and 11C-2 are diagrams showing an example of a manufacturing method of a semiconductor device of the present invention.

FIGS. 13A, 13B-1 and 13B-2, and 13C-1 and 13C-2 are diagrams showing an example of a manufacturing method of a semiconductor device of the present invention.

FIGS. 14A-1 and 14A-2, 14B-1 and 14B-2, and 14C-1 and 14C-2 are diagrams showing an example of a manufacturing method of a semiconductor device of the present invention.

FIGS. 15A-1 and 15A-2, and 15B-1 and 15B-2 are diagrams showing an example of a manufacturing method of a semiconductor device of the present invention.

DETAILED DESCRIPTION OF THE INVENTION

Figure 1A:
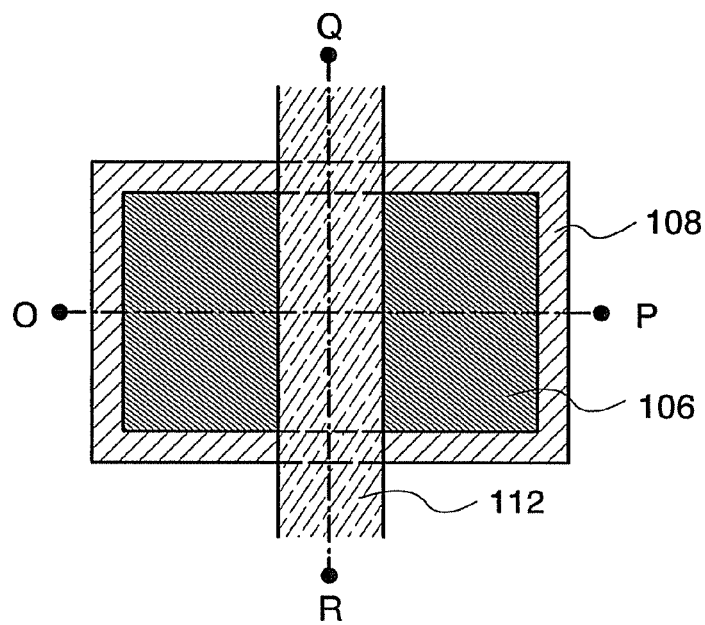
FIGS. 1A to 1C are diagrams showing an example of a main structure of a semiconductor device of the present invention.

Although the present invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that in structures of the present invention described below, reference numerals denoting the same ones may be used in common throughout the drawings.

Embodiment Mode 1

Figure 1B:
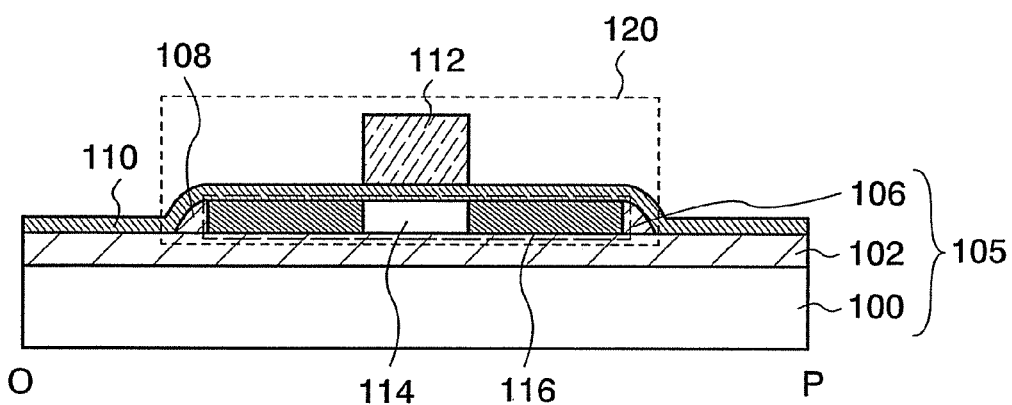
Figure 1C:
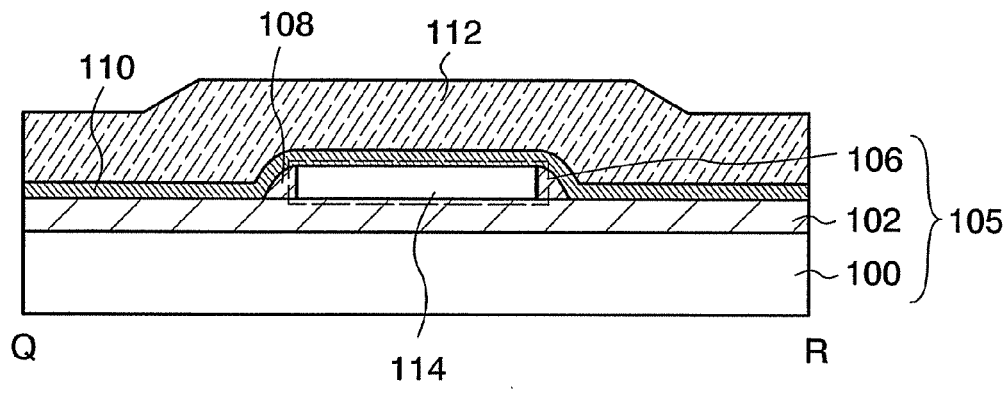

FIG. 1A is a top diagram and FIGS. 1B and 1C are cross-sectional diagrams for describing a main structure of a semiconductor device of the present invention. FIGS. 1A to 1C particularly show a structure of a thin film transistor; FIG. 1A is a top diagram, FIG. 1B is a cross-sectional diagram along a dashed line O-P in FIG. 1A, and FIG. 1C is a cross-sectional diagram along a dashed line Q-R in FIG. 1A. Note that a thin film and the like are partially omitted in FIG. 1A.

A thin film transistor 120 shown in FIG. 1A is formed using an SOI substrate 105. The thin film transistor 120 includes a silicon layer 106 in the SOI substrate 105, an insulating layer 108 which is provided so as to be in contact with a side surface of the silicon layer 106, an insulating layer 110 which is provided over one surface of the silicon layer 106, and a conductive layer 112 which is provided over the silicon layer 106 with the insulating layer 110 interposed therebetween.

As the SOI substrate 105, a substrate formed by an SIMOX method or wafer bonding is used. In this embodiment mode, a substrate in which an insulating layer 102 and the silicon layer 106 are stacked in order over a support substrate 100 is used.

The silicon layer 106 is formed into an island shape. Further, the silicon layer 106 which utilizes a surface silicon layer of the SOI substrate 105 is formed of single crystal silicon. The silicon layer 106 may be formed to a thickness of 10 to 150 nm, preferably a thickness of 30 to 100 nm or 10 to 30 nm.

Further, it is preferable to form such that an end portion of the silicon layer 106 has an almost perpendicular shape. Specifically, the taper angle is preferably 45° or more and less than 95°, and more preferably 60° or more and less than 95°. By forming such that the end portion of the silicon layer 106 has an almost perpendicular shape, in the region where the conductive layer 112 which functions as a gate electrode overlaps with the end portion of the silicon layer 106, a parasitic channel which is formed through the gate insulating layer which is in contact with the side surface of the silicon layer 106, by the end portion of the silicon layer 106 and the conductive layer 112 can be reduced. This is because due to the almost perpendicular shape of the end portion of the silicon layer 106, an area occupied by the end portion of the silicon layer in an area of the whole of the silicon layer can be reduced than the case where the end portion of the silicon layer 106 has a gentle taper angle (e.g., an taper angle of 45° or less). Note that a parasitic channel means a channel in a channel formation region, which is formed at an end portion of the channel formation region in a direction which is perpendicular to or diagonally crossed with a channel which is formed substantially parallel to a direction connecting a source region and a drain region. The parasitic channel leads to occurrence of a leakage current; therefore, preventing a parasitic channel by processing the end portion of the silicon layer into an almost perpendicular shape is very effective for reducing variation in characteristics of a semiconductor device and improving the reliability thereof.

Note that a taper angle means an inclination angle in a layer having a tapered shape, formed by a side surface of the layer having a tapered shape and a bottom surface of the layer having a tapered shape. The tapered shape may also be gentle such that the end portion of the silicon layer 106 has a taper angle of 30° or more and less than 85°, or 45° or more and less than 60°. With a corner portion made gentle by making the end portion of the silicon layer 106 a tapered shape, concentration of electric field at the corner portion can be relaxed.

Note that in this specification, an "end portion" of a silicon layer means an edging portion (an edge portion) of an island-shaped silicon layer. A "side surface" of a silicon layer means a surface of the edging portion of the silicon layer.

The silicon layer 106 includes a channel formation region 114 and impurity regions 116 which functions as source and drain regions. In the impurity regions 116, an impurity element which imparts one conductivity type is added. Further, in the channel formation region 114, an impurity element which imparts one conductivity type may be added in order to control the threshold voltage of a transistor. The channel formation region 114 is formed in the silicon layer 106 in the region which almost agrees with the conductive layer 112 with the insulating layer 110 interposed therebetween, and is disposed between the impurity regions 116.

Further, a low-concentration impurity region which functions as an LDD (Lightly Doped Drain) region may also be formed in the silicon layer 106. The low-concentration impurity region can be formed between the channel formation region and each impurity region which functions as a source or drain region. Further, in the low-concentration impurity region, the impurity concentration is lower than that in the impurity region which functions as a source or drain region.

The insulating layer 108 is formed so as to be in contact with the side surface of the silicon layer 106. Over the one surface of the silicon layer 106 and over the insulating layer 108, the insulating layer 110 is formed. The insulating layer 108 and the insulating layer 110 function as a gate insulating layer of the thin film transistor 120. That is, the gate insulating layer of the present invention is formed of not a single body but a compound body including a plurality of insulating layers. Note that each boundary in the plurality of insulating layers is not necessarily clear.

By forming the gate insulating layer of the insulating layer 108 which is in contact with the side surface of the silicon layer 106 and the insulating layer 110 which is in contact with the one surface of the silicon layer 106 and the insulating layer 108, coverage with the gate insulating layer at the end portion of the silicon layer 106 can be improved. Therefore, a defect due to insufficiency of coverage with the gate insulating layer at the end portion of the silicon layer 106 can be prevented.

Further, as for the gate insulating layer formed of the insulating layer 108 and the insulating layer 110, the thickness in the region which is in contact with the side surface of the silicon layer 106 is preferably larger than that over the one surface of the silicon layer 106. For example, provided that a perpendicular distance between the one surface of the silicon layer 106 and the top surface of the gate insulating layer is a thickness t1, and a perpendicular distance between the side surface of the silicon layer 106 and the top surface of the gate insulating layer is a thickness t2, it is preferable for the gate insulating layer to satisfy t1<t2. For example, t1<t2≦3t1 can be satisfied. Note that the thickness of the gate insulating layer in the region which is in contact with the side surface of the silicon layer 106, which is for example, the thickness t2 that is the perpendicular distance between the side surface of the silicon layer 106 and the top surface of the gate insulating layer, is not necessarily a constant value. In this case, the minimum value of the thickness t2 is preferably equal to or larger than the thickness t1. By covering the end portion of the silicon layer 106 with the gate insulating layer enough, and preferably, by increasing the thickness of the gate insulating layer in the region which is in contact with the side surface of the silicon layer 106, an electric field applied to the end portion of the silicon layer 106 can be relaxed, and occurrence of a leakage current can be prevented.

Further, as for the gate insulating layer formed of the insulating layer 108 and the insulating layer 110, the dielectric constant in the region which is in contact with the side surface of the silicon layer 106 is preferably lower than that in the region over the one surface of the silicon layer 106. For example, by decreasing the dielectric constant of the insulating layer 108 as compared to that of the insulating layer 110, the dielectric constant of the gate insulating layer in the region which is in contact with the side surface of the silicon layer 106 can be low. Preferably, a low-dielectric constant material in which the dielectric constant is 4 or less is used for forming the insulating layer 108. In the gate insulating layer, by decreasing the dielectric constant in the region which is in contact with the side surface of the silicon layer 106 as compared to that over the one surface of the silicon layer 106, concentration of electric field at the end portion, particularly at the corner portion of the silicon layer 106 can be prevented. Accordingly, local application of excessive electric field to the gate insulating layer can be prevented, and insufficient insulation of the gate insulating layer can be prevented. Thus, high-yield manufacturing of semiconductor devices can be realized, and the reliability of a semiconductor device can be improved.

Note here that the insulating layer 108 is formed to be in contact with the side surface of the silicon layer 106 so as to surround the island-shaped silicon layer 106. It can also be said that the insulating layer 108 has an opening so as to expose the upper surface of the silicon layer 106.

Figure 16A:
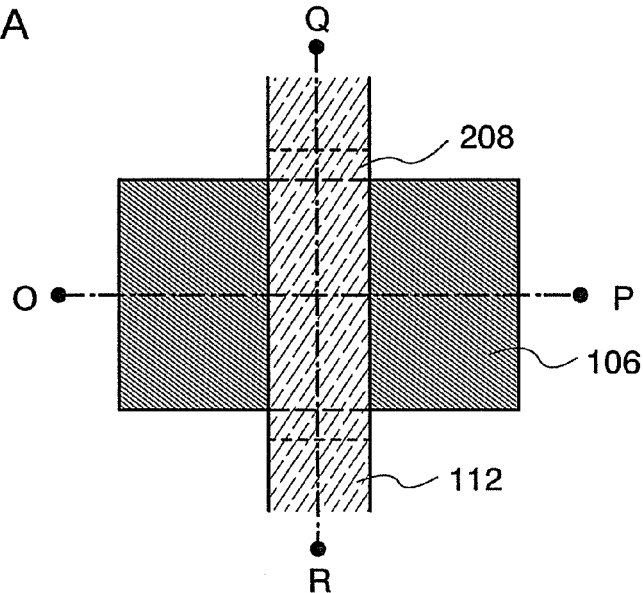
FIGS. 16A to 16C are diagrams showing an example of a structure of a semiconductor device of the present invention.
Figure 16B:
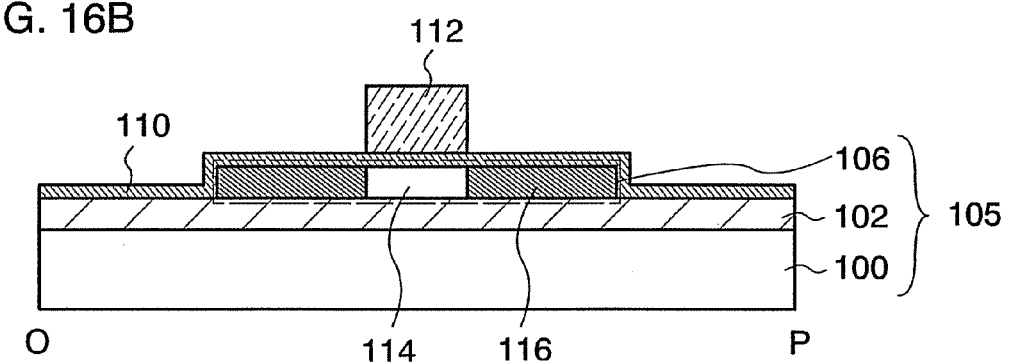
Figure 16C:
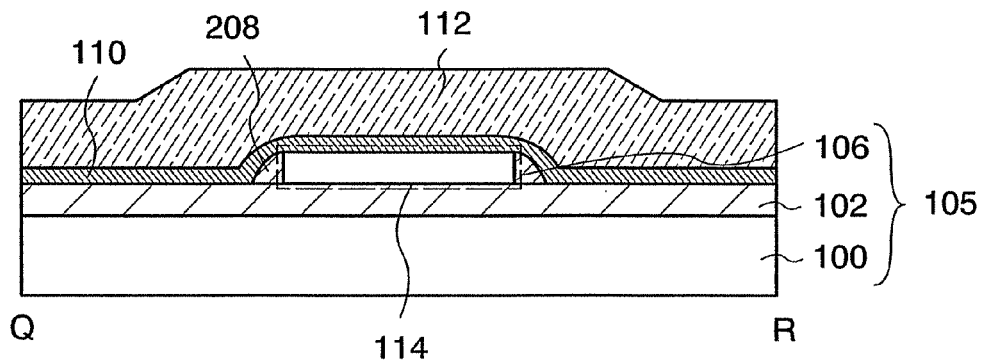

Note that as described above, when the silicon layer is formed into an island shape, various defects due to the end portion of the silicon layer tend to occur. In particular, at the end portion of the silicon layer overlapped with the gate electrode, and further, in a channel formation region end portion (the periphery of a boundary between the channel formation region and the impurity region which functions as a source or drain region) which is formed at the end portion of the silicon layer overlapped with the gate electrode, a defect tends to occur and damage by electro-static discharge or the like tends to be received. As factors thereof, the following can be given: the channel formation region end portion and the gate electrode tend to form a parasitic channel through the gate insulating layer which is in contact with the side surface of the channel formation region end portion (the end portion of the silicon layer) in the region where the channel formation region end portion and the gate electrode overlap each other; a higher voltage is applied to the end portion of the channel formation region (the periphery of the boundary between the channel formation region and the impurity region which functions as a source or drain region) as compared to the periphery of the center of the channel formation region; etching or the like in processing the gate electrode layer (the conductive layer) which is formed over the channel formation region end portion adversely affects the channel formation region end portion; the gate insulating layer is locally thin at the end portion of the silicon layer; and the like. Therefore, at least in the region where the gate electrode layer and the end portion of the silicon layer overlap each other, by forming the insulating layer so as to be in contact with the side surface of the silicon layer, a defect such as dielectric breakdown, electrostatic discharge, or a leakage current can be reduced. For example, as shown in FIGS. 16A to 16C, in the region where the end portion of the island-shaped silicon layer 106 and the conductive layer 112 which functions as a gate electrode overlap each other, an insulating layer 208 which is in contact with the side surface of the silicon layer 106 may be formed. FIG. 16A is a top diagram, FIG. 16B is a cross-sectional diagram along a dashed line O-P in FIG. 16A, and FIG. 16C is a cross-sectional diagram along a dashed line Q-R in FIG. 16A. Here, the insulating layer 208 is formed only in the region where the conductive layer 112 and the end portion of the silicon layer 106 overlap each other and the periphery thereof. Therefore, the insulating layer 208 is not formed in the side surface of the silicon layer 106 in FIG. 16B, whereas the insulating layer 208 is formed so as to be in contact with the side surface of the silicon layer 106 in FIG. 16C.

Figure 17:
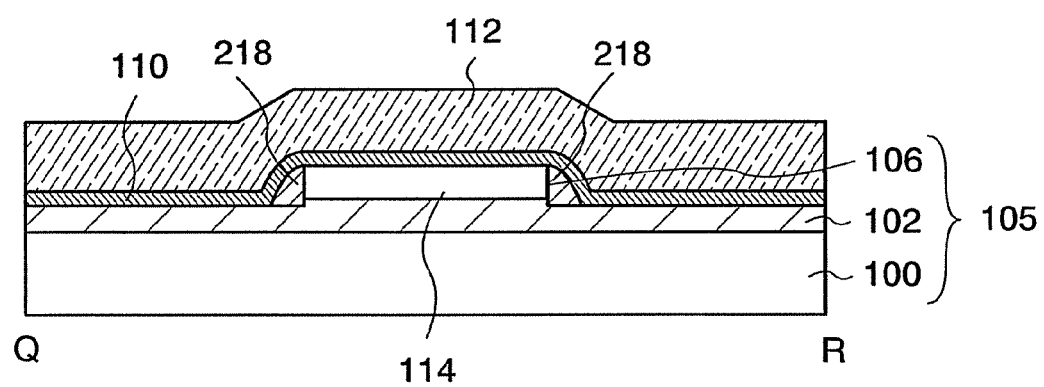
FIG. 17 is a diagram showing an example of a structure of a semiconductor device of the present invention.

As shown in FIGS. 16A to 16C, by forming the insulating layer which is in contact with the side surface of the silicon layer at least in the region where the conductive layer which functions as a gate electrode and the end portion of the silicon layer overlap each other, short-circuiting between the end portion of the silicon layer and the conductive layer which functions as a gate electrode can be prevented. For example, as shown in FIG. 17, even when the insulating layer 102 under the silicon layer 106 is removed in the periphery of the end portion of the silicon layer 106, the end portion of the silicon layer 106 can be covered enough by forming an insulating layer 218 which is in contact with the side surface of the silicon layer 106. In particular, improvement of coverage with the gate insulating layer by applying the present invention is effective for the case where the thickness of the gate insulating layer is in the range of several nm to several tens of nm and smaller than that of the silicon layer. Further, concentration of electric field at the end portion of the silicon layer can be relaxed by applying the present invention, and a leakage current can be prevented or reduced. In particular, in the gate insulating layer, decreasing the dielectric constant in the region which is in contact with the side surface of the silicon layer as compared to that over the one surface of the silicon layer is effective in that local application of electric field can be relaxed. As described above, by forming the insulating layer so as to be in contact with the side surface of the silicon layer, particularly, with the side surface of the silicon layer in the region where the conductive layer which functions as a gate electrode and the end portion of the silicon layer overlap each other, the reliability and operating characteristics of a semiconductor device can be improved.

Each of the insulating layers 108 and 110 can be formed to have a single layer structure or a stacked-layer structure, of a material such as silicon oxide, silicon nitride, silicon oxynitride, silicon nitride oxide, aluminum nitride, SiOF (silicon oxide containing fluorine), SiOC (silicon oxide containing carbon), DLC (Diamond-Like Carbon), porous silica, or the like. Further, either the same material or different materials may be used for forming the insulating layers 108 and 110. In this embodiment mode, the insulating layer 108 is formed of a silicon oxide layer and the insulating layer 110 is formed of a silicon nitride layer.

Note that the insulating layer 108 is preferably formed of a material of which dielectric constant is lower than that of the insulating layer 110. Further, the insulating layer 108 is preferably formed of a low-dielectric constant material in which the dielectric constant is about 4 or less, such as SiOF, SiOC, DLC, porous silica, or the like. Such a low-dielectric constant material in which the dielectric constant is 4 or less is also called a low-k material, and a film manufactured using a low-k material is called a low-k film. By thus forming the insulating layer 108 of the material of which the dielectric constant is lower than that of the insulating layer 110, the dielectric constant of the gate insulating layer in the region which is in contact with the side surface of the silicon layer can be made lower than that over the one surface of the silicon layer.

The conductive layer 112 which functions as a gate electrode is formed over the silicon layer 106 with the insulating layer 110 interposed therebetween. The conductive layer 112 can be formed of a metal element such as tantalum (Ta), tungsten (W), titanium (Ti), molybdenum (Mo), chromium (Cr), aluminum (Al), copper (Cu), or niobium (Nb), or an alloy material or a compound material containing the metal element. As the compound material, a nitrogen compound, an oxygen compound, a carbon compound, a halogen compound, or the like can be used; specifically, tungsten nitride, titanium nitride, aluminum nitride, and the like can be given. The conductive layer 112 is formed to have a single layer structure or a stacked-layer structure, of one or a plurality of the above-mentioned materials. Further, the conductive layer 112 may also be formed of polycrystalline silicon to which an impurity element which imparts one conductivity type, such as phosphorus is added.

Next, a manufacturing method of the thin film transistor 120 shown in FIGS. 1A to 1C is described in detail with reference to FIGS. 2A-1 and 2A-2, 2B-1 and 2B-2, and 2C-1 and 2C-2.

First, the SOI substrate 105 is prepared. The SOI substrate 105 used here is formed by stacking the insulating layer 102 and a silicon layer 104 in order over the support substrate 100 (see FIGS. 2A-1 and 2A-2).

In the present invention, a known SOI substrate can be used, and a manufacturing method and a structure thereof are not particularly limited. As the SOI substrate, a SIMOX substrate and a bonded substrate can be typically given. Further, as examples of the bonded substrate, ELTRAN®, UNIBOND®, and the like can be given.

Figure 26A:
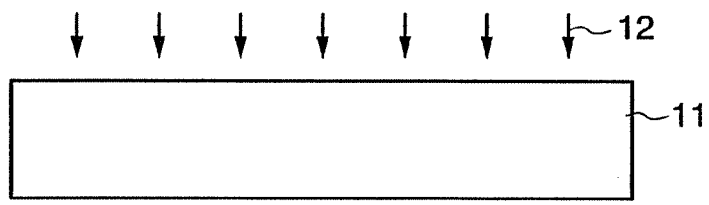
FIGS. 26A to 26E are diagrams showing an example of a manufacturing method of an SOI substrate.
Figure 26B:
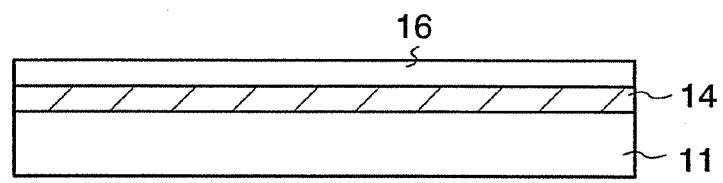

For example, in the case of a SIMOX substrate, an oxygen ion 12 is implanted into a single-crystalline silicon substrate 11 and thermal treatment at least 1300° C. is performed to form a buried oxide film (BOX) layer 14, whereby a thin-film silicon layer 16 is formed on the surface, so that an SOI structure can be obtained. The thin-film silicon layer 16 is insulated from the single-crystalline silicon substrate 11 with the buried oxide film layer 14 (see FIGS. 26A and 26B).

Further, a technique called ITOX (Internal Thermal Oxidation) in which further thermal oxidation is performed after a buried oxide film layer is formed can also be used.

Figure 26C:
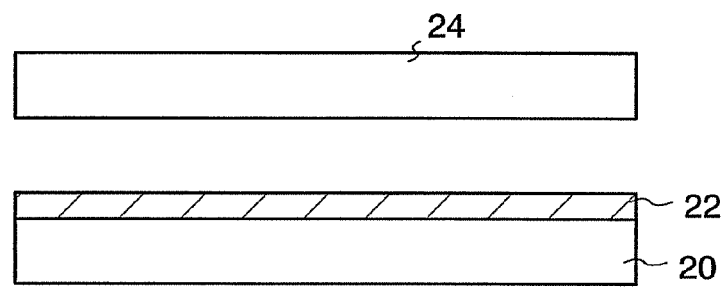
Figure 26D:
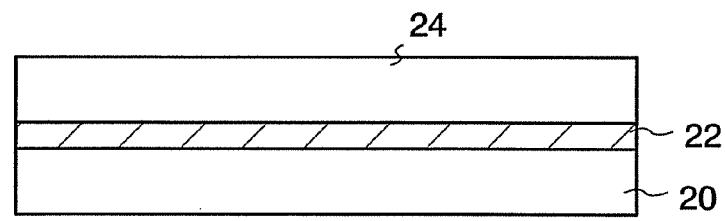
Figure 26E:
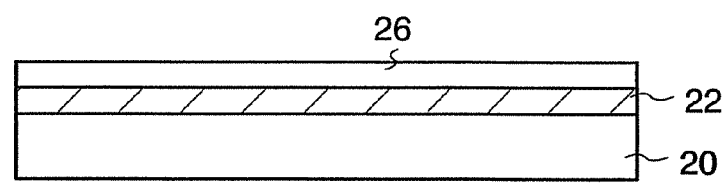

On the other hand, in the case of a bonded substrate, two single-crystalline silicon substrates (a first single-crystalline silicon substrate 20 and a second single-crystalline silicon substrate 24) are bonded with an oxide film layer 22 interposed therebetween and one of the single-crystalline silicon substrates is thinned from a surface on the side which is opposite to the attached side, whereby a thin-film silicon layer 26 is formed on the surface, so that an SOI structure can be obtained. The oxide film layer 22 can be formed by thermal oxidation of one of the substrates (here, the first single-crystalline silicon substrate 20). Further, the two single-crystalline silicon substrates can be bonded directly without using an adhesive. For example, after the oxide film layer 22 is formed by thermal treatment of the first single-crystalline silicon substrate 20, it is overlapped with the second single-crystalline silicon substrate 24 and thermal treatment at least 800° C., preferably at about 1100° C. is performed thereto, so that the two substrates can adhere to each other by chemical bonding in a bonding interface therebetween. After that, the second single-crystalline silicon substrate 24 is polished from a surface on the side which is opposite to the bonded side, whereby the thin-film silicon layer 26 with a desired thickness can be formed (see FIGS. 26C to 26E). Note that a technique called a Smart-Cut® method in which, without polishing the second single-crystalline silicon substrate 24 after bonding, a hydrogen ion is implanted into a region at a predetermined depth in the second single-crystalline silicon substrate 24 to form a minute void and growth of the minute void by thermal treatment is utilized to cleave the substrate can also be used. Further, after polishing the second single-crystalline silicon substrate, a technique called PACE (Plasma Assisted Chemical Etching) in which the substrate is etched by small plasma etching equipment while being locally controlled to be a thin film can also be used.

In the SOI substrate 105 described in this embodiment mode, the support substrate 100 corresponds to the single-crystalline silicon substrate shown in FIGS. 26A to 26E, the insulating layer 102 corresponds to the buried oxide film layer or the oxide film layer, and the silicon layer 104 corresponds to the thin film silicon layer formed on the surface.

The silicon layer 104 is a surface silicon layer of the SOI substrate 105 and is a single-crystalline silicon layer. The thickness of the surface silicon layer of the SOI substrate 105 can be selected as appropriate by controlling a condition such as the amount of polishing, the depth for ion implantation, or the like in manufacturing the SOI substrate 105. For example, the surface silicon layer with a thickness in the range of 40 to 200 nm can be formed. In this embodiment mode, the silicon layer is formed with a thickness in the range of 10 to 150 nm, preferably in the range of 30 to 100 nm or 10 to 30 nm.

Figures 1, 2A:
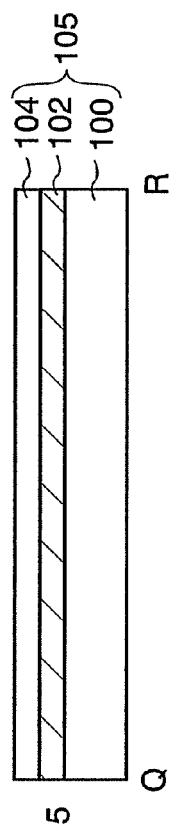
FIGS. 2A-1 and 2A-2, 2B-1 and 2B-2, and 2C-1 and 2C-2 are diagrams showing an example of a manufacturing method of a semiconductor device of the present invention.
Figures 1, 2B:
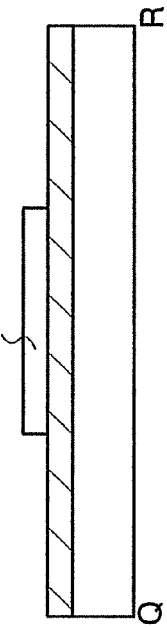
Figures 1, 2C:
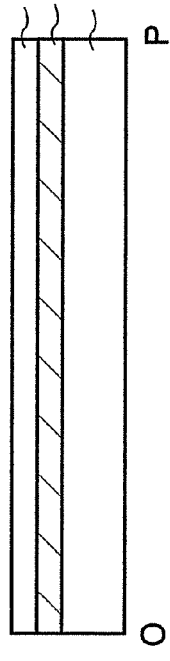
Figures 2, 2A:
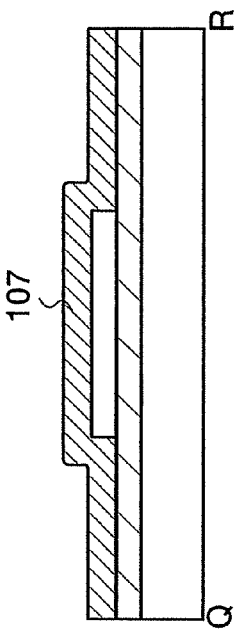
Figures 2, 2B:
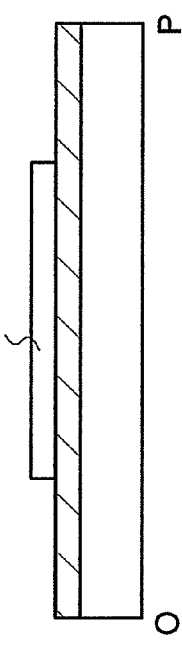
Figures 2, 2C:
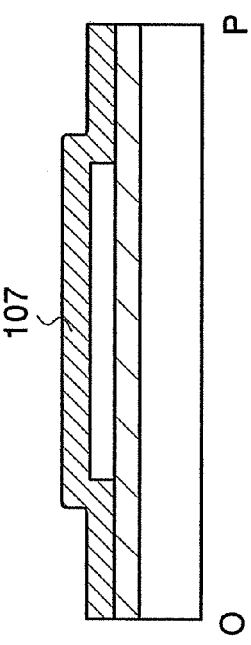
Figures 1, 5A:
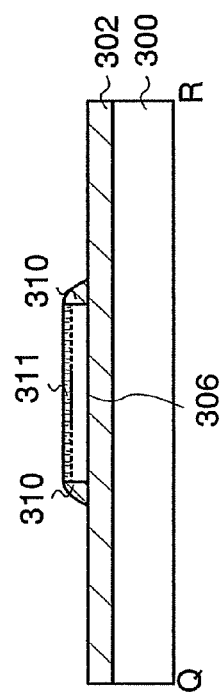
Figures 1, 5B:
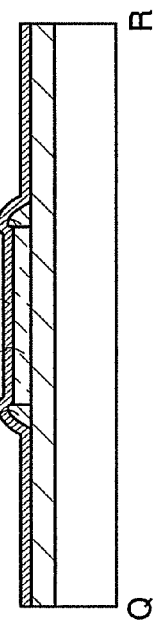
Figures 1, 5C:
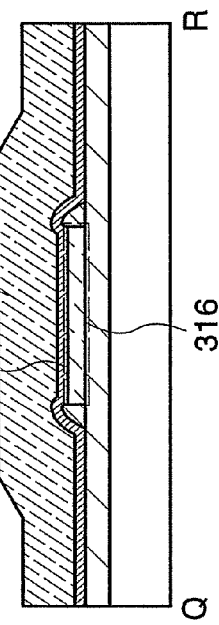
Figures 2, 5A:
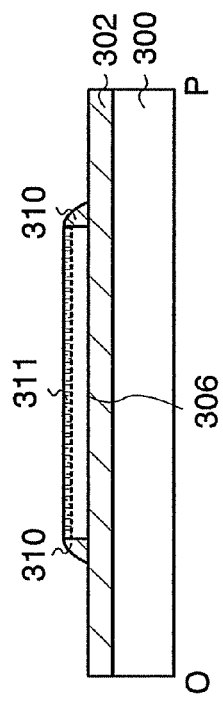
Figures 2, 5B:
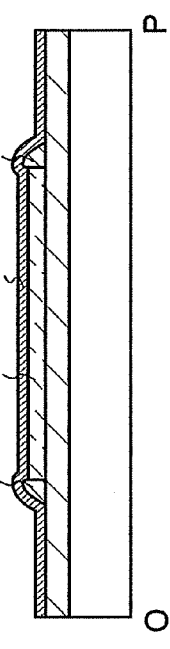
Figures 2, 5C:
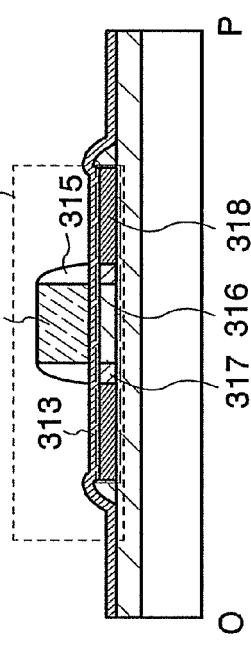

Next, the silicon layer 104 is selectively etched to form the island-shaped silicon layer 106 (see FIGS. 2B-1 and 2B-2). At this time, the silicon layer 106 may be formed such that the end portion has a perpendicular shape or a tapered shape. The shape of the end portion of the silicon layer 106 can be selected as appropriate by changing the etching condition or the like. It is preferable to form such that the taper angle of the end portion of the silicon layer 106 is 45° or more and less than 95°, and more preferably 60° or more and less than 95°. By making the end portion of the silicon layer 106 a shape almost perpendicular, a parasitic channel can be reduced.

Next, an insulating layer 107 (hereinafter also called a first insulating layer 107) is formed to cover the silicon layer 106 (see FIGS. 2C-1 and 2C-2). The first insulating layer 107 is formed of a material such as silicon oxide, silicon nitride, silicon oxynitride, silicon nitride oxide, SiOF, SiOC, DLC, porous silica, or the like by a CVD method or a sputtering method.

The first insulating layer 107 is formed to a thickness enough to cover the end portion of the silicon layer 106. The thickness of the first insulating layer 107 is preferably in the range of 1.5 to 3 times as large as that of the silicon layer 106 formed under the first insulating layer 107.

Next, the first insulating layer 107 is selectively etched by anisotropic etching mainly in a perpendicular direction to form the insulating layer 108 (hereinafter also called the second insulating layer 108) which is in contact with the side surface of the silicon layer 106 (see FIGS. 3A-1 and 3A-2).

According to the anisotropic etching mainly in a perpendicular direction of the first insulating layer 107, the etching progresses gradually from the first insulating layer 107 formed in the region over the one surface of the silicon layer 106 and over the insulating layer 102. Note that the first insulating layer 107 with an almost uniform thickness is formed over the one surface of the silicon layer 106 and over the insulating layer 102. Therefore, by stopping the etching when the one surface of the silicon layer 106 is exposed, the first insulating layer 107 can be left only in the region which is in contact with the side surface of the silicon layer 106 and the periphery thereof. The left first insulating layer 107 corresponds to the second insulating layer 108. Note that by making the end portion of the silicon layer 106 an almost perpendicular shape, the first insulating layer 107 can be easily left only in the region which is in contact with the side surface of the silicon layer 106 and in the periphery thereof. That is, the second insulating layer 108 can be easily formed.

The etching method of the first insulating layer 107 is not particularly limited as long as anisotropic etching mainly in a perpendicular direction can be performed. For example, reactive ion etching (RIE) can be used. The reactive ion etching is classified depending on a plasma generation method into a parallel-plate type, a magnetron type, a dual-frequency type, an ECR type, a helicon type, an ICP type, or the like. As an etching gas used at this time, a gas which can provide high etching selection ratio of the first insulating layer 107 with respect to another layer (the silicon layer 106) is preferably selected. In the case of selectively etching an insulating layer, a fluorine-based gas such as $CHF_3$, $CF_4$, $C_4F_8$, $C_2F_6$, $NF_3$, or the like can be used, for example. Further, an inert gas such as He, Ar, or Xe, an $O_2$ gas, or an $H_2$ gas may be added as needed.

The shape of the second insulating layer 108 can be changed by selecting the material for forming the thin film, the etching condition, or the like as appropriate. In this embodiment mode, the second insulating layer 108 is formed such that the perpendicular height from the bottom surface (the surface which is in contact with the insulating layer 102) is almost the same as that of the silicon layer 106. Further, the second insulating layer 108 is formed such that the surface thereof on the side which is not in contact with the side surface of the silicon layer 106 is curved. Specifically, it is formed such that an appropriate curvature is provided and the surface is curved convexly with respect to the side surface of the silicon layer 106 being in contact with. It is needless to say that the present invention is not limited particularly thereto, and the second insulating layer 108 may have a shape having a corner instead of a rounded shape. Preferably, the corner portion of the second insulating layer 108 is made a gentle shape so that the coverage with a layer formed thereover (here, the insulating layer 110) can be improved. Note that the etching condition means an amount of electric power which is applied to an electrode provided with an substrate, the temperature of the same, the pressure in a chamber, and the like in addition to the kind of etching gas and a gas flow rate.

Next, the insulating layer 110 (hereinafter also called the third insulating layer 110) is formed over the silicon layer 106 and the second insulating layer 108 (see FIGS. 3B-1 and 3B-2). The third insulating layer 110 is formed by a CVD method or a sputtering method, using silicon oxide, silicon nitride, silicon oxynitride, silicon nitride oxide, aluminum nitride, or the like. Further, the third insulating layer 110 is formed to have a single layer structure or a stacked-layer structure of at least one of the above materials. The third insulating layer 110 is formed to have a thickness of 1 to 50 nm, preferably 1 to 20 nm, and more preferably 1 to 10 nm. In this embodiment mode, a silicon oxynitride layer is formed with a thickness of 20 nm as the third insulating layer 110.

Further, the third insulating layer 110 can also be formed by solid phase oxidation or solid phase nitridation with a plasma treatment. For example, the silicon layer 106 and the second insulating layer 108 are oxidized or nitrided by a plasma treatment to form the third insulating layer 110.

In the solid phase oxidation treatment or solid phase nitridation treatment by a plasma treatment, plasma which is excited by high-frequency waves such as microwaves (typically, 2.45 GHz) and has an electron density of $1 \times 10^{11}$ cm$^{-3}$ and more and $1 \times 10^{13}$ cm$^{-3}$ or less and electron temperatures of 0.5 eV or more and 1.5 eV or less is preferably used. This is because in the solid phase oxidation treatment or solid phase nitridation treatment at temperatures of 500° C. or less, a dense insulating layer is formed and a practical reaction speed is obtained.

When the surfaces of the silicon layer 106 and the second insulating layer 108 are oxidized by a plasma treatment, the plasma treatment is performed in an oxygen atmosphere (e.g., an atmosphere containing oxygen ($O_2$), ozone ($O_3$), dinitrogen monoxide ($N_2O$), nitric monoxide (NO), or nitrogen dioxide ($NO_2$), and a rare gas (at least one of helium (He), neon (Ne), argon (Ar), krypton (Kr), and xenon (Xe)), or an atmosphere containing ($O_2$), ozone ($O_3$), dinitrogen monoxide ($N_2O$), nitric monoxide (NO), or nitrogen dioxide ($NO_2$), hydrogen ($H_2$), and a rare gas). Further, when the surfaces of the silicon layer 106 and the insulating layer 108 are nitrided by a plasma treatment, the plasma treatment is performed in a nitrogen atmosphere (e.g., an atmosphere containing nitrogen ($N_2$) and a rare gas (at least one of He, Ne, Ar, Kr, and Xe)), an atmosphere containing nitrogen, hydrogen, and a rare gas, or an atmosphere containing $NH_3$ and a rare gas). As the rare gas, Ar is preferably used, for example. Further, a gas in which Ar and Kr are mixed may also be used.

Figure 18:
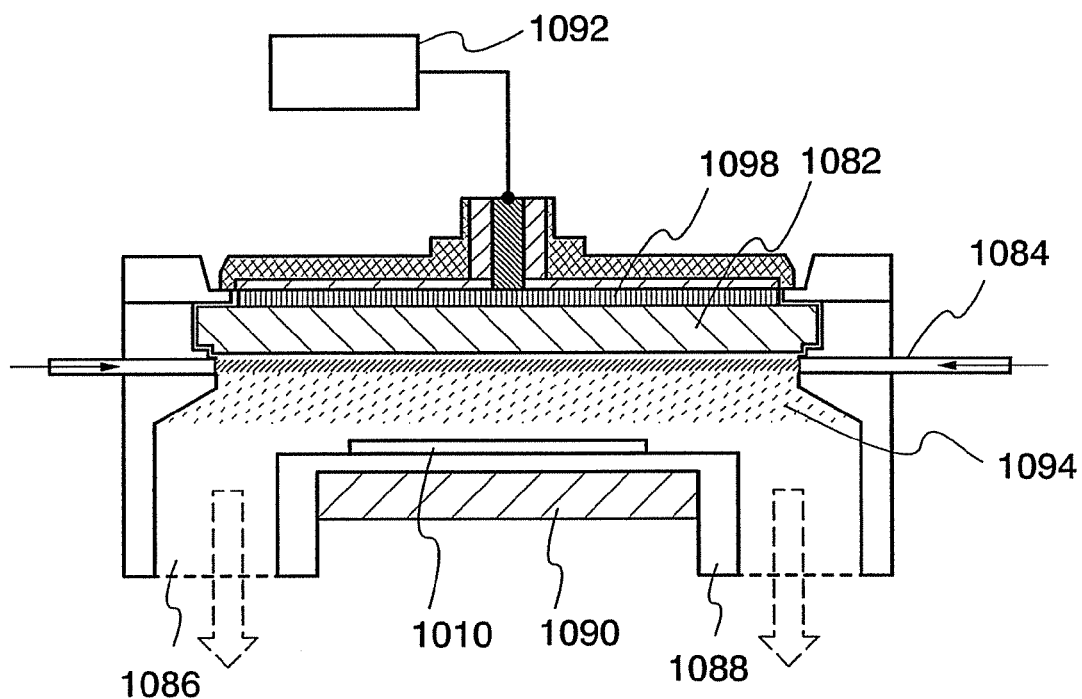
FIG. 18 is a diagram showing an example of a structure of plasma processing equipment.

FIG. 18 shows a structural example of plasma processing equipment 1080 for performing a plasma process. The plasma processing equipment 1080 includes a support 1088, a gas supplying portion 1084 for supplying a gas, an exhaust port 1086 connected to a vacuum pump for exhausting a gas, an antenna 1098, a dielectric plate 1082, and a high-frequency wave supplying portion 1092 for supplying high-frequency waves for plasma generation. An object to be processed 1010 is held by the support 1088. In addition, by providing a temperature controlling portion 1090 for the support 1088, the temperature of the temperature of the object to be processed 1010 can also be controlled. The object to be processed 1010 is a body to which a plasma treatment is performed, and corresponds to a stack in which the insulating layer 102 and the island-shaped silicon layer 106 are stacked in order over the support substrate 100.

Hereinafter, a specific example in which an insulating layer is formed on the surface of the silicon layer with the plasma processing equipment 1080 shown in FIG. 18 is described. It is to be noted that the plasma treatment includes an oxidation treatment, a nitridation treatment, an oxynitridation treatment, a hydrogenation treatment, and a surface modification treatment performed to a substrate, a silicon layer, an insulating layer, and a conductive layer. For these treatments, a gas supplied from the gas supplying portion 1084 may be selected in accordance with an intended purpose.

First, a processing chamber of the plasma processing equipment 1080 shown in FIG. 18 is made in vacuum and a gas containing a rare gas and oxygen or nitrogen is supplied from the gas supplying portion 1084. The object to be processed 1010 is heated at room temperature or at temperatures of 100° C. or more to 550° C. or less by the temperature controlling portion 1090. The distance between the object to be processed 1010 and the dielectric plate 1082 (hereinafter also called an electrode interval) is approximately 20 mm or more and 200 mm or less (preferably 20 mm or more and 60 mm or less).

Next, high-frequency waves are supplied from the high-frequency wave supplying portion 1092 to the antenna 1098. Here, microwaves (frequency: 2.45 GHz) are inputted as the high-frequency waves. Then, the microwaves are introduced from the antenna 1098 into the processing chamber through the dielectric plate 1082; thus, plasma 1094 is generated. With the plasma 1094, oxygen radicals (which may include an OH radical) or nitrogen radicals (which may include an NH radical) are generated. At this time, the plasma 1094 is generated by the gas supplied.

When the plasma 1094 is generated by introducing microwaves, plasma which has the low electron temperature (3 eV or lower, preferably 1.5 eV or lower) and the high electron density ($1 \times 10^{11}$ cm$^{-3}$ or more) can be generated. Specifically, plasma which has electron temperatures of 0.5 eV or more and 1.5 eV or less and an electron density of $1 \times 10^{11}$ cm$^{-3}$ or more and $1 \times 10^{13}$ cm$^{-3}$ or less is preferably generated. Note that in this specification, plasma which has the low electron temperature and the high electron density generated by introducing microwaves is also called high-density plasma. Further, a plasma treatment utilizing high-density plasma is also called a high-density plasma treatment.

With the oxygen radicals (containing an OH radical in some cases) and/or nitrogen radicals (containing an NH radical in some cases) generated by the plasma 1094, the surface of the silicon layer formed in the object to be processed 1010 is oxidized or nitrided, whereby an insulating layer is formed. In this case, if the rare gas such as argon is mixed in the gas supplied, oxygen radicals or nitrogen radicals can be generated efficiently by excited species of the rare gas. Note that in the case where the rare gas is used in the gas supplied, the rare gas may be contained in the insulating layer formed. By effective use of active radicals excited by plasma, oxidation or nitridation by a solid phase reaction can be performed at low temperatures of 500° C. or less.

As one preferable example of the third insulating layer 110 formed by the high-density plasma treatment using the equipment shown in FIG. 18, a silicon oxide layer is formed on one surface of the silicon layer 106 to have a thickness of 3 nm to 6 nm by a plasma treatment in an atmosphere containing oxygen, and the surface of the silicon oxide layer is treated with a nitridation plasma in an atmosphere containing nitrogen to form a nitrogen-plasma-treated layer. Specifically, first, the silicon oxide layer is formed on one surface of the silicon layer 106 by a plasma treatment in an atmosphere containing oxygen to have a thickness of 3 nm to 6 nm. Then continuously, the plasma treatment in an atmosphere containing nitrogen is performed, whereby the nitrogen-plasma-treated layer with high nitrogen concentration is provided on the one surface of the silicon oxide layer or in the periphery of the surface. Note that the "periphery of the surface" refers to a region in a depth of approximately 0.5 nm to 1.5 nm from the surface of the silicon oxide layer. For example, by performing the plasma treatment in an atmosphere containing nitrogen, a structure in which nitrogen is contained at a rate of 20 atomic % to 50 atomic % in a region of the silicon oxide layer in a depth of approximately 1 nm in a perpendicular direction from the surface thereof is obtained. Further, the high-density plasma treatment can also oxidize or nitride the surfaces of the insulating layer 108 and the insulating layer 102.

For example, by oxidizing the surface of the silicon layer 106 which is single crystalline silicon with a plasma treatment, an oxide layer which is not distorted in an interface and is dense can be formed. Further, by nitriding the oxide layer with a plasma treatment, by which oxygen is substituted for nitrogen in the top most surface layer portion to form a nitride layer, further densification can be performed. In this manner, an insulating layer in which a withstand voltage is high can be formed.

In either case, by the solid phase oxidation or solid phase nitridation with a plasma treatment as described above, an insulating layer which is equivalent to a thermally-oxidized film which is formed at temperatures of 950° C. to 1050° C. can be obtained. That is, a highly reliable insulating layer can be formed as an insulating layer which functions as a gate insulating film in a semiconductor element, in particular, a thin film transistor or a nonvolatile memory element.

Next, the conductive layer 112 which functions as a gate electrode is formed over the silicon layer 106 with the third insulating layer 110 interposed therebetween (see FIGS. 3C-1 and 3C-2). The conductive layer 112 is preferably formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer 112 can be processed into a desired shape by selective etching after being formed over the entire surface by a CVD method or a sputtering method. Further, the conductive layer 112 has either a single layer structure or a stacked-layer structure. The conductive layer 112 is formed to have a thickness of 100 to 1000 nm, preferably 200 to 800 nm, and more preferably 300 to 500 nm.

Next, an impurity element which imparts one conductivity type is selectively added into the silicon layer 106, whereby the channel formation region 114 and the impurity regions 116 which function as source and drain regions are formed. Here, the impurity element which imparts one conductivity type is added with the conductive layer 112 as a mask. As the impurity element which imparts one conductivity type, an element which imparts a p-type conductivity such as boron (B), aluminum (Al), or gallium (Ga) or an element which imparts an n-type conductivity such as phosphorus (P) or arsenic (As) can be used.

Note that after the impurity element which imparts one conductivity type is added into the silicon layer 106, a thermal treatment is preferably performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 550° C. Further, the thermal treatment is preferably performed in a nitrogen atmosphere. For example, activation can be performed by heating at 550° C. for 4 hours. Further, when the first insulating layer 107 is selectively etched to form the second insulating layer 108, the silicon layer 106 becomes amorphous partially in some cases depending on the etching condition or the material, the thickness, or the like of each thin film. In this case, by performing thermal treatment, recrystallization of the silicon layer can be performed together with the activation.

Through the above, the thin film transistor 120 to which the present invention is applied can be formed. Note that the structure of the TFT described in this embodiment mode is just an example, and the present invention is not limited to the structure shown. For example, a multi-gate structure, which includes a silicon layer including two or more channel formation regions connected in series and two or more gate electrode layers by which an electric field is applied to the channel formation regions, may be employed. Further, an LDD region may be formed in the silicon layer of the TFT.

Although the example in which a conductive layer is formed of a single layer as a gate electrode is described in this embodiment mode, the present invention is not particularly limited. The side surface of the gate electrode may be tapered, and the gate electrode may employ a stacked-layer structure including two or more conductive layers. Further, when the gate electrode has a stacked-layer structure including two or more conductive layers, the taper angle may be different in the layers. Further, an insulating layer which is also called a sidewall may also be formed so as to be in contact with the side surface of the conductive layer which functions as a gate electrode.

In a thin film transistor manufactured by applying the present invention, defects due to an end portion of an island-shaped silicon layer can be reduced. Therefore, a highly reliable semiconductor device can be manufactured. Further, high-yield manufacturing of semiconductor devices can also be realized.

This embodiment mode can be combined with any other embodiment mode in this specification as appropriate.

Embodiment Mode 2

In this embodiment mode, an example of manufacturing a semiconductor device by a manufacturing method which is different from that in Embodiment Mode 1 is described with reference to FIGS. 4A, 4B-1 and 4B-2, 4C-1 and 4C-2, 5A-1 and 5A-2, 5B-1 and 5B-2, 5C-1 and 5C-2, and 6A to 6F.

FIG. 4A is a top diagram for describing a main structure of a semiconductor device of the present invention. Note that a thin film and the like are partially omitted in FIG. 4A.

In a semiconductor device shown in FIG. 4A, a thin film transistor is formed using an SOI substrate. A surface silicon layer of the SOI substrate is formed into an island shape, and a conductive layer 314 which forms a gate electrode is provided so as to get across the island-shaped silicon layer 313. Further, an insulating layer 310 is provided so as to be in contact with the side surface of the island-shaped silicon layer 313. Although the example in which the insulating layer 310 is provided around the island-shaped silicon layer 313 is shown here, the present invention is not limited thereto as long as the insulating layer which is in contact with the side surface of the island-shaped silicon layer 313 is provided at least in a region where the conductive layer 314 and the island-shaped silicon layer 313 overlap each other. It is needless to say that the insulating layer which is in contact with the side surface of the island-shaped silicon layer 313 may also be provided in the region where the conductive layer 314 and the island-shaped silicon layer 313 overlap each other and the periphery thereof.

In the silicon layer 313, a channel formation region, a pair of low-concentration impurity regions 317 which function as LDD regions, and a pair of high-concentration impurity regions 318 which function as source and drain regions are formed. The channel formation region is formed in the silicon layer 313 in the region which almost agrees with the conductive layer 314, and is positioned between the pair of high-concentration impurity regions 318. Further, each low-concentration impurity region 317 is formed between the channel formation region and each high-concentration impurity region 318.

Next, a manufacturing method of the semiconductor device shown in FIG. 4A is described. Specific description is made here with reference to cross-sectional diagrams along a dashed line O-P in FIG. 4A, and cross-sectional diagrams along a dashed line Q-R in FIG. 4A.

First, an SOI substrate 305 is prepared in which an insulating layer 302 and a first silicon layer 306 are stacked in order over a support substrate 300 (see FIGS. 4B-1 and 4B-2). Next, a first insulating layer 308 is formed to cover the first silicon layer 306 (see FIGS. 4C-1 and 4C-2). Up to and including the formation of the first insulating layer 308, the description made on the SOI substrate 105 and the insulating layer 107 in Embodiment Mode 1 can be referred to, and therefore, the description thereof is roughly made below.

As the SOI substrate 305, a known SOI substrate such as a SIMOX substrate or a bonded substrate can be used. A surface silicon layer of the SOI substrate 305 is selectively etched to form the island-shaped first silicon layer 306. The thickness of the first silicon layer 306 may be 10 to 150 nm, and preferably 30 to 100 nm or 10 to 30 nm. Further, the first silicon layer 306 may be formed such that the end portion has a perpendicular shape or a tapered shape. In this embodiment mode, the first silicon layer 306 is formed such that the taper angle is preferably 45° or more and less than 95°, and more preferably 60° or more and less than 95° which is almost perpendicular. By making the tapered shape of the end portion of the first silicon layer 306 steep, a parasitic channel of a semiconductor device can be reduced. Note that the present invention is not particularly limited, and the end portion of the first silicon layer 306 may be tapered at a taper angle of 30° or more and less than 85° or may be gently tapered at a taper angle of 45° or more and less than 60°.

The first insulating layer 308 is formed of a material such as silicon oxide, silicon nitride, silicon oxynitride, silicon nitride oxide, aluminum nitride, SiOF, SiOC, DLC, porous silica, or the like by a CVD method or a sputtering method. Further, the first insulating layer 368 is formed to have a thickness enough to cover at least the end portion of the first silicon layer 306. The first insulating layer 308 is preferably formed to have a thickness of 1.5 to 3 times as large as that of the first silicon layer 306.

Further, the first insulating layer 308 is preferably formed of a material having the dielectric constant which is lower than that of an insulating layer 312 formed later over one surface of the silicon layer. The first insulating layer 308 forms a gate insulating layer in the region which is in contact with the side surface of the silicon layer in a semiconductor device. With an island-shaped silicon layer, concentration of electric field tends to occur at the end portion, in particular, the corner portion of the silicon layer. If the concentration of electric field occurs at the end portion of the silicon layer, dielectric breakdown of the gate insulating layer or insufficient insulation such as occurrence of a leakage current tends to occur. Therefore, by forming the first insulating layer 308 which is in contact with the side surface of the silicon layer with the use of a low-dielectric constant material as compared to the insulating layer formed over the one surface of the silicon layer, the gate insulating layer can be prevented from receiving a locally excessive stress such as an electric field, which is preferable.

Next, the first insulating layer 308 is selectively etched by anisotropic etching mainly in a perpendicular direction to form the second insulating layer 310 which is in contact with the side surface of the first silicon layer 306. At this time, a top-layer portion of the first silicon layer 306 is made amorphous to form an amorphous region 311 (see FIGS. 5A-1 and 5A-2).

For example, a silicon nitride oxide layer is formed as the first insulating layer 308. The insulating layer 302 is formed of a silicon oxide layer and the first silicon layer 306 is formed of a single crystalline silicon layer. Then, the first insulating layer 308 is etched by anisotropic dry-etching mainly in a perpendicular direction. The etching progresses from the first insulating layer 308 formed over the one surface of the first silicon layer 306 and over one surface of the insulating layer 302. Note that the thickness of the first insulating layer 308 is almost the same over the one surface of the first silicon layer 306 and the one surface of the insulating layer 302. Thus, by stopping etching when the one surface of the first silicon layer 306 is exposed, the first insulating layer 308 can be left only in the region which is in contact with the side surface of the first silicon layer 306 and the periphery thereof. The left first insulating layer 308 corresponds to the second insulating layer 310. If the end portion of the first silicon layer 306 has a shape close to a perpendicular shape, the second insulating layer 310 can be easily formed only in the region which is in contact with the side surface of the first silicon layer 306 and the periphery thereof. Further, in this embodiment mode, the second insulating layer 310 is formed such that the perpendicular height from the bottom surface (the surface which is in contact with the insulating layer 302) is almost the same as that of the first silicon layer 306. Further, the second insulating layer 310 is formed such that the surface thereof on the side which is not in contact with the side surface of the first silicon layer 306 is curved convexly. It is needless to say that the present invention is not limited particularly thereto, and the second insulating layer 310 may have a shape having a corner instead of a rounded shape. Preferably, the corner portion of the second insulating layer 310 is made a gentle shape so that the coverage with a layer formed thereover (here, the insulating layer 312) can be improved.

The etching method of the first insulating layer 308 is not particularly limited as long as anisotropic etching mainly in a perpendicular direction can be performed. For example, reactive ion etching of a parallel-plate type, a magnetron type, a dual-frequency type, an ECR type, a helicon type, an ICP type, or the like can be used. As an etching gas, a gas which can provide high etching selection ratio of the first insulating layer 308 with respect to another layer (the first silicon layer 306) is preferably selected. For example, by using a fluorine-based gas such as $CHF_3$, $CF_4$, $C_4F_8$, $C_2F_6$, $NF_3$, or the like, the insulating layer can be selectively etched. Further, an inert gas such as He, Ar, or Xe, an $O_2$ gas, or an $H_2$ gas may be added as needed. Note that by changing the etching condition as appropriate, the shape of the second insulating layer 310 can be controlled. In this embodiment mode, etching of the first insulating layer 308 is performed by ICP reactive ion etching using a $CHF_3$ gas and a He gas as an etching gas.

The amorphous region 311 is formed by making the top-layer portion of the first silicon layer 306 amorphous due to energy of plasma or the like at the time of anisotropic dry-etching of the first insulating layer 308. The amorphous region 311 can be formed by controlling the thickness of the first silicon layer 306, the material of the first insulating layer 308, the etching condition of the first insulating layer 308, or the like. The amorphous region 311 is formed to have a thickness of 0.2 to 0.6 times, and preferably about 0.3 to 0.5 times as large as that of the first silicon layer 306. Note that the amorphous region 311 is formed from the top surface of the first silicon layer 306 toward the bottom surface thereof (the surface which is in contact with the insulating layer 302).

Next, the amorphous region 311 formed in the top layer portion of the first silicon layer 306 is selectively etched, whereby the second silicon layer 313 is formed. Next, the third insulating layer 312 is formed to cover the second insulating layer 310 and the second silicon layer 313 (see FIGS. 5B-1 and 5B-2).

The second silicon layer 313 is formed by selectively etching the amorphous region 311 formed in the top layer portion of the first silicon layer 306. The first silicon layer 306 is single crystalline silicon, and the top layer portion of the first silicon layer 306 is made amorphous to form an amorphous silicon layer when the second insulating layer 310 is formed by etching the first insulating layer 308. The amorphous silicon layer formed at this time corresponds to the amorphous region 311 in this embodiment mode. Therefore, by selectively etching the amorphous silicon layer that is the amorphous region 311, a single crystalline silicon layer is left as the second silicon layer 313. Note that the second silicon layer 313 is formed such that the taper angle of the end portion is preferably 45° or more and less than 95°, and more preferably 60° or more and less than 95° which is almost perpendicular. The second insulating layer 310 which is in contact with the side surface of the first silicon layer 306 is left as it is even after etching of the amorphous region 311, and it is stuck up convexly with respect to the second silicon layer 313.

The etching method of the amorphous region 311 is not particularly limited as long as it can provide high etching selection ratio of the amorphous region 311 with respect to the other insulating layers (e.g., the second insulating layer 310 and the insulating layer 302). Note that the etching selection ratio of an amorphous silicon layer with respect to a single crystalline silicon layer is low; therefore, the amorphous region 311 is formed while controlling the thickness in advance, and the first silicon layer 306 is etched in a perpendicular direction until the depth which is assumed as the depth of the amorphous region 311. As the etching method, for example, reactive ion etching of a parallel-plate type, a magnetron type, a dual-frequency type, an ECR type, a helicon type, an ICP type, or the like can be used. As an etching gas, any gas can be used as long as it can provide high etching selection ratio of the amorphous region 311 with respect to the other insulating layers. For example, a chlorine-based gas such as $Cl_2$ or an HBr gas can be used. Further, a mixed gas of a HBr gas and a $Cl_2$ gas may also be used. Further, an inert gas such as He or Ar may be added as needed. In this embodiment mode, the amorphous region 311 is selectively etched by using a $Cl_2$ gas as an etching gas.

The third insulating layer 312 is formed by a CVD method or a sputtering method using a material such as silicon oxide, silicon nitride, silicon oxynitride, silicon nitride oxide, or aluminum nitride. The third insulating layer 312 is formed of at least one of the above-described materials to have a single layer structure or a stacked-layer structure. Further, the third insulating layer 312 can also be formed by solid phase oxidation or solid phase nitridation of the second silicon layer 313 or the second silicon layer 313 and the second insulating layer 310 with a high-density plasma treatment as described in Embodiment Mode 1. The third insulating layer 312 is formed to have a thickness of 1 to 50 nm, preferably 1 to 20 nm, and more preferably 1 to 10 nm.

The second insulating layer 310 and the third insulating layer 312 formed as above function as a gate insulating layer. That is, the gate insulating layer of the present invention is formed of not a single body but a compound body including a plurality of insulating layers. By thus forming the second insulating layer 310 which is in contact with the side surface of the silicon layer, coverage with the gate insulating layer at the end portion of the silicon layer can be improved. For example, even in the case where the insulating layer under the end portion of the silicon layer and in the periphery thereof (the insulating layer over the support substrate) is removed by washing using fluorinated acid or the like accompanied with etching or various steps for processing the silicon layer into an island shape, the silicon layer can be sufficiently covered. Accordingly, short-circuiting between the silicon layer and the gate electrode layer, occurrence of a leakage current, electro-static discharge, or the like due to insufficient coverage with the gate insulating layer at the end portion of the silicon layer can be prevented.

Note that, as for the gate insulating layer formed of the second insulating layer 310 and the third insulating layer 312, the thickness in the region which is in contact with the side surface of the second silicon layer 313 is preferably larger than that over the one surface of the second silicon layer 313. For example, provided that a perpendicular distance between the one surface of the second silicon layer 313 and the top surface of the gate insulating layer is a thickness t1, and a perpendicular distance between the side surface of the second silicon layer 313 and the top surface of the gate insulating layer is a thickness t2, it is preferable for the gate insulating layer to satisfy t1<t2. Note that the thickness of the gate insulating layer in the region which is in contact with the side surface of the second silicon layer 313 is not necessarily a constant value. In this case, the minimum value of the thickness t2 is preferably equal to or larger than the thickness t1. As a result of this, the end portion of the silicon layer can be covered with the gate insulating layer enough.

Further, as for the gate insulating layer formed of the second insulating layer 310 and the third insulating layer 312, the dielectric constant in the region which is in contact with the side surface of the second silicon layer 313 is preferably lower than that in the region over the one surface of the second silicon layer 313. For example, by decreasing the dielectric constant of the second insulating layer 310 as compared to that of the third insulating layer 312, the dielectric constant of the gate insulating layer in the region which is in contact with the side surface of the second silicon layer 313 can be low. Preferably, a low-dielectric constant material in which the dielectric constant is 4 or less is used for forming the second insulating layer 310. In the gate insulating layer, by decreasing the dielectric constant in the region which is in contact with the side surface of the silicon layer as compared to that over the one surface of the silicon layer, concentration of electric field at the end portion of the silicon layer can be prevented and insufficient insulation of the gate insulating layer can be reduced, which is preferable.

Next, the conductive layer 314 which functions as a gate electrode is formed over the second silicon layer 313 with the third insulating layer 312 interposed therebetween. Then, an impurity element which imparts one conductivity type is added into the second silicon layer 313 with the conductive layer 314 as a mask. An impurity region formed in the second silicon layer 313 at this time forms a part of an LDD region.

Next, an insulating layer 315 which is in contact with the side surface of the conductive layer 314 is formed. Then, with the insulating layer 315 and the conductive layer 314 as a mask, an impurity element which imparts one conductivity type is added, whereby a channel formation region 316, the low-concentration impurity regions 317 which function as LDD regions, and the high-concentration impurity regions 318 which function as source and drain regions are formed (see FIGS. 5C-1 and 5C-2).

The conductive layer 314 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer 314 can be processed into a desired shape by selective etching after being formed over the entire surface by a CVD method or a sputtering method. Further, the conductive layer 314 has either a single layer structure or a stacked-layer structure. The conductive layer 314 is formed to have a thickness of 100 nm to 1000 nm, preferably 200 nm to 800 nm, and more preferably 300 nm to 500 nm.

The insulating layer 315 is formed of an insulating layer having a single layer structure or a stacked-layer structure by a CVD method or a sputtering method using an inorganic material such as silicon oxide, silicon nitride, silicon oxynitride, or silicon nitride oxide, or an organic material such as an organic resin. The insulating layer is selectively etched by anisotropic etching mainly in a perpendicular direction, so that the insulating layer 315 which is in contact with the side surface of the conductive layer 314 can be formed. The insulating layer 315 is also called a sidewall. Here, the surface of the insulating layer 315, on the side which is not in contact with the side surface of the conductive layer 314 is curved. Specifically, the insulating layer 315 is formed such that an appropriate curvature is provided to curve convexly with respect to the side surface of the conductive layer 314 which is in contact with the insulating layer 315. It is needless to say that the present invention is not limited particularly thereto, and the insulating layer 315 may have a shape having a corner instead of a rounded shape. Note that the insulating layer 315 also functions as a doping mask for forming the LDD region.

The second silicon layer 313 includes the channel formation region 316, the low-concentration impurity regions 317, and the high-concentration impurity regions 318. The channel formation region 316 is formed in the region which almost agrees with the conductive layer 314 with the third insulating layer 312 interposed therebetween. Each low-concentration impurity region 317 is formed in the region which almost agrees with the insulating layer 315 with the third insulating layer 312 interposed therebetween, and is formed between each high-concentration impurity region 318 and the channel formation region 316. Note that the low-concentration impurity regions 317 are not necessarily formed.

As compared to the low-concentration impurity regions 317, the concentration of the impurity element in each high-concentration impurity region 318 is high. As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Through the above, a thin film transistor 320 to which the present invention is applied can be formed.

Note that after the impurity element which imparts one conductivity type is added into the second silicon layer 313, a thermal treatment may be performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 550° C. Further, the thermal treatment is preferably performed in a nitrogen atmosphere. For example, activation can be performed by heating at 550° C. for 4 hours. Further, when the second silicon layer 313 includes an amorphous region, recrystallization of the silicon layer can also be performed together with the activation of the impurity element by performing thermal treatment.

Further, a TFT can also be manufactured by using a manufacturing method shown in FIGS. 6A to 6C or FIGS. 6D to 6F. Each method is the same as that shown in FIGS. 4B-1 and 4C-1 in that the SOI substrate 305 in which the insulating layer 302 and the first island-shaped silicon layer 306 are stacked in order over the support substrate 300 is used, up to and including the formation of the first insulating layer 308 over the silicon layer 306; therefore, the description thereof is omitted.

Figure 6A:
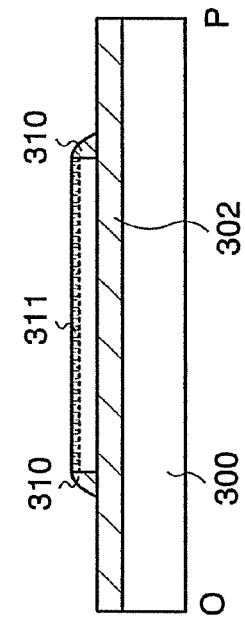
FIGS. 6A to 6F are diagrams showing an example of a manufacturing method of a semiconductor device of the present invention.
Figure 6B:
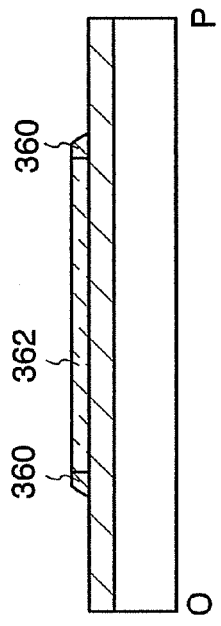
Figure 6C:
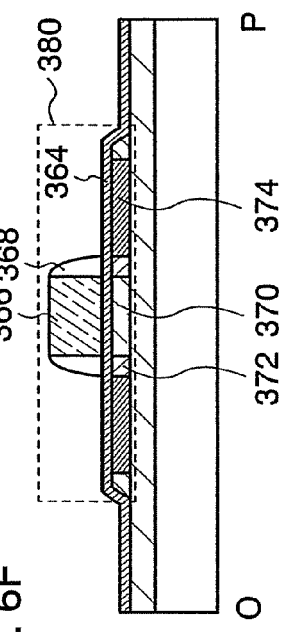

First, the manufacturing method shown in FIGS. 6A to 6C is described. After the first insulating layer 308 is formed over the first silicon layer 306 (see FIG. 4C-1), the first insulating layer 308 is selectively etched by anisotropic etching mainly in a perpendicular direction to form a second insulating layer 330 which is in contact with the side surface of the silicon layer 306. The top-layer portion of the first silicon layer 306 is made amorphous to form an amorphous region 331 (see FIG. 6A). At this time, the etching condition is controlled such that the second insulating layer 330 which is in contact with the side surface of the first silicon layer 306 has a perpendicular height from the bottom surface (the surface which is in contact with the insulating layer 302), which is lower than that of the first silicon layer 306. Preferably, the perpendicular height from the bottom surface of the second insulating layer 330 is almost equal to the height from the bottom surface to the amorphous region 331 in the first silicon layer 306.

The second insulating layer 330 can be processed into a desired shape by changing the etching condition such as a gas sort, a gas flow ratio, or the like of an etching gas. For example, by increasing the etching selection ratio of the first insulating layer 308 with respect to another layer (the first silicon layer 306) such that the etching of the first insulating layer 308 selectively progresses, the perpendicular height from the bottom surface of the second insulating layer 330 can be made lower than the first silicon layer 306. That is, the amorphous region 331 and the second insulating layer 330 can also be prevented from being in contact with each other.

Next, the amorphous region 331 formed in the top-layer portion of the first silicon layer 306 is selectively etched, whereby a second silicon layer 332 is formed (see FIG. 6B). Note that the etching selection ratio of the amorphous region 331 with respect to the first silicon layer 306 that is a single crystalline silicon layer is low; therefore, the amorphous region 331 is formed while controlling the thickness in advance, and the first silicon layer 306 is etched in a perpendicular direction until the depth which is assumed as the depth of the amorphous region 331. Here, the second insulating layer 330 is formed so as not to be in contact with the amorphous region 331. Accordingly, after etching of the amorphous region 331, the second insulating layer 330 is not stuck up convexly.

Next, a third insulating layer 334 is formed over the second silicon layer 332 and the second insulating layer 330. The second insulating layer 330 and the third insulating layer 334 function as a gate insulating layer. Next, a conductive layer 336 which functions as a gate electrode is formed over the second silicon layer 332 with the third insulating layer 334 interposed therebetween. An impurity element which imparts one conductivity type is added into the second silicon layer 332 with the conductive layer 336 as a mask. An impurity region formed in the second silicon layer 332 at this time forms a part of an LDD region. Next, an insulating layer 338 which is in contact with the side surface of the conductive layer 336 is formed. Then, with the insulating layer 338 and the conductive layer 336 as a mask, an impurity element which imparts one conductivity type is added, whereby a channel formation region 340, low-concentration impurity regions 342 which function as LDD regions, and high-concentration impurity regions 344 which function as source and drain regions are formed. Through the above, a TFT 350 can be formed (see FIG. 6C). Note that the method by which the third insulating layer 334 is formed, the conductive layer 336 and the insulating layer 338 are formed, and the channel formation region 340, the low-concentration impurity regions 342, and the high-concentration impurity regions 344 are formed in the second silicon layer is similar to that shown in FIGS. 5B-1 and 5C-1, and therefore, the description thereof is omitted.

Figure 6D:
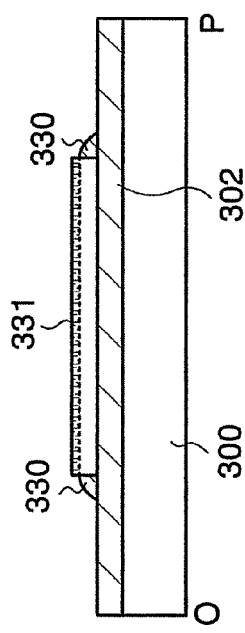
Figure 6E:
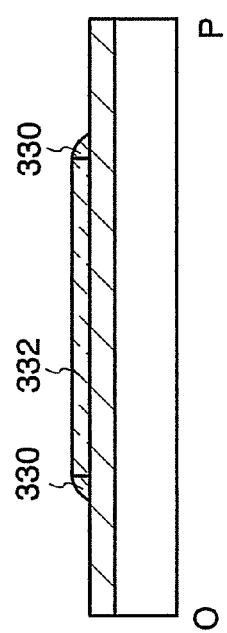
Figure 6F:
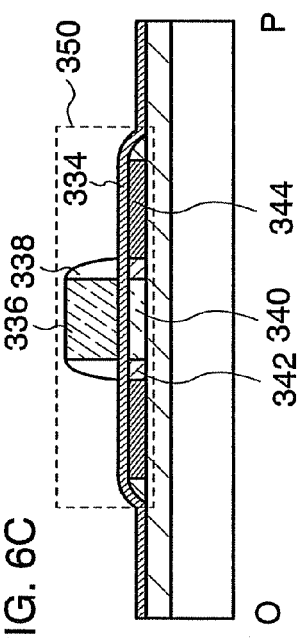

Next, the manufacturing method shown in FIGS. 6D to 6F is described. After the first insulating layer 308 is formed over the first silicon layer 306 (see FIG. 4C-1), the first insulating layer 308 is selectively etched by anisotropic etching mainly in a perpendicular direction to form the second insulating layer 310 which is in contact with the side surface of the silicon layer 306. The top-layer portion of the first silicon layer 306 is made amorphous to form the amorphous region 311 (see FIGS. 5A-1 and 6D).

Next, the amorphous region 311 formed in the top-layer portion of the first silicon layer 306 and the second insulating layer 310 are selectively etched by anisotropic etching mainly in a perpendicular direction, whereby a second silicon layer 362 and a third insulating layer 360 are formed (see FIG. 6E). The amorphous region 311 and the second insulating layer 310 are etched by the etching condition in which the etching selection ratio therebetween is as small as possible, that is, the etching selection ratio is near 1. By thus doing, the perpendicular height from the bottom surface (the surface which is in contact with the insulating layer 302) can be almost the same in the second silicon layer 362 and the third insulating layer 360 formed by the etching.

Next, a fourth insulating layer 364 is formed so as to cover the second silicon layer 362 and the third insulating layer 360. The third insulating layer 360 and the fourth insulating layer 364 function as a gate insulating layer. Next, a conductive layer 366 which functions as a gate electrode is formed over the second silicon layer 362 with the fourth insulating layer 364 interposed therebetween. An impurity element which imparts one conductivity type is added into the second silicon layer 362 with the conductive layer 366 as a mask. An impurity region formed in the second silicon layer 362 at this time forms a part of an LDD region. Next, an insulating layer 368 which is in contact with the side surface of the conductive layer 366 is formed. Then, with the insulating layer 368 and the conductive layer 366 as a mask, an impurity element which imparts one conductivity type is added, whereby a channel formation region 370, low-concentration impurity regions 372 which function as LDD regions, and high-concentration impurity regions 374 which function as source and drain regions are formed. Through the above, a TFT 380 can be formed (see FIG. 6F). Note that the method by which the fourth insulating layer 364 is formed, the conductive layer 366 and the insulating layer 368 are formed, and the channel formation region 370, the low-concentration impurity regions 372, and the high-concentration impurity regions 374 are formed in the second silicon layer is similar to that shown in FIGS. 5B-1 and 5C-1, and therefore, the description thereof is omitted. Note that the fourth insulating layer 364 corresponds to the third insulating layer 312.

Through the above, the thin film transistors 320, 350, and 380 to which the present invention is applied can be formed. Note that each structure of the TFT described in this embodiment mode is just an example, and the present invention is not limited to the structures shown. For example, a multi-gate structure, which includes a silicon layer including two or more channel formation regions connected in series and two or more gate electrode layers by which an electric field is applied to the channel formation regions, may be employed. Further, an LDD region may be formed in the silicon layer of the TFT.

Although the example in which an insulating layer is formed so as to be in contact with the side surface of a conductive layer which functions as a gate electrode and LDD regions are formed in a silicon layer is described in this embodiment mode, the present invention is not particularly limited. The structure as described in Embodiment Mode 1 may be employed, and the side surface of the gate electrode may be tapered. Further, the gate electrode may employ a stacked-layer structure including two conductive layers, and the taper angle may be different in the layers.

In a semiconductor device manufactured by applying the present invention, a defect due to an end portion of a silicon layer can be prevented. In particular, a defect such as insufficient coverage with the gate insulating layer at the end portion of the silicon layer, dielectric breakdown, electrostatic discharge, or a leakage current of the gate insulating layer due to concentration of electric field at the end portion of the silicon layer can be prevented or reduced. Therefore, a highly reliable semiconductor device can be manufactured. Further, high-yield manufacturing of semiconductor devices can also be realized by applying the present invention.

This embodiment mode can be combined with any other embodiment mode in this specification as appropriate.

Embodiment Mode 3

In this embodiment mode, an example of manufacturing a semiconductor device by a manufacturing method which is different from those in the above embodiment modes is described with reference to FIGS. 7A, 7B-1 and 7B-2, 7C-1 and 7C-2, 8A-1 and 8A-2, 8B-1 and 8B-2, 8C-1 and 8C-2, and 9A to 9F.

FIG. 7A is a top diagram for describing a main structure of a semiconductor device of the present invention. Note that a thin film and the like are partially omitted in FIG. 7A.

In a semiconductor device shown in FIG. 7A, a thin film transistor is formed using an SOI substrate. A surface silicon layer 414 of the SOI substrate is formed into an island shape, and a conductive layer 417 and a conductive layer 418 which form a gate electrode are provided so as to get across the island-shaped silicon layer 414. Further, an insulating layer 410 is provided so as to be in contact with the side surface of the island-shaped silicon layer 414. Although the example in which the insulating layer 410 is provided around the island-shaped silicon layer 414 is shown in the drawing here, the present invention is not limited thereto as long as the insulating layer which is in contact with the side surface of the island-shaped silicon layer 414 is provided at least in a region where the conductive layers 417 and 418 and the silicon layer 414 overlap each other. It is needless to say that the insulating layer which is in contact with the side surface of the island-shaped silicon layer 414 may also be provided in the region where the conductive layers 417 and 418 and the silicon layer 414 overlap each other and the periphery thereof.

In the silicon layer 414, a channel formation region 420, a pair of low-concentration impurity regions 421 which function as LDD regions, and a pair of high-concentration impurity regions 422 which function as source and drain regions are formed. The channel formation region is formed in the silicon layer 414 in the region which almost agrees with the conductive layer 418, and is positioned between the pair of high-concentration impurity regions 422. Further, each low-concentration impurity region is formed in the silicon layer 414 in the region which overlaps with the conductive layer 417 and does not overlap with the conductive layer 418 between the channel formation region and each high-concentration impurity region 422.

Next, a manufacturing method of the semiconductor device shown in FIG. 7A is described. Specific description is made here with reference to cross-sectional diagrams along a dashed line O-P in FIG. 7A, and cross-sectional diagrams along a dashed line Q-R in FIG. 7A.

First, an SOI substrate 405 is prepared in which an insulating layer 402 and a first silicon layer 406 are stacked in order over a support substrate 400 (see FIGS. 7B-1 and 7B-2). Next, a first insulating layer 408 is formed to cover the first silicon layer 406 (see FIGS. 7C-1 and 7C-2). Up to and including the formation of the first insulating layer 408, the description made on the SOI substrate 105 and the insulating layer 107 in Embodiment Mode 1 can be referred to, and therefore, the description thereof is roughly made below.

As the SOI substrate 405, a known SOI substrate such as a SIMOX substrate or a bonded substrate can be used. A surface silicon layer of the SOI substrate 405 is selectively etched to form the island-shaped first silicon layer 406. The thickness of the first silicon layer 406 may be 10 nm to 150 nm, and preferably 30 nm to 100 nm. Further, the first silicon layer 406 may be formed such that the end portion has a perpendicular shape or a tapered shape. In this embodiment mode, the first silicon layer 406 is formed such that the end portion may be tapered at a taper angle of 30° or more and less than 85° or may be gently tapered at a taper angle of 45° or more and less than 60°. By making the end portion of the first silicon layer 406 a tapered shape such that the corner portion becomes gentle, concentration of electric field at the corner portion can be relaxed. Note that the present invention is not particularly limited, and as described in the above embodiment mode, the end portion of the first silicon layer 406 may also be tapered at a taper angle of 45° or more and less than 95°, and more preferably at a taper angle of 60° or more and less than 95° which is almost perpendicular.

The first insulating layer 408 is formed of a material such as silicon oxide, silicon nitride, silicon oxynitride, silicon nitride oxide, SiOF, SiOC, DLC, porous silica, or the like by a CVD method or a sputtering method. Further, the first insulating layer 408 is formed to have a thickness enough to cover at least the end portion of the first silicon layer 406. The first insulating layer 408 is preferably formed to have a thickness of 1.5 to 3 times as large as that of the first silicon layer 406 thereunder. Note that the first insulating layer 408 is preferably formed of a material having the dielectric constant which is lower than that of an insulating layer 416 formed later over one surface of the silicon layer. The first insulating layer 408 forms a part of a gate insulating layer in a semiconductor device, and specifically, a part of a gate insulating layer in the region which is in contact with the side surface of the silicon layer. With an island-shaped silicon layer, concentration of electric field tends to occur at the end portion, in particular, the corner portion of the silicon layer. If the concentration of electric field occurs, insufficient insulation such as dielectric breakdown further tends to occur in the gate insulating layer. Therefore, by forming the first insulating layer 408 which is in contact with the side surface of the silicon layer with the use of a low-dielectric constant material as compared to the insulating layer formed over the one surface of the silicon layer, an electric field applied to the end portion of the silicon layer can be relaxed, which is preferable.

Next, the first insulating layer 408 is selectively etched by anisotropic etching mainly in a perpendicular direction to form the second insulating layer 410 which is in contact with the side surface of the first silicon layer 406. At this time, the top-layer portion of the first silicon layer 406 is made amorphous to form the amorphous region 412 (see FIGS. 8A-1 and 8A-2).

For example, a silicon nitride oxide layer is formed as the first insulating layer 408. The insulating layer 402 is formed of a silicon oxide layer and the first silicon layer 406 is formed of a single crystalline silicon layer. Then, the first insulating layer 408 is etched by anisotropic dry-etching mainly in a perpendicular direction. The etching progresses from the first insulating layer 408 formed over the one surface of the first silicon layer 406 and one surface of the insulating layer 402. Note that the thickness of the first insulating layer 408 is almost the same over the one surface of the first silicon layer 406 and the one surface of the insulating layer 402. Thus, by stopping etching when the one surface of the first silicon layer 406 is exposed, the first insulating layer 408 can be left only in the region which is in contact with the side surface of the first silicon layer 406 and the periphery thereof. The left first insulating layer 408 corresponds to the second insulating layer 410.

The etching method of the first insulating layer 408 is not particularly limited as long as anisotropic etching mainly in a perpendicular direction can be performed. For example, reactive ion etching of a parallel-plate type, a magnetron type, a dual-frequency type, an ECR type, a helicon type, an ICP type, or the like can be used. As an etching gas, a gas which can provide high etching selection ratio of the first insulating layer 408 with respect to another layer (the first silicon layer 406) is preferably selected. For example, a fluorine-based gas such as $CHF_3$, $CF_4$, $C_4F_8$, $C_2F_6$, $NF_3$, or the like, the insulating layer can be selectively etched. Further, an inert gas such as He, Ar, or Xe, an $O_2$ gas, or an $H_2$ gas may be added as needed. In this embodiment mode, etching of the first insulating layer 408 is performed by ICP reactive ion etching using a $CHF_3$ gas and a He gas as an etching gas. Note that by changing the etching condition as appropriate, the shape of the second insulating layer 410 can be controlled. In this embodiment mode, the second insulating layer 410 is formed such that the perpendicular height from the bottom surface (the surface which is in contact with the insulating layer 402) is almost the same as that of the first silicon layer 406. Further, the second insulating layer 410 is formed such that the surface thereof on the side which is not in contact with the side surface of the silicon layer is curved. Specifically, it is formed such that an appropriate curvature is provided and the surface is curved convexly with respect to the side surface of the silicon layer being in contact with. It is needless to say that the present invention is not limited particularly thereto, and the second insulating layer 410 may have a shape having a corner instead of a rounded shape. Preferably, the corner portion of the second insulating layer 410 is made a gentle shape so that the coverage with a layer formed thereover (here, the insulating layer 416) can be improved.

An amorphous region 412 is formed by making the top-layer portion of the first silicon layer 406 amorphous due to energy of plasma or the like at the time of etching of the first insulating layer 408. The amorphous region 412 can be formed by controlling the thickness of the first silicon layer 406, the material of the first insulating layer 408, the etching condition of the first insulating layer 408, or the like. The amorphous region 412 is formed to have a thickness of 0.2 to 0.6 times, and preferably about 0.3 to 0.5 times as large as that of the first silicon layer 406. Note that the amorphous region 412 is formed from the top surface of the first silicon layer 406 (the surface which is opposite to the surface which is in contact with the insulating layer 402) in a perpendicular direction. Further, the first silicon layer 406 is also preferably formed to be thick in advance in consideration of the region to be made amorphous at the time of etching for forming the second insulating layer 410.

Next, the amorphous region 412 formed in the top-layer portion of the first silicon layer 406 is selectively etched, whereby the second silicon layer 414 is formed. Note that the etching selection ratio of the amorphous region 412 with respect to the first silicon layer 406 that is a single crystalline silicon layer is low; therefore, the amorphous region 412 is formed while controlling the thickness in advance, and the first silicon layer 406 is etched in a perpendicular direction until the depth which is assumed as the depth of the amorphous region 412. Next, the third insulating layer 416 is formed so as to cover the second insulating layer 410 and the second silicon layer 414 (see FIGS. 8B-1 and 8B-2).

The second silicon layer 414 is formed by selectively etching the amorphous region 412 formed in the top layer portion of the first silicon layer 406. The first silicon layer 406 is single crystalline silicon, and the top layer portion of the first silicon layer 406 is made amorphous to form an amorphous silicon layer when the second insulating layer 410 is formed by etching the first insulating layer 408. The amorphous silicon layer formed at this time corresponds to the amorphous region 412 in this embodiment mode. Therefore, by selectively etching the amorphous silicon layer that is the amorphous region 412, a single crystalline silicon layer is left as the second silicon layer 414. Here, the second silicon layer 414 is formed such that the end portion is gently tapered at a taper angle of 30° or more and less than 85°, and more preferably 45° or more and less than 60°. Note that the present invention is not particularly limited, and as described in the above embodiment mode, the second silicon layer 414 may also be formed such that the end portion has a taper angle of 45° or more and less than 95°, and more preferably 60° or more and less than 95° which is almost perpendicular. The second insulating layer 410 which is in contact with the side surface of the first silicon layer 406 is left as it is even after etching of the amorphous region 412, and it is stuck up convexly with respect to the second silicon layer 414.

In this embodiment mode, the first silicon layer 406 utilizing the surface silicon layer of the SOI substrate 405 is formed to have a thickness of 60 nm, a silicon oxynitride layer is formed over the first silicon layer 406 as the first insulating layer 408 to have a thickness of 200 nm, and then etching mainly in a perpendicular direction is performed to form the second insulating layer 410. The etching is performed by ICP reactive ion etching. The amorphous region 412 formed at this time is selectively etched, whereby a single crystalline silicon layer is formed as the second silicon layer 414 to have a thickness of 25 nm.

The third insulating layer 416 is formed by a CVD method or a sputtering method, using silicon oxide, silicon nitride, silicon oxynitride, silicon nitride oxide, aluminum nitride, or the like. The third insulating layer 416 is formed to have a single layer structure or a stacked-layer structure of at least one of the above materials. Further, the third insulating layer 416 can also be formed by solid phase oxidation or solid phase nitridation with a plasma treatment. For example, the second silicon layer 414 and the second insulating layer 410 are oxidized or nitrided by a high-density plasma treatment to form the third insulating layer 416. The third insulating layer 416 is formed to have a thickness of 1 nm to 50 nm, preferably 1 nm to 20 nm, and more preferably 1 nm to 10 nm.

The second insulating layer 410 and the third insulating layer 416 formed as above function as a gate insulating layer. That is, the gate insulating layer of the present invention is formed of not a single body but a compound body including a plurality of insulating layers. By forming the second insulating layer 410 which is in contact with the side surface of the silicon layer and further forming the third insulating layer 416 over the one surface of the silicon layer, coverage with the gate insulating layer at the end portion of the silicon layer can be improved. Accordingly, short-circuiting between the silicon layer and the gate electrode, occurrence of a leakage current, or the like due to insufficient coverage with the gate insulating layer can be prevented. Furthermore, by improving the coverage with the gate insulating layer, electro-static discharge of an element such as a transistor can be prevented.

Note that, as for the gate insulating layer formed of the second insulating layer 410 and the third insulating layer 416, the thickness in the region which is in contact with the side surface of the second silicon layer 414 is preferably larger than that over the one surface of the second silicon layer 414. For example, provided that a perpendicular distance between the one surface of the second silicon layer 414 and the top surface of the gate insulating layer is a thickness t1, and a perpendicular distance between the side surface of the second silicon layer 414 and the top surface of the gate insulating layer is a thickness t2, it is preferable for the gate insulating layer to satisfy t1<t2. Note that the thickness of the gate insulating layer in the region which is in contact with the side surface of the second silicon layer 414 is not necessarily a constant value. In this case, the minimum value of the thickness t2 is preferably equal to or larger than the thickness t1. By thus covering the end portion of the second silicon layer 414 with the gate insulating layer enough, and preferably, by increasing the thickness of the gate insulating layer in the region which is in contact with the side surface of the second silicon layer 414, an electric field applied to the end portion of the second silicon layer 414 can be relaxed, and occurrence of a leakage current, or the like can be prevented.

Further, as for the gate insulating layer formed of the second insulating layer 410 and the third insulating layer 416, the dielectric constant in the region which is in contact with the side surface of the second silicon layer 414 is preferably lower than that in the region over the one surface of the second silicon layer 414. For example, by decreasing the dielectric constant of the second insulating layer 410 as compared to that of the third insulating layer 416, the dielectric constant of the gate insulating layer in the region which is in contact with the side surface of the second silicon layer 414 can be low. Preferably, a low-dielectric constant material in which the dielectric constant is 4 or less is used for forming the second insulating layer 410. In the gate insulating layer, by decreasing the dielectric constant in the region which is in contact with the side surface of the silicon layer as compared to that over the one surface of the silicon layer, concentration of electric field at the end portion of the silicon layer can be relaxed and insufficient insulation of the gate insulating layer can be prevented.

Next, a stack of the conductive layer 417 and the conductive layer 418, which functions as a gate electrode is formed over the second silicon layer 414 with the third insulating layer 416 interposed therebetween. Then, an impurity element which imparts one conductivity type is added into the second silicon layer 414 with the conductive layers 417 and 418 as a mask, whereby the channel formation region 420, the pair of low-concentration impurity regions 421 which function as LDD regions, and the pair of high-concentration impurity regions 422 which function as source and drain regions are formed (see FIGS. 8C-1 and 8C-2).

Each of the conductive layers 417 and 418 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer which functions as a gate electrode can be formed of at least one of the above materials to have either a single layer structure or a stacked-layer structure. The conductive layer is formed to have a thickness of 100 nm to 1000 nm, preferably 200 nm to 800 nm, and more preferably 300 nm to 500 nm. Further, the conductive layer which functions as a gate electrode can be processed into a desired shape by selective etching after being formed over the entire surface by a CVD method or a sputtering method using any of the above-described materials.

The example in which a two-layer stack of the conductive layers 417 and 418 is formed as a gate electrode, the side surface of each layer is tapered, the taper angle is different in the layers is described in this embodiment mode. By making the side surface of the conductive layer for forming the gate electrode a tapered shape, coverage with a layer formed thereover can be improved.

Further, in this embodiment mode, the conductive layers 417 and 418 are formed to have different widths (lengths in a direction almost parallel to a direction in which carriers flow in a channel forming region, i.e., a direction for connecting a source region and a drain region with each other). Specifically, the gate electrode is formed such that the width of the conductive layer 417 is larger than that of the conductive layer 418, that is, the width of the lower conductive layer is larger in the case where the gate electrode is formed of a two-layer structure. By thus forming such that the width of the conductive layers is different, the low-concentration impurity regions 421 and the high-concentration impurity regions 422 are easily formed in the second silicon layer 414.

In this embodiment mode, the conductive layer 417 can function as a doping mask for forming the low-concentration impurity regions 421 when the impurity element which imparts one conductivity type is added into the second silicon layer 414. The conductive layer 418 functions as a doping mask for forming the channel formation region 420. Therefore, the channel formation region 420 is formed in the region which almost agrees with the conductive layer 418 with the third insulating layer 416 interposed therebetween, and the low-concentration impurity regions 421 are formed in the region which overlaps with the conductive layer 417 and does not overlap with the conductive layer 418. The high-concentration impurity regions 422 are formed in the region which does not overlap with the conductive layers 417 and 418. Note that the low-concentration impurity regions are not necessarily provided.

As compared to the low-concentration impurity region 421, the concentration of the impurity element in the high-concentration impurity region 422 is high. As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Through the above, a thin film transistor 424 to which the present invention is applied can be formed.

Note that after the impurity element which imparts one conductivity type is added into the second silicon layer 414, a thermal treatment may be performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 550° C. Further, the thermal treatment is preferably performed in a nitrogen atmosphere. For example, activation can be performed by heating at 550° C. for 4 hours. Further, when the second silicon layer 414 includes an amorphous region, recrystallization of the silicon layer can also be performed together with the activation of the impurity element by performing thermal treatment.

Further, a TFT can also be manufactured by using a manufacturing method shown in FIGS. 9A to 9C or FIGS. 9D to 9F. Each method is the same as that shown in FIGS. 7B-1 and 7C-1 in that the first silicon layer 406 is formed by processing the surface silicon layer of the SOI substrate 405 into an island shape, up to and including the formation of the first insulating layer 408 over the first silicon layer 406; therefore, the description thereof is omitted. Note that in FIGS. 9A to 9F, cross-sectional diagrams along a dashed line O-P in FIG. 7A are used for description.

Figure 9D:
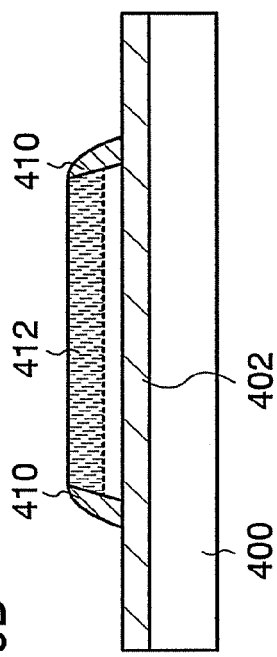
FIGS. 9A to 9F are diagrams showing an example of a manufacturing method of a semiconductor device of the present invention.
Figure 9E:
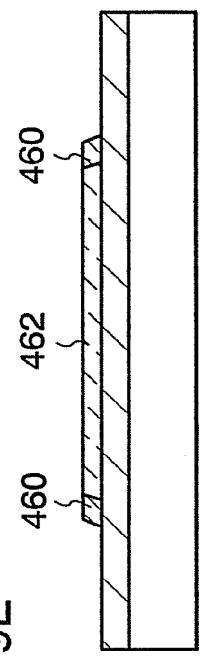
Figure 9F:
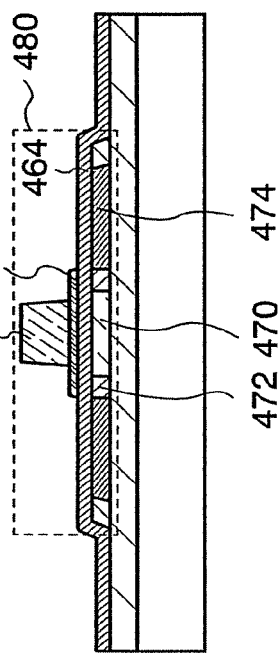
Figure 9A:
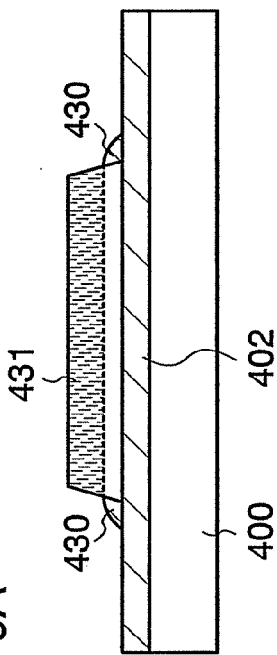
Figure 9B:
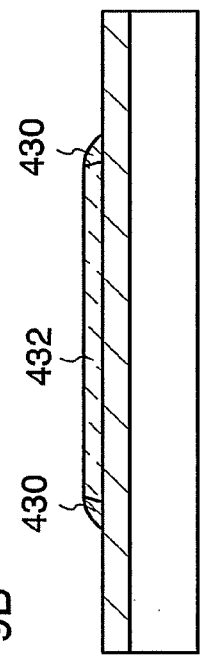
Figure 9C:
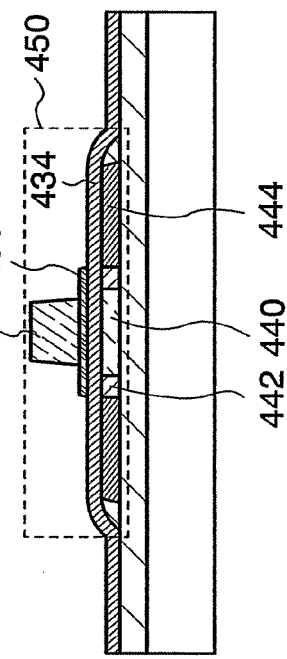
Figure 12A:
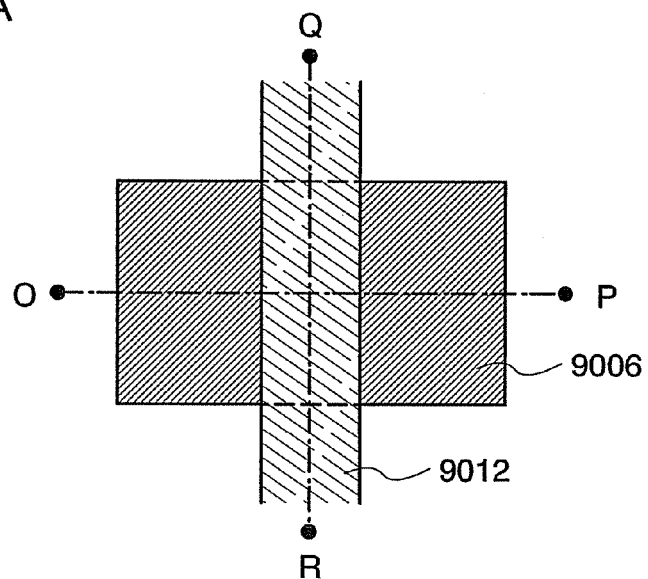
FIGS. 12A to 12C are diagrams showing an example of a structure of a conventional semiconductor device.
Figure 12B:
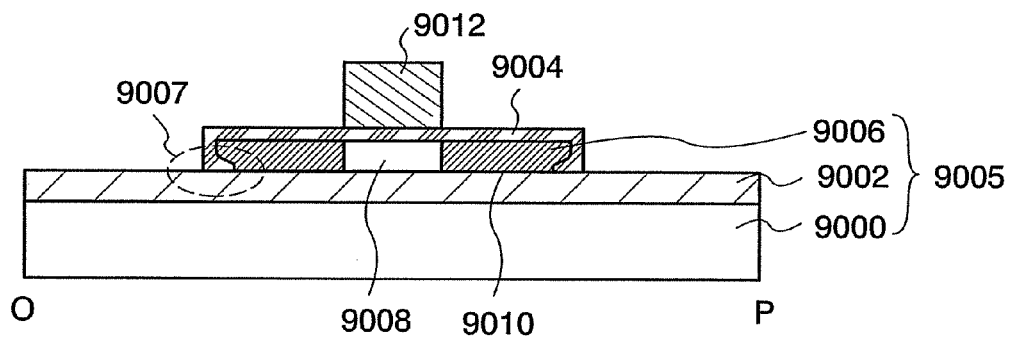
Figure 12C:
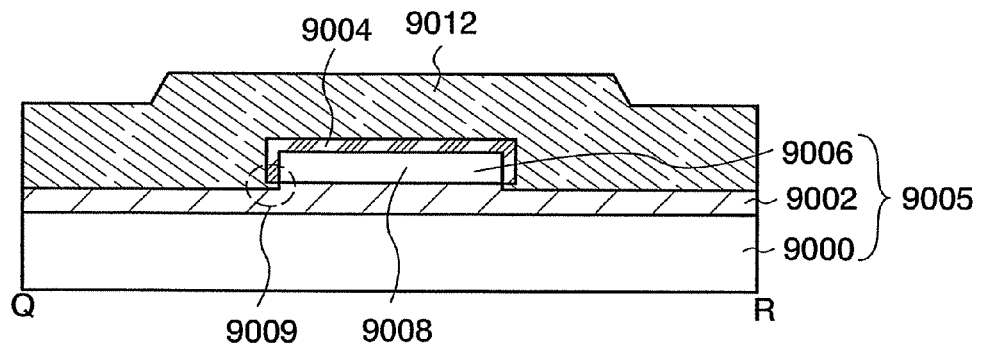

First, the manufacturing method shown in FIGS. 9A to 9C is described. After the first insulating layer 408 is formed over the first silicon layer 406 (see FIG. 7C-1), the first insulating layer 408 is selectively etched by anisotropic etching mainly in a perpendicular direction to form a second insulating layer 430 which is in contact with the side surface of the silicon layer 406. A region in a perpendicular direction from the top surface of the first silicon layer 406 is made amorphous to form an amorphous region 431 (see FIG. 9A). At this time, the etching condition is controlled such that the second insulating layer 430 which is in contact with the side surface of the first silicon layer 406 has a perpendicular height from the bottom surface (the surface which is in contact with the insulating layer 402), which is lower than that of the first silicon layer 406. Preferably, the perpendicular height from the bottom surface of the second insulating layer 430 is almost equal to the height from the bottom surface to the amorphous region 431 in the first silicon layer 406. That is, the etching condition is preferably controlled such that the amorphous region 431 and the second insulating layer 430 are not in contact with each other.

Next, the amorphous region 431 formed in the top-layer portion of the first silicon layer 406 is selectively etched, whereby a second silicon layer 432 is formed (see FIG. 9B). The second insulating layer 430 is formed so as not to be in contact with the amorphous region 431. Therefore, after etching of the amorphous region 431, the second insulating layer 430 is not stuck up convexly.

Next, a third insulating layer 434 is formed over the second silicon layer 432 and the second insulating layer 430. The second insulating layer 430 and the third insulating layer 434 function as a gate insulating layer. Next, a stack of a conductive layer 436 and a conductive layer 438, which functions as a gate electrode is formed over the second silicon layer 432 with the third insulating layer 434 interposed therebetween. An impurity element which imparts one conductivity type is added into the second silicon layer 432 with the conductive layers 436 and 438 as a mask, whereby a channel formation region 440, low-concentration impurity regions 442 which function as LDD regions, and high-concentration impurity regions 444 which function as source and drain regions are formed. Through the above, a TFT 450 can be formed (see FIG. 9C). Note that the method from the formation of the third insulating layer 434, through the formation of the conductive layers 436 and 438, up to and including the formation of the channel formation region 440, the low-concentration impurity regions 442, and the high-concentration impurity regions 444 in the second silicon layer 432 is similar to that shown in FIGS. 8B-1 and 8C-1, and therefore, the description thereof is omitted.

Next, the manufacturing method shown in FIGS. 9D to 9F is described. After the first insulating layer 408 is formed over the first silicon layer 406 (see FIG. 7C-1), the first insulating layer 408 is selectively etched by anisotropic etching mainly in a perpendicular direction to form the second insulating layer 410 which is in contact with the side surface of the first silicon layer 406. A region in a perpendicular direction from the top surface of the first silicon layer 406 is made amorphous to form the amorphous region 412 (see FIGS. 8A-1 and 9D).

Next, the amorphous region 412 formed in the top-layer portion of the first silicon layer 406 and the second insulating layer 410 are selectively etched by anisotropic etching mainly in a perpendicular direction, whereby a second silicon layer 462 and a third insulating layer 460 are formed (see FIG. 9E). The amorphous region 412 and the second insulating layer 410 are etched by the etching condition in which the etching selection ratio therebetween is small, or the etching selection ratio is near 1. That is, the amorphous region 412 and the second insulating layer 410 are etched at almost the same etching rate. By thus doing, the perpendicular height from the bottom surface (the surface which is in contact with the insulating layer 402) can be almost the same in the second silicon layer 462 and the third insulating layer 460 formed by the etching.

Next, a fourth insulating layer 464 is formed over the second silicon layer 462 and the third insulating layer 460. The third insulating layer 460 and the fourth insulating layer 464 function as a gate insulating layer. Next, conductive layers 466 and 468 which function as a gate electrode are formed over the second silicon layer 462 with the fourth insulating layer 464 interposed therebetween. An impurity element which imparts one conductivity type is added into the second silicon layer 462 with the conductive layers 466 and 468 as a mask, whereby a channel formation region 470, low-concentration impurity regions 472 which function as LDD regions, and high-concentration impurity regions 474 which function as source and drain regions are formed. Through the above, a TFT 480 can be formed (see FIG. 9F). The method from the formation of the fourth insulating layer 464, through the formation of the conductive layers 466 and 468, up to and including the formation of the channel formation region 470, the low-concentration impurity regions 472, and the high-concentration impurity regions 474 in the second silicon layer 462 is similar to that shown in FIGS. 8B-1 and 8C-1, and therefore, the description thereof is omitted. Note that the fourth insulating layer 464 corresponds to the third insulating layer 416.

Through the above, the thin film transistors 424, 450, and 480 to which the present invention is applied can be formed. Note that each structure of the TFT described in this embodiment mode is just an example, and the present invention is not limited to the structures shown. For example, a multi-gate structure, which includes a silicon layer including two or more channel formation regions connected in series and two or more gate electrode layers by which an electric field is applied to the channel formation regions, may be employed. Further, an LDD region may be formed in the silicon layer of the TFT.

Although the example in which a stack of two conductive layers in which the taper angle is different in the layers is formed as a gate electrode is described in this embodiment mode, the present invention is not particularly limited. The gate electrode may also be formed of a single layer of a conductive layer, and the side surface of the conductive layer may be tapered. Further, an insulating layer which is also called a sidewall may also be formed so as to be in contact with the side surface of the conductive layer.

In a thin film transistor manufactured by applying the present invention, defects due to an end portion of a silicon layer can be reduced. In particular, insufficient coverage with the gate insulating layer at the end portion of the silicon layer can be prevented. Further, concentration of electric field at the end portion of the silicon layer can be relaxed. Accordingly, short-circuiting between the silicon layer and the gate electrode, dielectric breakdown or electro-static discharge of the gate insulating layer, and a leakage current due to such a defect can be prevented or reduced. Therefore, a highly reliable semiconductor device can be manufactured. Further, high-yield manufacturing of semiconductor devices can also be realized.

Further, by applying the present invention, as well as the above-described defect due to the end portion of the silicon layer can be reduced, thinning of the silicon layer can also be realized. Further, a defect near the end portion of the silicon layer due to thinning of the silicon layer can also be prevented.

This embodiment mode can be combined with any other embodiment mode in this specification as appropriate.

Embodiment Mode 4

In this embodiment mode, an example of manufacturing a semiconductor device by a manufacturing method which is different from those in the above embodiment modes is described with reference to FIGS. 10A, 10B-1 and 10B-2, 10C-1 and 10C-2, 11A-1 and 11A-2, 11B-1 and 11B-2, and 11C-1 and 11C-2.

FIG. 10A is a top diagram for describing a main structure of a semiconductor device of the present invention. Note that a thin film and the like are partially omitted in FIG. 10A.

In a semiconductor device shown in FIG. 10A, a thin film transistor is formed using an SOI substrate. A surface silicon layer 712 of the SOI substrate is formed into an island shape, and a conductive layer 718 which forms a gate electrode is provided so as to get across the island-shaped silicon layer 712. Further, an insulating layer 710 is provided so as to be in contact with the side surface of the island-shaped silicon layer 712. Although the example in which the insulating layer 710 is provided around the island-shaped silicon layer 712 is shown here, the present invention is not limited thereto as long as the insulating layer which is in contact with the side surface of the island-shaped silicon layer 712 is provided at least in a region where the conductive layer 718 and the silicon layer 712 overlap each other. It is needless to say that the insulating layer which is in contact with the side surface of the island-shaped silicon layer 712 may also be provided in the region where the conductive layer 718 and the silicon layer 712 overlap each other and the periphery thereof.

In the silicon layer 712, a channel formation region, and a pair of high-concentration impurity regions 722 which function as source and drain regions are formed. The channel formation region is formed in the silicon layer 712 in the region which almost agrees with the conductive layer 718, and is positioned between the pair of high-concentration impurity regions 722. Note that a low-concentration impurity region which functions as an LDD region may be formed between the channel formation region and each high-concentration impurity region 722.

Next, a manufacturing method of the semiconductor device shown in FIG. 10A is described. Specific description is made here with reference to cross-sectional diagrams along a dashed line O-P in FIG. 10A, and cross-sectional diagrams along a dashed line Q-R in FIG. 10A.

First, an SOI substrate 705 is prepared in which an insulating layer 702 and an island-shaped first silicon layer 706 are stacked in order over a support substrate 700 (see FIGS. 10B-1 and 10B-2). Next, a first insulating layer 708 is formed to cover the first silicon layer 706 (see FIGS. 10C-1 and 10C-2). Up to and including the formation of the first insulating layer 708, the description made on the SOI substrate 405 and the first insulating layer 408 in Embodiment Mode 3 can be referred to, and therefore, the description thereof is roughly made below.

As the SOI substrate 705, a known SOI substrate such as a SIMOX substrate or a bonded substrate can be used. A surface silicon layer of the SOI substrate 705 is selectively etched to form the island-shaped first silicon layer 706. The thickness of the first silicon layer 706 may be 10 nm to 150 nm, and preferably 30 nm to 100 nm. Further, the first silicon layer 706 may be formed such that the end portion has a perpendicular shape or a tapered shape. In this embodiment mode, the first silicon layer 706 is formed such that the end portion is tapered at a taper angle of 30° or more and less than 85° or may be gently tapered at a taper angle of 45° or more and less than 60°. By making the end portion of the first silicon layer 706 a tapered shape such that the corner portion becomes gentle, concentration of electric field at the corner portion can be relaxed. Note that the present invention is not particularly limited, and as described in the above embodiment mode, the end portion of the first silicon layer 706 may also be tapered at a taper angle of 45° or more and less than 95°, and more preferably at a taper angle of 60° or more and less than 95° which is almost perpendicular.

The first insulating layer 708 is formed of a material such as silicon oxide, silicon nitride, silicon oxynitride, silicon nitride oxide, SiOF, SiOC, DLC, porous silica, or the like by a CVD method or a sputtering method. Further, the first insulating layer 708 is formed to have a thickness enough to cover at least the end portion of the first silicon layer 706. The first insulating layer 708 is preferably formed to have a thickness of 1.5 to 3 times as large as that of the first silicon layer 706 thereunder. Note that the first insulating layer 708 is preferably formed of a material having the dielectric constant which is lower than that of an insulating layer 716 formed later over one surface of the silicon layer. The first insulating layer 708 forms a part of a gate insulating layer in a semiconductor device, and specifically, is a part of a gate insulating layer in the region which is in contact with the side surface of the silicon layer. By forming the first insulating layer 708 with the use of a low-dielectric constant material, concentration of electric field or static electricity at the end portion, in particular, the corner portion of the silicon layer can be relaxed. Consequently, a defect such as dielectric breakdown or electro-static discharge of the gate insulating layer and a leakage current due to such a defect can be prevented.

Next, the first insulating layer 708 and the first silicon layer 706 are entirely etched by anisotropic etching mainly in a perpendicular direction to form the second silicon layer 712 and the second insulating layer 710 which is in contact with the side surface of the second silicon layer 712 (see FIGS. 11A-1 and 11A-2).

The first insulating layer 708 and the first silicon layer 706 are etched by the etching condition in which the etching selection ratio therebetween is small or as small as possible (the etching selection ratio is near 1). That is, the first insulating layer 708 and the first silicon layer 706 are etched at almost the same etching rate. By thus doing, the perpendicular height from the bottom surface (the surface which is in contact with the insulating layer 702) can be almost the same in the second silicon layer 712 and the second insulating layer 710 formed by the etching.

The etching method of the first insulating layer 708 and the first silicon layer 706 is not particularly limited as long as anisotropic etching mainly in a perpendicular direction can be performed. For example, reactive ion etching of a parallel-plate type, a magnetron type, a dual-frequency type, an ECR type, a helicon type, an ICP type, or the like can be used.

As an etching gas, a gas which can provide an etching selection ratio which is as small as possible between the first insulating layer 708 and the first silicon layer 706, that is, a gas which can provide an etching selection ratio of near 1 is preferably selected. For example, by adding an $O_2$ gas into a fluorine-based gas such as $CHF_3$, $CF_4$, $C_4F_8$, $C_2F_6$, $NF_3$, or the like as needed, the etching selection ratio therebetween can be reduced. Further, an inert gas such as He or Ar may be added as needed. Further, as an etching gas, an HBr gas or a mixed gas of HBr and $Cl_2$ may also be used instead of a fluorine-based gas. Also in the case of using an HBr gas, an inert gas such as He or Ar may be added as needed.

Note that the first insulating layer 708 and the first silicon layer 706 are etched to be thin films such that the thickness of the second silicon layer 712 after being etched is 0.2 to 0.8 times, and preferably about 0.4 to 0.6 times as large as that of the first silicon layer 706. Further, the second silicon layer 712 is formed such that the end portion is tapered at a taper angle of 30° or more and less than 85° or may be gently tapered at a taper angle of 45° or more and less than 60°. Note that the present invention is not particularly limited, and as described in the above embodiment mode, the end portion of the second silicon layer 712 may also be tapered at a taper angle of 45° or more and less than 95°, and more preferably at a taper angle of 60° or more and less than 95° which is almost perpendicular.

Next, the third insulating layer 716 is formed so as to cover the second silicon layer 712 and the second insulating layer 710 (see FIGS. 11B-1 and 11B-2).

The third insulating layer 716 is formed by a CVD method or a sputtering method, using silicon oxide, silicon nitride, silicon oxynitride, silicon nitride oxide, aluminum nitride, or the like. The third insulating layer 716 is formed to have a single layer structure or a stacked-layer structure of at least one of the above materials. Further, the third insulating layer 716 can also be formed by solid phase oxidation or solid phase nitridation with a high-density plasma treatment. For example, solid phase oxidation or solid phase nitridation of the second silicon layer 712 and the second insulating layer 710 is performed by a high-density plasma treatment to form the third insulating layer 716. The third insulating layer 716 is formed to have a thickness of 1 nm to 50 nm, preferably 1 nm to 20 nm, and more preferably 1 nm to 10 nm.

The second insulating layer 710 and the third insulating layer 716 formed as above function as a gate insulating layer. That is, the gate insulating layer of the present invention is formed of not a single body but a compound body including a plurality of insulating layers. By forming the second insulating layer 710 which is in contact with the side surface of the silicon layer and further forming the third insulating layer 716 over the one surface of the silicon layer, coverage with the gate insulating layer at the end portion of the silicon layer can be improved. Accordingly, short-circuiting between the silicon layer and the conductive layer which forms the gate electrode or electro-static discharge due to insufficient coverage with the gate insulating layer can be prevented.

Note that, as for the gate insulating layer formed of the second insulating layer 710 and the third insulating layer 716, the thickness in the region which is in contact with the side surface of the second silicon layer 712 is preferably larger than that over the one surface of the second silicon layer 712. For example, provided that a perpendicular distance between the one surface of the second silicon layer 712 and the top surface of the gate insulating layer is a thickness t1, and a perpendicular distance between the side surface of the second silicon layer 712 and the top surface of the gate insulating layer is a thickness t2, it is preferable for the gate insulating layer to satisfy t1<t2. Note that the thickness of the gate insulating layer in the region which is in contact with the side surface of the second silicon layer 712 is not necessarily a constant value. In this case, the minimum value of the thickness t2 is preferably equal to or larger than the thickness t1. By thus doing, the end portion of the silicon layer can be covered with the gate insulating layer enough. Preferably, by increasing the thickness of the gate insulating layer in the region which is in contact with the side surface of the second silicon layer 712, an electric field applied to the end portion of the second silicon layer 712 can be relaxed, and occurrence of a leakage current, or the like can be prevented.

Further, as for the gate insulating layer formed of the second insulating layer 710 and the third insulating layer 716, the dielectric constant in the region which is in contact with the side surface of the second silicon layer 712 is preferably lower than that in the region over the one surface of the second silicon layer 712. For example, by decreasing the dielectric constant of the second insulating layer 710 as compared to that of the third insulating layer 716, the dielectric constant of the gate insulating layer in the region which is in contact with the side surface of the second silicon layer 712 can be low. Preferably, a low-dielectric constant material in which the dielectric constant is 4 or less is used for forming the second insulating layer 710. In the gate insulating layer, by decreasing the dielectric constant in the region which is in contact with the side surface of the silicon layer as compared to that over the one surface of the silicon layer, the gate insulating layer can be prevented from receiving a locally excessive stress such as an electric field, which is preferable.

Next, the conductive layer 718 which functions as a gate electrode is formed over the second silicon layer 712 with the third insulating layer 716 interposed therebetween. Then, an impurity element which imparts one conductivity type is added into the second silicon layer 712 with the conductive layer 718 as a mask, whereby the channel formation region 720 and the high-concentration impurity regions 722 which function as source and drain regions are formed (see FIGS. 11C-1 and 11C-2).

The conductive layer 718 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer which functions as a gate electrode can be formed of at least one of the above materials to have either a single layer structure or a stacked-layer structure. The conductive layer is formed to have a thickness of 100 nm to 1000 nm, preferably 200 nm to 800 nm, and more preferably 300 nm to 500 nm. Further, the conductive layer which functions as a gate electrode can be processed into a desired shape by selective etching after being formed over the entire surface by a CVD method or a sputtering method using any of the above-described materials.

As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Through the above, a thin film transistor 730 to which the present invention is applied can be formed.

Note that after the impurity element which imparts one conductivity type is added into the second silicon layer 712, a thermal treatment may be performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 550° C. Further, the thermal treatment is preferably performed in a nitrogen atmosphere. For example, activation can be performed by heating at 550° C. for 4 hours. Further, when the second silicon layer 712 includes an amorphous region, recrystallization of the silicon layer can also be performed together with the activation of the impurity element by performing thermal treatment.

Note that the structure of the TFT described in this embodiment mode is just an example, and the present invention is not limited to the structure shown. For example, a multi-gate structure, which includes a silicon layer including two or more channel formation regions connected in series and two or more gate electrode layers by which an electric field is applied to the channel formation regions, may be employed. Further, an LDD region may be formed in the silicon layer of the TFT.

Further, the side surface of the conductive layer which functions as a gate electrode may be tapered. The conductive layer which functions as a gate electrode may employ a stacked-layer structure and the taper angle may be different in the layers. Further, an insulating layer which is called a sidewall may also be formed so as to be in contact with the side surface of the conductive layer.

In a thin film transistor manufactured by applying the present invention, defects due to an end portion of a silicon layer can be reduced. In particular, since coverage with the gate insulating layer at the end portion of the silicon layer can be improved, short-circuiting between the silicon layer and the conductive layer which forms a gate electrode, electro-static discharge of an element, or the like can be prevented. Further, since concentration of electric field at the end portion of the silicon layer can be relaxed, insufficient insulation such as dielectric breakdown or electro-static discharge of the gate insulating layer can be reduced. Therefore, a highly reliable semiconductor device can be manufactured. Further, high-yield manufacturing of semiconductor devices can also be realized.

Further, by applying the present invention, as well as the above-described defect due to the end portion of the silicon layer can be reduced, thinning of the silicon layer can also be realized.

This embodiment mode can be combined with any other embodiment mode in this specification as appropriate.

Embodiment Mode 5

In this embodiment mode, an example of manufacturing a semiconductor device by a manufacturing method which is different from those in the above embodiment modes is described with reference to FIGS. 13A, 13B-1 and 13B-2, 13C-1 and 13C-2, 14A-1 and 14A-2, 14B-1 and 14B-2, 14C-1 and 14C-2, 15A-1 and 15A-2, and 15B-1 and 15B-2.

Figure 13A:
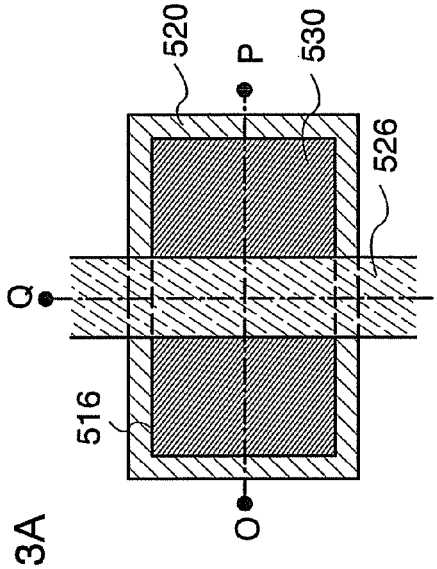

FIG. 13A is a top diagram for describing a main structure of a semiconductor device of the present invention. Note that a thin film and the like are partially omitted in FIG. 13A.

In a semiconductor device shown in FIG. 13A, a thin film transistor is formed using an SOI substrate. A surface silicon layer of the SOI substrate is formed into an island shape, and a conductive layer 526 which forms a gate electrode is provided so as to get across an island-shaped silicon layer 516. Further, an insulating layer 520 is provided so as to be in contact with the side surface of the island-shaped silicon layer 516. Although the example in which the insulating layer 520 is provided around the island-shaped silicon layer 516 is shown here, the present invention is not limited thereto as long as the insulating layer which is in contact with the side surface of the island-shaped silicon layer 516 is provided at least in a region where the conductive layer 526 and the silicon layer 516 overlap each other. It is needless to say that the insulating layer which is in contact with the side surface of the island-shaped silicon layer 516 may also be provided in the region where the conductive layer 526 and the silicon layer 516 overlap each other and the periphery thereof.

In the silicon layer 516, a channel formation region 528, and a pair of high-concentration impurity regions 530 which function as source and drain regions are formed. The channel formation region 528 is formed in the silicon layer 516 in the region which almost agrees with the conductive layer 526, and is positioned between the pair of high-concentration impurity regions 530. Further, a low-concentration impurity region may be formed between the channel formation region and each high-concentration impurity region 530.

Next, a manufacturing method of the semiconductor device shown in FIG. 13A is described. Specific description is made here with reference to cross-sectional diagrams along a dashed line O-P in FIG. 13A, and cross-sectional diagrams along a dashed line Q-R in FIG. 13A.

Figures 1, 13B:
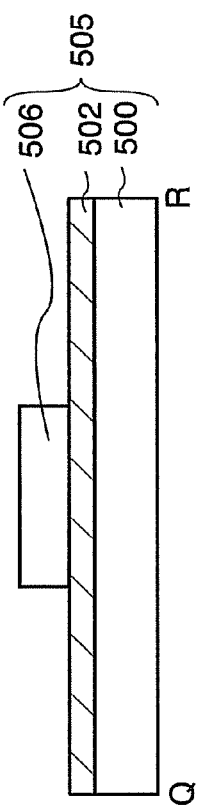
Figures 2, 13B:
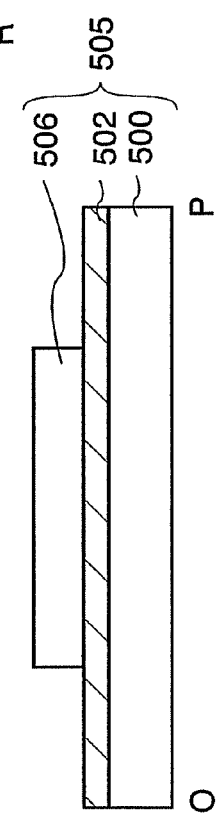

First, an SOI substrate 505 is prepared in which an insulating layer 502 and an island-shaped first silicon layer 506 are stacked in order over a support substrate 500 (see FIGS. 13B-1 and 13B-2). Note that the description made on the SOI substrate 105 and the island-shaped silicon layer 106 in Embodiment Mode 1 can be referred to the SOI substrate 505 including the island-shaped silicon layer, and therefore, the description thereof is roughly made below.

As the SOI substrate 505, a known SOI substrate such as a SIMOX substrate or a bonded substrate can be used. A surface silicon layer of the SOI substrate 505 is selectively etched to form the island-shaped first silicon layer 506. The thickness of the first silicon layer 506 may be 10 nm to 150 nm, and preferably 40 nm to 80 nm. In this embodiment mode, the first silicon layer 506 is a single crystalline silicon layer with a thickness of 50 nm.

Further, the silicon layer 506 may be formed such that the end portion has a perpendicular shape or a tapered shape. In this embodiment mode, the first silicon layer 506 is formed such that the end portion is tapered at a taper angle of 45° or more and less than 95°, and more preferably at a taper angle of 60° or more and less than 95° which is almost perpendicular. By making the tapered shape of the end portion of the first silicon layer 506 steep, a parasitic channel of a semiconductor device can be reduced. Note that the present invention is not particularly limited, and the end portion of the first silicon layer 506 may be tapered at a taper angle of 30° or more and less than 85° or may be gently tapered at a taper angle of 45° or more and less than 60°.

Figures 1, 13C:
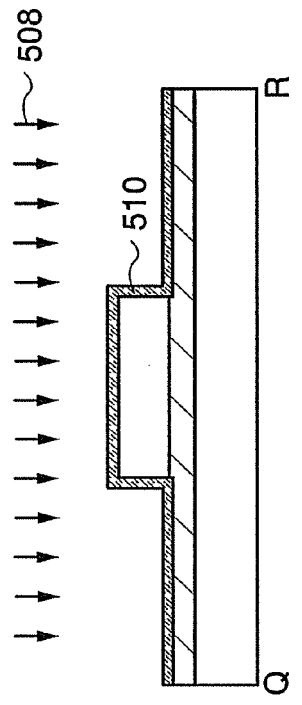
Figures 2, 13C:
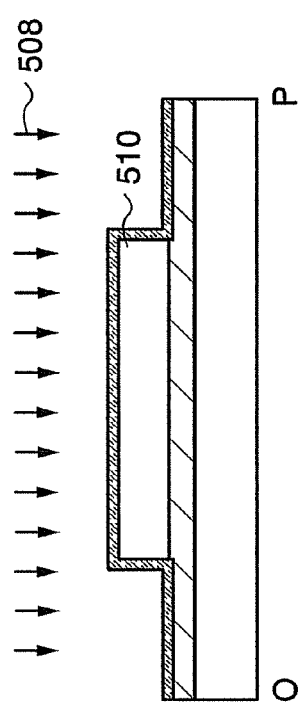

Next, surfaces of the first silicon layer 506 and the insulating layer 502 are nitrided by a high-density plasma treatment to form a first insulating layer 510 (see FIGS. 13C-1 and 13C-2). In the plasma treatment performed here, plasma 508 which is excited by high-frequency waves such as microwaves (typically, 2.45 GHz) and has an electron density of $1 \times 10^{11}$ cm$^{-3}$ and more and $1 \times 10^{13}$ cm$^{-3}$ or less and electron temperatures of 0.5 eV or more and 1.5 eV or less is preferably used. Further, in order to perform solid phase nitridation treatment, the plasma treatment is performed in an atmosphere containing nitrogen. An atmosphere containing nitrogen is, for example, an atmosphere containing nitrogen and a rare gas, or an atmosphere containing NH$_3$ and a rare gas. As the rare gas, Ar or a mixture of Ar and Kr is preferably used. Specifically, the high-density plasma treatment described in Embodiment Mode 1 is preferably used. By forming the first insulating layer 510 with a high-density plasma treatment, an insulating layer which is denser than that formed with a CVD method or a sputtering method can be formed. Furthermore, by forming the first insulating layer 510 with a high-density plasma treatment, a bird's beak, which becomes a problem when thermal oxidation is performed at 800° C. to 1100° C., is not formed, so that an insulating layer which is as good as that obtained by thermal oxidation can be obtained.

The first insulating layer 510 partially functions as a gate insulating layer of a thin film transistor. Therefore, by forming a dense insulating layer, the withstand voltage can be improved. In particular, part of the first insulating layer 510 forms a gate insulating layer which is in contact with the side surface of the end portion of the silicon layer where a defect tends to occur, and therefore, a highly reliable semiconductor device can be manufactured. The first insulating layer 510 is formed to have a thickness of 1 to 10 nm, and preferably 1 to 5 nm. In this embodiment mode, as the first insulating layer 510, a silicon nitride layer is formed on a surface of the first silicon layer 506 or on surfaces of the first silicon layer 506 and the insulating layer 502.

Figures 1, 14A:
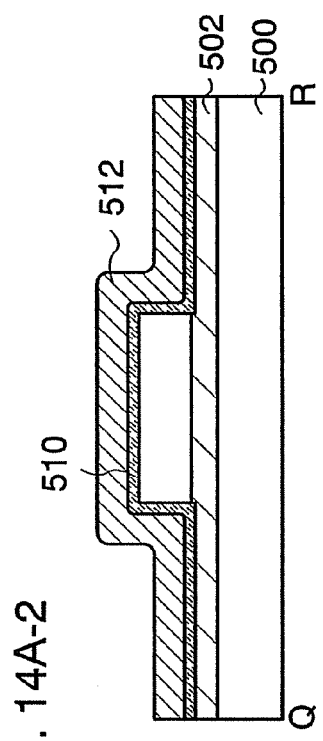
Figures 2, 14A:
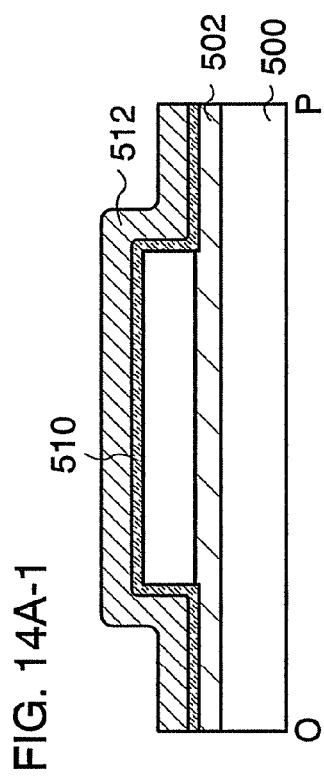

Next, a second insulating layer 512 is formed over the first insulating layer 510 (see FIGS. 14A-1 and 14A-2). The second insulating layer 512 is formed of a material such as silicon oxide, silicon nitride, silicon oxynitride, silicon nitride oxide, SiOF, SiOC, DLC, porous silica, or the like by a CVD method or a sputtering method. The second insulating layer 512 is formed to have a thickness enough to cover the first insulating layer 510 which covers the end portion of the first silicon layer 506. The second insulating layer 512 is preferably formed to have a thickness of 1.5 to 3 times as large as that of the first silicon layer 506 and the first insulating layer 510. In this embodiment mode, as the second insulating layer 512, a silicon oxynitride layer is formed to have a thickness of 150 nm.

Note that it is preferable that the second insulating layer 512 be formed of a material having the dielectric constant which is lower than that of an insulating layer 522 formed later over one surface of the silicon layer. The second insulating layer 512 forms a part of a gate insulating layer, that is, a gate insulating layer in the periphery of the end portion of the silicon layer, in a semiconductor device. Therefore, by forming the second insulating layer 512 which forms a gate insulating layer in the periphery of the end portion of the silicon layer, with the use of a low-dielectric constant material as compared to the gate insulating layer formed over the one surface of the silicon layer, concentration of electric field or static electricity at the end portion, in particular, the corner portion of the silicon layer can be relaxed, and insufficient insulation with a gate insulating layer can be reduced, which is preferable.

Figures 1, 14B:
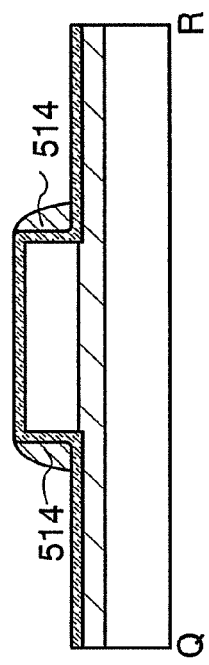
Figures 2, 14B:
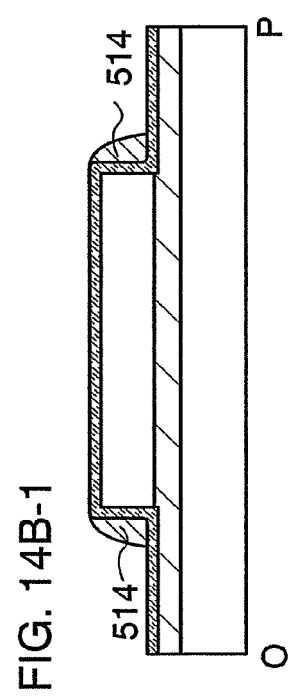

Next, the second insulating layer 512 is selectively etched by anisotropic etching mainly in a perpendicular direction to form a third insulating layer 514 which is positioned on side surface side of the first silicon layer 506 is formed with the first insulating layer 510 interposed therebetween (see FIGS. 14B-1 and 14B-2).

The third insulating layer 514 is formed by etching the second insulating layer 512 selectively by anisotropic dry-etching mainly in a perpendicular direction. The etching progresses from the second insulating layer 512 formed over the one surface of the first silicon layer 506 with the first insulating layer 510 interposed therebetween and over one surface of the insulating layer 502 with the first insulating layer 510 interposed therebetween. Thus, by stopping etching when the first insulating layer 510 formed over the one surface of the first silicon layer 506 is exposed, the second insulating layer 512 is left in a region on the side surface side of the first silicon layer 506, whereby the third insulating layer 514 is formed. Note that by making the end portion of the first silicon layer 506 an almost perpendicular shape, the third insulating layer 514 can be formed only in the region near the side surface of the first silicon layer 506.

The shape of the third insulating layer 514 can be controlled by selecting the material for forming the thin film, the etching condition, or the like as appropriate. The etching method for forming the third insulating layer 514 is not particularly limited as long as anisotropic etching mainly in a perpendicular direction can be performed. For example, reactive ion etching of a parallel-plate type, a magnetron type, a dual-frequency type, an ECR type, a helicon type, an ICP type, or the like can be used. As an etching gas, a gas which can provide an etching selection ratio at least between the second insulating layer 512 and the first silicon layer 506 may be selected. For example, a fluorine-based gas such as $CHF_3$, $CF_4$, $C_4F_8$, $C_2F_6$, $NF_3$, or the like can be used. Further, an inert gas such as He, Ar, or Xe, an $O_2$ gas, or an $H_2$ gas may be added as needed. In this embodiment mode, etching of the second insulating layer 512 is performed by ICP reactive ion etching using a $CHF_3$ gas and a He gas as an etching gas.

Figures 1, 14C:
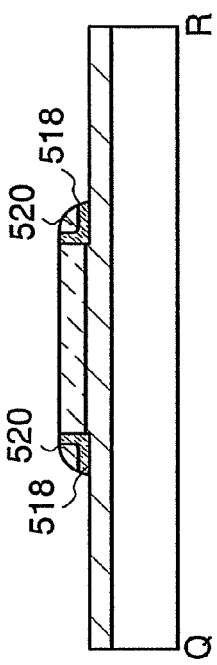
Figures 2, 14C:
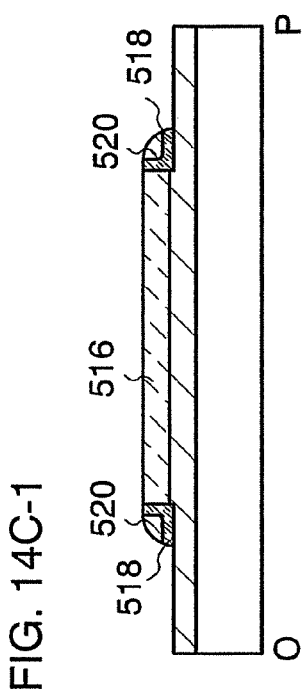

Next, the first insulating layer 510, the third insulating layer 514, and the first silicon layer 506 are entirely etched by anisotropic etching mainly in a perpendicular direction to be thin films, whereby a fourth insulating layer 518, the fifth insulating layer 520, and the second silicon layer 516 are formed, respectively (see FIGS. 14C-1 and 14C-2).

The first insulating layer 510, the third insulating layer 514, and the first silicon layer 506 are etched by the etching condition in which the etching selection ratio therebetween is small, or as small as possible (the etching selection ratio is near 1). That is, the first insulating layer 510, the third insulating layer 514, and the first silicon layer 506 are etched at almost the same etching rate. By thus doing, the perpendicular height can be almost the same in the fourth insulating layer 518, the fifth insulating layer 520, and the second silicon layer 516 after being etched. Preferably, the etching is performed such that the second silicon layer 516 has a thickness of 30 nm to 100 nm. Further, the second silicon layer 516 may be formed such that the taper angle of the end portion is preferably 45° or more and less than 95°, and more preferably 60° or more and less than 95° which is almost perpendicular. In this embodiment mode, the first silicon layer 506 with a thickness of 50 nm is etched to form the second silicon layer 516 with a thickness of 25 nm. At this time, the second silicon layer 516 is formed such that the end portion becomes almost perpendicular.

The etching method of the first insulating layer 510, the third insulating layer 514, and the first silicon layer 506 is not particularly limited as long as anisotropic etching mainly in a perpendicular direction can be performed. For example, reactive ion etching of a parallel-plate type, a magnetron type, a dual-frequency type, an ECR type, a helicon type, an ICP type, or the like can be used.

As an etching gas, a gas which can provide an etching selection ratio which is as small as possible among the first insulating layer 510, the third insulating layer 514, and the first silicon layer 506, that is, a gas which can provide an etching selection ratio of near 1 is preferably selected. For example, by adding an $O_2$ gas into a fluorine-based gas such as $CHF_3$, $CF_4$, $C_4F_8$, $C_2F_6$, $NF_3$, or the like as needed, the etching selection ratio among them can be reduced. Further, an inert gas such as He, Ar, or Xe may be added as needed. Further, as an etching gas, an HBr gas or a mixed gas of HBr and $Cl_2$ may also be used instead of a fluorine-based gas. Also in the case of using an HBr gas, an inert gas such as He or Ar may be added as needed.

Note that the fifth insulating layer 520 is formed here such that the surface thereof on the side which is not in contact with the fourth insulating layer 518 is curved convexly with respect to the side surface of the second silicon layer 516. It is needless to say that the present invention is not limited particularly thereto, and the fifth insulating layer 520 may have a shape having a corner instead of a rounded shape. Preferably, the corner portion of the second insulating layer 310 is made a gentle shape so that the coverage with a layer formed thereover (here, the sixth insulating layer 522) can be improved.

Figures 1, 15A:
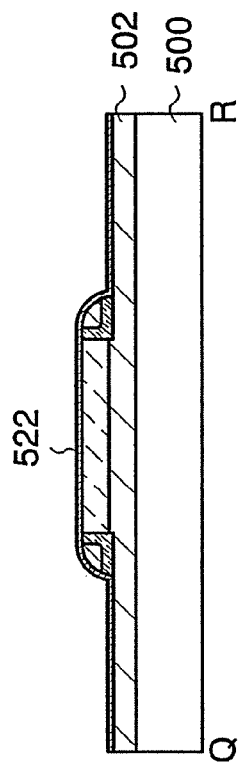
Figures 1, 15B:
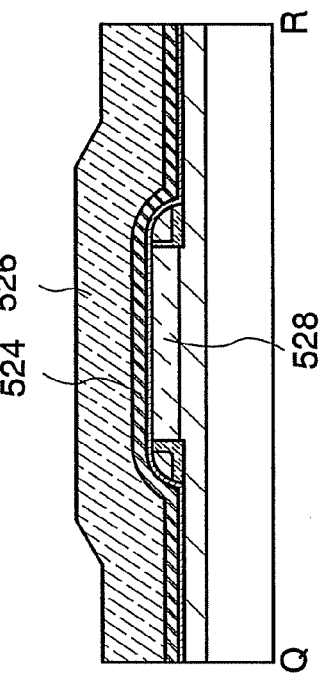
Figures 2, 15A:
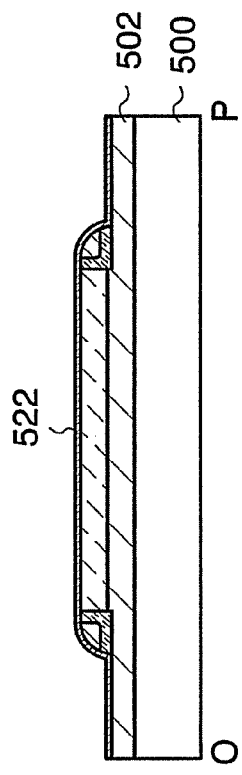
Figures 2, 15B:
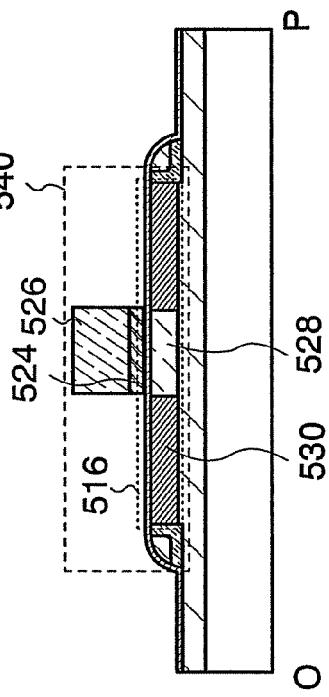

Next, the sixth insulating layer 522 is formed over the second silicon layer 516 (see FIGS. 15A-1 and 15A-2).

The sixth insulating layer 522 is formed by a CVD method or a sputtering method, using silicon oxide, silicon nitride, silicon oxynitride, silicon nitride oxide, aluminum nitride, or the like. The sixth insulating layer 522 is formed to have a single layer structure or a stacked-layer structure of at least one of the above materials. Further, the sixth insulating layer 522 can also be formed by solid phase oxidation or solid phase nitridation with a high-density plasma treatment. For example, surfaces of the second silicon layer 516, the fourth insulating layer 518, and the fifth insulating layer 520 are oxidized or nitrided by a high-density plasma treatment to form the sixth insulating layer 522. The sixth insulating layer 522 is formed to have a thickness of 1 nm to 15 nm, and preferably 1 nm to 10 nm over one surface of the second silicon layer 516. Note that the sixth insulating layer 522 is formed at least over the one surface of the second silicon layer 516, and may be further formed over the fifth insulating layer 520 and the fourth insulating layer 518. In this embodiment mode, a silicon oxynitride layer is formed with a thickness of 10 nm as the sixth insulating layer 522.

The sixth insulating layer 522, the fifth insulating layer 520, and the fourth insulating layer 518 formed as above function as a gate insulating layer. That is, the gate insulating layer of the present invention is formed of not a single body but a compound body including a plurality of insulating layers. By forming the fourth insulating layer 518 and the fifth insulating layer 520 to be in contact with the side surface of the silicon layer and further forming the sixth insulating layer 522 over the one surface of the silicon layer, coverage with the gate insulating layer at the end portion of the silicon layer can be improved. Further, even in the case where the insulating layer under the end portion of the silicon layer and in the periphery thereof (the insulating layer over the support substrate) is removed by etching or washing using fluorinated acid or the like at the time of processing the silicon layer into an island shape, the silicon layer can be sufficiently covered. Accordingly, short-circuiting between the silicon layer and the conductive layer which forms a gate electrode, occurrence of a leakage current, electro-static discharge, or the like due to insufficient coverage with the gate insulating layer at the end portion of the silicon layer can be prevented. Furthermore, by forming a dense insulating layer with the use of the high-density plasma treatment so as to be in contact with the end portion of the silicon layer, properties of the gate insulating layer can be improved.

Note that, as for the gate insulating layer formed of the sixth insulating layer 522, the fifth insulating layer 520, and the fourth insulating layer 518, the thickness in the region which is in contact with the side surface of the second silicon layer 516 is preferably larger than that over the one surface of the second silicon layer 516. For example, provided that a perpendicular distance between the one surface of the second silicon layer 516 and the top surface of the gate insulating layer is a thickness t1, and a perpendicular distance between the side surface of the second silicon layer 516 and the top surface of the gate insulating layer is a thickness t2, it is preferable for the gate insulating layer to satisfy t1<t2. Note that the thickness of the gate insulating layer in the region which is in contact with the side surface of the second silicon layer 516 is not necessarily a constant value. In this case, the minimum value of the thickness t2 is preferably equal to or larger than the thickness t1. By thus covering the end portion of the second silicon layer 516 with the gate insulating layer enough, and preferably, by increasing the thickness of the gate insulating layer in the region which is in contact with the side surface of the second silicon layer 516, an electric field applied to the end portion of the second silicon layer 516 can be relaxed, and occurrence of a leakage current, or the like can be prevented.

Next, a stack of a conductive layer 524 and a conductive layer 526, which functions as a gate electrode is formed over the second silicon layer 516 with the sixth insulating layer 522 interposed therebetween. Then, an impurity element which imparts one conductivity type is added into the second silicon layer 516 with the conductive layers 524 and 526 as a mask, whereby the channel formation region 528, the high-concentration impurity regions 530 which function as source and drain regions are formed (see FIGS. 15B-1 and 15B-2).

Each of the conductive layers 524 and 526 can be formed of a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used. The conductive layer which functions as a gate electrode can be formed of at least one of the above materials to have either a single layer structure or a stacked-layer structure. The conductive layer is formed to have a thickness of 100 nm to 1000 nm, preferably 200 nm to 800 nm, and more preferably 300 nm to 500 nm. Further, the conductive layer which functions as a gate electrode can be processed into a desired shape by selective etching after being formed over the entire surface by a CVD method or a sputtering method using any of the above-described materials. In this embodiment mode, a tantalum nitride layer and a tungsten nitride layer are stacked in order with thicknesses of 30 nm and 370 nm as the conductive layers 524 and 526, respectively.

As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used.

Through the above, a thin film transistor 540 to which the present invention is applied can be formed.

Note that after the impurity element which imparts one conductivity type is added into the second silicon layer 516, a thermal treatment may be performed to activate the impurity element added. The thermal treatment can be performed by laser beam irradiation, RTA, or using an annealing furnace. Specifically, the thermal treatment may be performed at temperatures of 400° C. to 700° C., and preferably 500° C. to 550° C. Further, the thermal treatment is preferably performed in a nitrogen atmosphere. For example, activation can be performed by heating at 550° C. for 4 hours. Further, when the second silicon layer 516 includes an amorphous region, recrystallization of the silicon layer can also be performed together with the activation of the impurity element by performing thermal treatment.

Note that the structure of the TFT described in this embodiment mode is just an example, and the present invention is not limited to the structure shown. For example, a multi-gate structure, which includes a silicon layer including two or more channel formation regions connected in series and two or more gate electrode layers by which an electric field is applied to the channel formation regions, may be employed. Further, an LDD region may be formed in the silicon layer of the TFT.

Further, the side surface of the conductive layer which functions as a gate electrode may be tapered. The conductive layer which functions as a gate electrode may employ a stacked-layer structure and the taper angle may be different in the layers. Further, an insulating layer which is also called a sidewall may also be formed so as to be in contact with the side surface of the conductive layer.

In a thin film transistor manufactured by applying the present invention, defects due to an end portion of a silicon layer can be reduced. In particular, insufficient coverage with the gate insulating layer at the end portion of the silicon layer can be prevented, and short-circuiting between the silicon layer and the conductive layer which forms a gate electrode can be prevented. Further, concentration of electric field at the end portion of the silicon layer can be relaxed. Therefore, since a leakage current, electro-static discharge, or the like can be prevented or reduced, a highly reliable semiconductor device can be manufactured. Further, high-yield manufacturing of semiconductor devices can also be realized.

Further, as described in this embodiment mode, by forming a dense insulating layer to be in contact with the side surface of a silicon layer, a highly reliable semiconductor device in which the withstand voltage is high at the end portion of the silicon layer can be manufactured.

This embodiment mode can be combined with any other embodiment mode in this specification as appropriate.

Embodiment Mode 6

In this embodiment mode, an example of a semiconductor device which is different from those in the above embodiment modes and a manufacturing method thereof is described with reference to FIGS. 19A to 19C, 20A to 20D, 21A to 21D, 22A to 22C, 23A to 23D, 24A to 24C, and 25A to 25C. Specifically, an example of a semiconductor device provided with thin film transistors having different conductive types is described.

Figure 19A:
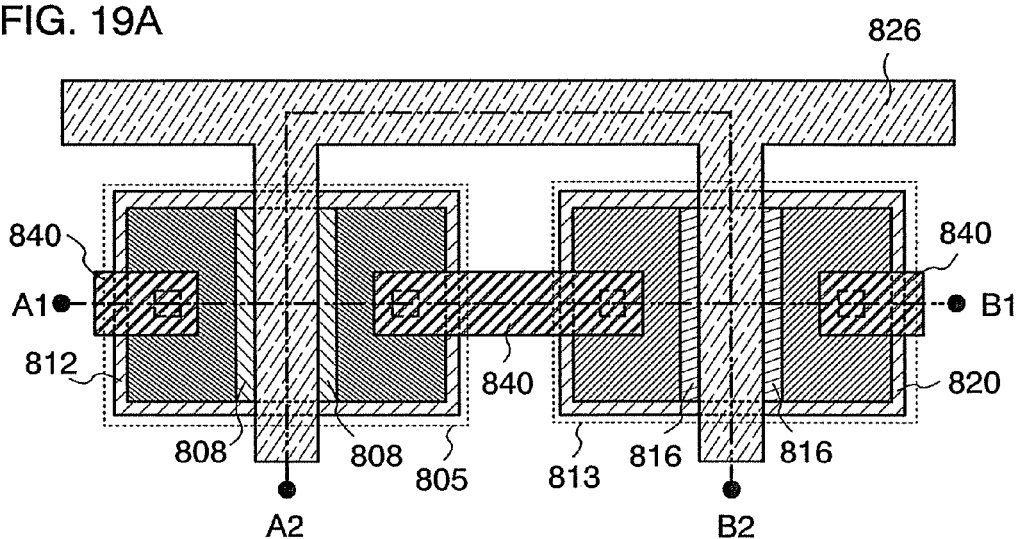
FIGS. 19A to 19C are diagrams showing an example of a main structure of a semiconductor device of the present invention.
Figure 19B:
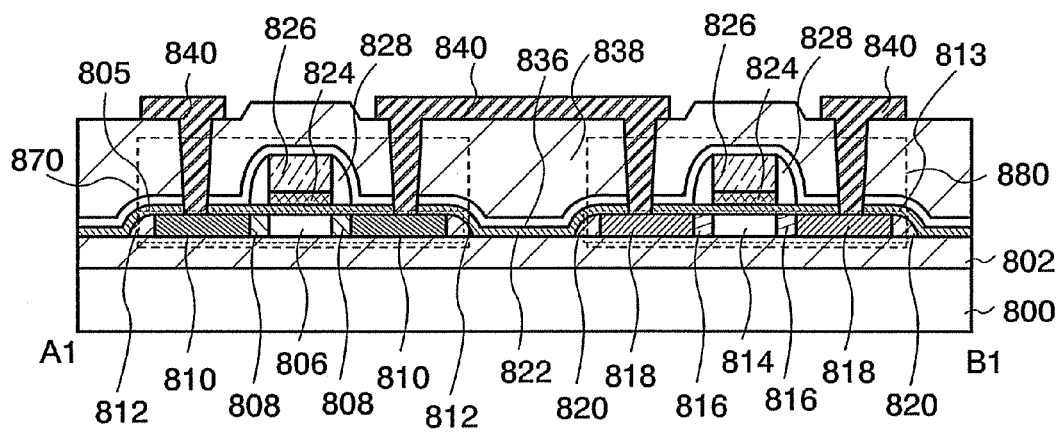
Figure 19C:
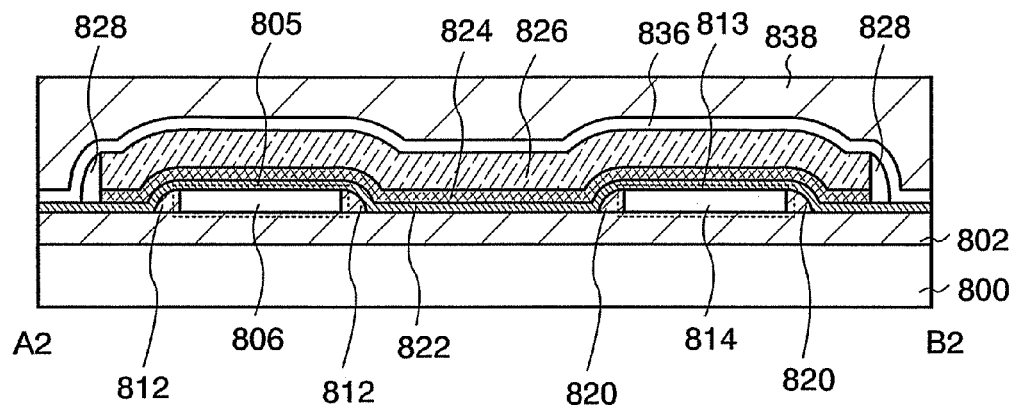

FIGS. 19A to 19C are a top diagram and cross-sectional diagrams of a semiconductor device of this embodiment mode. FIG. 19A is a top diagram of the semiconductor device, FIG. 19B is a cross-sectional diagram along a dashed line A1-B1 in FIG. 19A, and FIG. 19C is a cross-sectional diagram along a dashed line A2-B2 in FIG. 19A. Note that in FIG. 19A, a thin film and the like included in the semiconductor device are partially omitted.

The semiconductor device shown in FIGS. 19A to 19C is formed using an SOI substrate, and includes silicon layers 805 and 813 which are provided into an island shape over a support substrate 800 with an insulating layer 802 interposed therebetween, conductive layers 824 and 826 which form a gate electrode which are provided over the silicon layers 805 and 813 with an insulating layer 822 interposed therebetween, and a conductive layer 840 which forms a source or drain electrode which is provided over the conductive layer 826 with insulating layers 836 and 838 interposed therebetween (see FIGS. 19A to 19C).

A gate electrode is formed of a stacked-layer structure of the conductive layers 824 and 826. The conductive layers 824 and 826 are provided so as to get across the island-shaped silicon layers 805 and 813. Further, an insulating layer 828 is provided to be in contact with each side surface of the conductive layers 824 and 826. The insulating layer 828 is also called a sidewall. Although the example in which the gate electrode is formed of the two-layer stacked structure of the conductive layers 824 and 826 is described here, the present invention is not particularly limited; the gate electrode may employ a single layer structure or a stacked-layer structure including three or more layers. The side surface of the conductive layer formed as a gate electrode may be tapered. Further, the gate electrode may employ a stacked-layer structure including two or more conductive layers, and the taper angle may be different in the layers. Further, any structure of the gate electrode described in Embodiment Modes 1 to 5 may be employed.

The island-shaped silicon layers 805 and 813 are formed using a surface silicon layer of an SOI substrate 804. The island-shaped silicon layer 805 includes a channel formation region 806, a pair of low-concentration impurity regions 808 which function as LDD regions, and a pair of high-concentration impurity regions 810 which function as source and drain regions. The channel formation region 806 is formed in the silicon layer 805 in the region which overlaps with the conductive layers 824 and 826 with the insulating layer 822 interposed therebetween. Each low-concentration impurity region 808 is formed in the silicon layer 805 in the region which overlaps with the insulating layer 828 with the insulating layer 822 interposed therebetween. Each high-concentration impurity region 810 is formed in the silicon layer 805 in the region which does not overlap with the conductive layers 824 and 826 and the insulating layer 828 with the insulating layer 822 interposed therebetween. The channel formation region 806 is positioned between the pair of high-concentration impurity regions 810 and each low-concentration impurity region 808 is positioned between the channel formation region 806 and each high-concentration impurity region 810. That is, the channel formation region 806 is positioned between the pair of high-concentration impurity regions 810 and between the pair of low-concentration impurity regions 808, and formed so as to be in contact with the pair of low-concentration impurity regions 808. As compared to each low-concentration impurity region 808, the concentration of an impurity element which imparts one conductivity type added into each high-concentration impurity region 810 is high. Further, an insulating layer 812 is provided so as to be in contact with the side surface of the silicon layer 805.

Similarly, the island-shaped silicon layer 813 includes a channel formation region 814, low-concentration impurity regions 816 which function as LDD regions, and high-concentration impurity regions 818 which function as source and drain regions. The channel formation region 814 is formed in the silicon layer 813 in the region which overlaps with the conductive layers 824 and 826 with the insulating layer 822 interposed therebetween. Each low-concentration impurity region 816 is formed in the silicon layer 813 in the region which overlaps with the insulating layer 828 with the insulating layer 822 interposed therebetween. Each high-concentration impurity region 818 is formed in the silicon layer 813 in the region which does not overlap with the conductive layers 824 and 826 and the insulating layer 828 with the insulating layer 822 interposed therebetween. The channel formation region 814 is positioned between the pair of high-concentration impurity regions 818, and each low-concentration impurity region 816 is positioned between the channel formation region 814 and each high-concentration impurity region 818. That is, the channel formation region 814 is positioned between the pair of high-concentration impurity regions 818 and between the pair of low-concentration impurity regions 816, and formed so as to be in contact with the pair of low-concentration impurity regions 816. As compared to each low-concentration impurity region 816, the concentration of an impurity element which imparts one conductivity type added into each high-concentration impurity region 818 is high. Further, an insulating layer 820 is provided so as to be in contact with the side surface of the silicon layer 813.

In this embodiment mode, impurity elements which impart different conductivity types are added into the silicon layers 805 and 813. That is, into the low-concentration impurity regions 808 and the high-concentration impurity regions 810, an impurity element which imparts a conductivity type which is different from that of the low-concentration impurity regions 816 and the high-concentration impurity regions 818 is added.

The insulating layer 822 is provided between the silicon layers 805 and 813 and the conductive layers 824 and 826 which form a gate electrode. Further, the insulating layer 822 is also provided over the insulating layer 812 provided so as to be in contact with the side surface of the silicon layer 805 and over the insulating layer 820 provided so as to be in contact with the side surface of the silicon layer 813. The insulating layers 812, 820, and 822 function as a gate insulating layer.

The conductive layer 840 which forms a source or drain electrode is provided so as to be electrically connected to the high-concentration impurity regions 810 formed in the silicon layer 805 and the high-concentration impurity regions 818 formed in the silicon layer 813 through openings formed in the insulating layers 836 and 838. Further, as shown in FIGS. 19A to 19C, the high-concentration impurity regions 810 formed in the silicon layer 805 and the high-concentration impurity regions 818 which are formed in the silicon layer 813 and with the higher concentration having the conductivity type which is different from that of the high-concentration impurity regions 810 may be connected to each other so that a CMOS circuit is formed.

Next, an example of a manufacturing method of the semiconductor device shown in FIGS. 19A to 19C is described with reference to drawings.

Figure 20A:
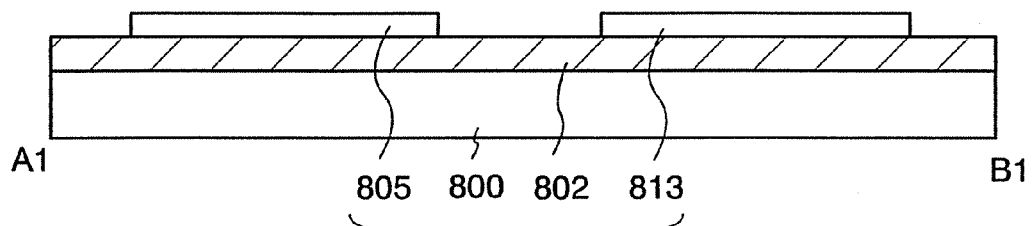
FIGS. 20A to 20D are diagrams showing an example of a manufacturing method of a semiconductor device of the present invention.
Figure 23A:
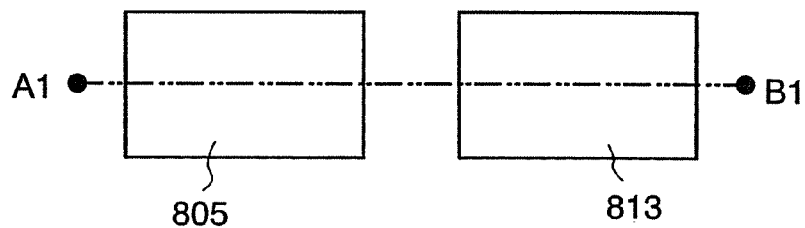
FIGS. 23A to 23D are diagrams showing an example of a manufacturing method of a semiconductor device of the present invention.
Figure 24A:
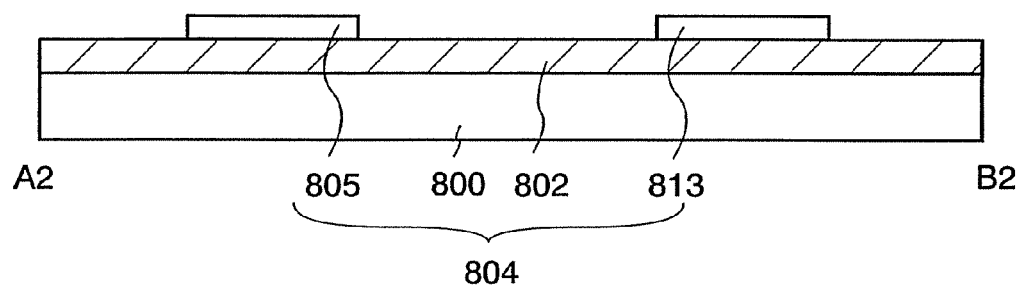
FIGS. 24A to 24C are diagrams showing an example of a manufacturing method of a semiconductor device of the present invention.

First, the SOI substrate 804 is prepared in which the island-shaped silicon layers 805 and 813 are formed over the support substrate 800 with the insulating layer 802 interposed therebetween (see FIGS. 20A, 23A, and 24A).

As the SOI substrate 804, a known SOI substrate such as a SIMOX substrate or a bonded substrate can be used. A surface silicon layer of the SOI substrate 804 is selectively etched, whereby the island-shaped silicon layers 805 and 813 which are separated can be formed. The thickness of each of the silicon layers 805 and 813 is 10 nm to 150 nm, and preferably 30 nm to 100 nm or 10 nm to 30 nm.

Note that each of the silicon layers 805 and 813 may be formed such that the end portion has a tapered shape or a perpendicular shape. The shape of the end portion of the silicon layer can be controlled by selecting the etching condition of isotropic etching, anisotropic etching, or the like as appropriate.

Figure 20B:
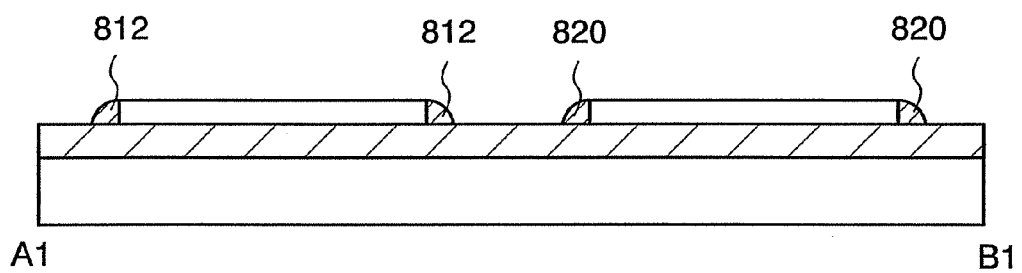
Figure 23B:
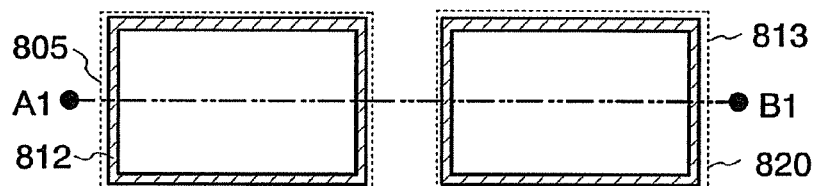
Figure 24B:
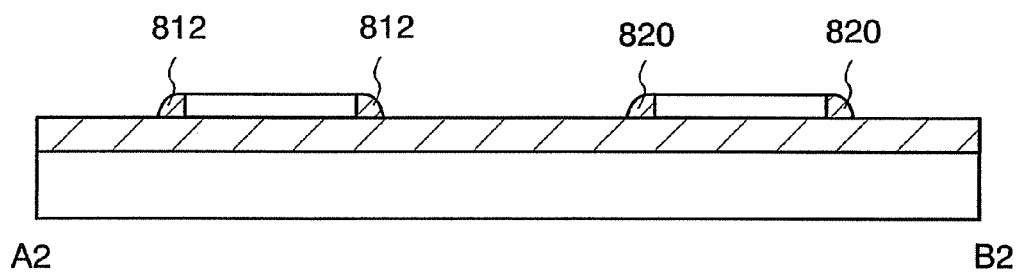

Next, the insulating layer 812 which is in contact with the side surface of the silicon layer 805 and the insulating layer 820 which is in contact with the side surface of the silicon layer 813 are formed (see FIGS. 20B, 23B, and 24B).

Each of the insulating layers 812 and 820 can be formed as follows: an insulating layer is formed so as to cover the island-shaped silicon layers 805 and 813, and the insulating layer is selectively etched by anisotropic etching mainly in a perpendicular direction, so that the insulating layer is left only in regions which overlap with the side surfaces of the silicon layers 805 and 813.

Specifically, an insulating layer is formed so as to cover the silicon layers 805 and 813, first. The insulating layer is formed of a material such as silicon oxide, silicon nitride, silicon oxynitride, silicon nitride oxide, SiOF, SiOC, DLC, porous silica, or the like by a CVD method or a sputtering method. Preferably, the insulating layer is formed of a layer having the dielectric constant which is lower than that of the insulating layer 822 formed later over one surfaces of the silicon layers 805 and 813. Further, the insulating layer which is formed so as to cover the silicon layers 805 and 813 is formed to have a thickness enough to cover at least the end portions of the silicon layers 805 and 813. The insulating layer is preferably formed to have a thickness of 1.5 to 3 times as large as that of each of the silicon layers 805 and 813.

Next, the insulating layer which is formed so as to cover the silicon layers 805 and 813 is selectively etched by anisotropic etching mainly in a perpendicular direction. The etching progresses from the insulating layer formed over the one surface of the silicon layer 805 and the one surface of the silicon layer 813. Note that the thickness of the insulating layer is almost the same over the one surface of the silicon layer 406, over the one surface of the silicon layer 813, and over the insulating layer 802. Thus, by stopping etching when the one surfaces of the silicon layers 805 and 813 are exposed, the insulating layer can be left selectively in regions which are in contact with the side surfaces of the silicon layers 805 and 813. The left insulating layers correspond to the insulating layers 812 and 820. Here, the insulating layers 812 and 820 are formed such that they are curved convexly with respect to the side surfaces of the silicon layers 805 and 813 which are in contact with them. It is needless to say that the present invention is not limited particularly thereto, and the insulating layers 812 and 820 may have a shape having a corner instead of a rounded shape. Preferably, the corner portion of each of the insulating layers 812 and 820 is made a gentle shape so that the coverage with a layer formed thereover (here, the insulating layer 822) can be improved.

Note that due to the etching for forming the insulating layers 812 and 820, the top-layer portions of the silicon layers 805 and 813 may be made amorphous. In this case, the amorphous regions of the silicon layers 805 and 813 may be selectively etched, or the silicon layers 805 and 813 may be recrystallized by performing thermal treatment with laser beam irradiation, RTA, or an annealing furnace. Alternatively, after the impurity regions are formed by adding the impurity elements which impart conductivity types into the silicon layers, recrystallization may be performed together with thermal treatment for activating the impurity regions. Specifically, any forming method of a silicon layer and an insulating layer which is in contact with the side surface of the silicon layer, described in Embodiment Modes 2 and 3 can be applied.

Further, the surface silicon layer of the SOI substrate may be set to be thicker than a silicon layer of a thin film transistor to be completed, and the surface silicon layer may be thinned by the later step. For example, the thickness of the surface silicon layer of the SOI substrate is controlled to be two or three times as large as that of the silicon layer of a thin film transistor to be completed, in advance. Then, the surface silicon layer is selectively etched to be processed into an island shape, and after that, an insulating layer is formed over the island-shaped silicon layer. The insulating layer and the silicon layer may be entirely etched by anisotropic etching mainly in a perpendicular direction with the etching condition in which the etching selection ratio therebetween is small or is as small as possible (the etching selection ratio is near 1) so that the silicon layer and the insulating layer which is in contact with the side surface of the silicon layer which are thinned films are formed. Specifically, any forming method of a silicon layer and an insulating layer which is in contact with the side surface of the silicon layer, described in Embodiment Modes 4 and 5 can be applied.

Further, as described in Embodiment Mode 5, a dense insulating layer (e.g., an insulating layer containing nitrogen such as a silicon nitride layer or a silicon nitride oxide layer) which is in contact with the side surface of the silicon layer may also be formed by using a high-density plasma treatment.

The silicon layer 805, the insulating layer 812 which is in contact with the side surface of the silicon layer 805, the silicon layer 813, and the insulating layer 820 which is in contact with the side surface of the silicon layer 813 may be formed by using any method described in Embodiment Modes 1 to 5. Here, the method described in Embodiment Mode 1 is used.

Further, in order to control the threshold voltage of the thin film transistor, an impurity element which imparts one conductivity type may be added into the silicon layers 805 and 813 at a low concentration, which results in that the impurity element is also added into the channel formation region of the thin film transistor. As the impurity element which imparts one conductivity type, an impurity element which imparts an n-type conductivity such as phosphorus (P) or arsenic (As) or an impurity element which imparts a p-type conductivity such as boron (B), aluminum (Al), or gallium (Ga) can be used. For example, boron can be used as the impurity element and added so as to be contained in the silicon layers 805 and 813 at concentrations of $5\times10^{15}$ cm$^{-3}$ to $5\times10^{17}$ cm$^{-3}$. Note that impurity elements may be added at different concentrations or impurity elements which impart different conductivity types may be added into the silicon layers 805 and 813.

Figure 20C:
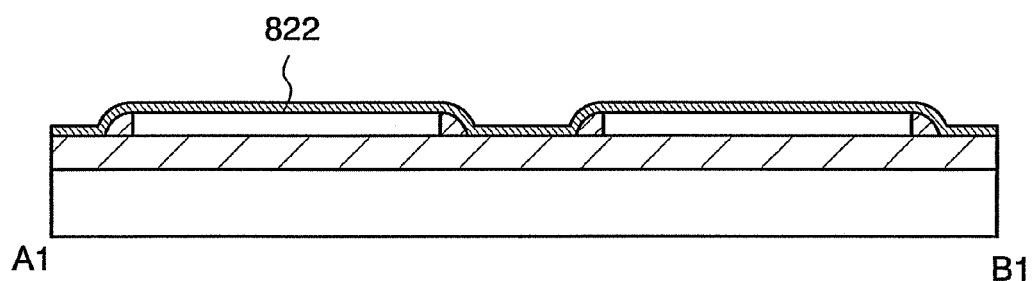
Figure 24C:
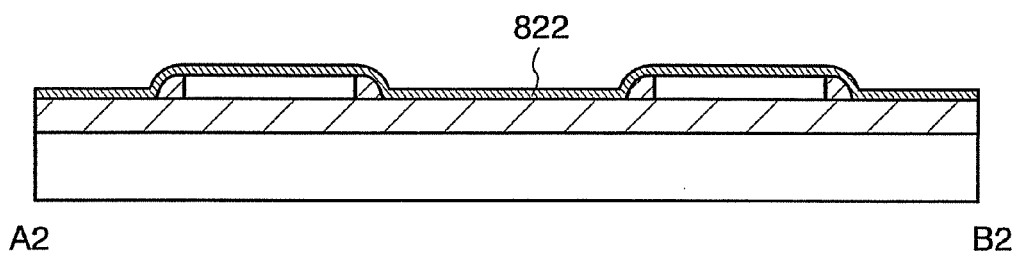

Next, the insulating layer 822 is formed over the silicon layer 805, the insulating layer 812 which is in contact with the side surface of the silicon layer 805, the silicon layer 813, and the insulating layer 820 which is in contact with the side surface of the silicon layer 813 (see FIGS. 20C and 24C).

The insulating layer 822 is formed by a CVD method or a sputtering method, using silicon oxide, silicon nitride, silicon oxynitride, silicon nitride oxide, aluminum nitride, or the like. The insulating layer 822 is preferably formed of a material of which dielectric constant is higher than that of the insulating layer 812 which is in contact with the side surface of the silicon layer 805 and the insulating layer 820 which is in contact with the side surface of the silicon layer 813. The insulating layer 822 is formed to have a single layer structure or a stacked-layer structure of at least one of the above materials. Further, the insulating layer 822 can also be formed by solid phase oxidation or solid phase nitridation of the silicon layers 805 and 813 with a high-density plasma treatment.

The insulating layers 812, 820, and 822 form a gate insulating layer. The insulating layer 822 is formed at least over the one surfaces of the silicon layers 805 and 813. In this embodiment mode, the insulating layer 822 is formed so as to cover the silicon layer 805, the insulating layer 812 which is in contact with the side surface of the silicon layer 805, the silicon layer 813, and the insulating layer 820 which is in contact with the side surface of the silicon layer 813. That is, the gate insulating layer of this embodiment mode is formed of not a single body but a compound body including a plurality of insulating layers. Note that each boundary in the plurality of insulating layers is not necessarily clear. By thus forming the insulating layer which is in contact with the side surface of the silicon layer, separately from the insulating layer formed over the one surface of the silicon layer, coverage with the gate insulating layer at the end portion of the silicon layer can be improved. Further, in the case where the silicon layer is made to be a thin film, a problem of unintended etching of an insulating layer under the silicon layer caused by a washing process using fluorinated acid or the like becomes remarkable; however, by forming the insulating layer which is in contact with the side surface of the silicon layer by applying the present invention, the silicon layer can be covered enough with the gate insulating layer. Consequently, short-circuiting between the silicon layer and the gate electrode layer, occurrence of a leakage current, electrostatic discharge, or the like due to insufficient coverage with the gate insulating layer at the end portion of the silicon layer can be prevented.

Note that, as for the gate insulating layer, the thickness in the region which is in contact with the side surface of the silicon layer is preferably larger than that over the one surface of the silicon layer. By thus covering the end portion of the silicon layer with the gate insulating layer enough, and preferably, by increasing the thickness of the gate insulating layer in the region which is in contact with the side surface of the silicon layer, an electric field applied to the end portion of the silicon layer can be relaxed, and occurrence of a leakage current, or the like can be prevented.

Further, as for the gate insulating layer, the dielectric constant in the region which is in contact with the side surface of the silicon layer is preferably lower than that in the region over the one surface of the silicon layer. By thus doing, an electric field at the end portion of the silicon layer can be relaxed and insufficient insulation of the gate insulating layer can be prevented.

Figure 20D:
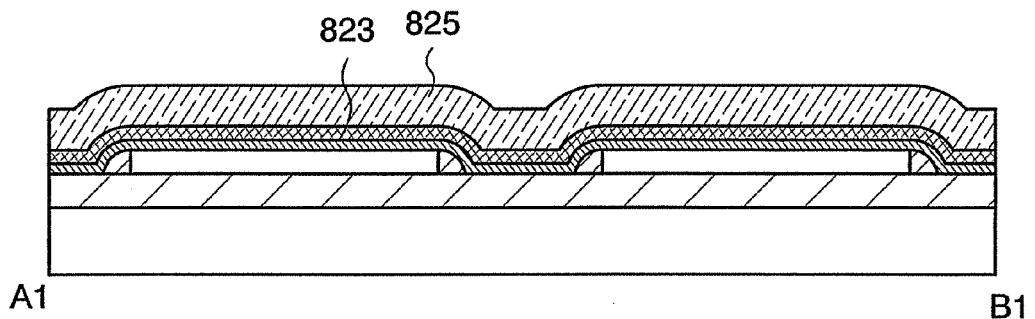
Figure 25A:
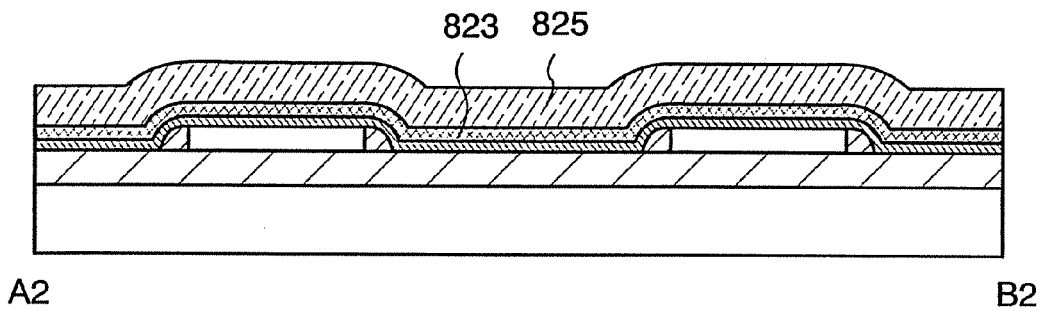
FIGS. 25A to 25C are diagrams showing an example of a manufacturing method of a semiconductor device of the present invention.

Next, conductive layers 823 and 825 are stacked in order over the insulating layer 822 (see FIGS. 20D and 25A).

Each of the conductive layers 823 and 825 can be formed by a CVD method or a sputtering method, using a metal element selected from tantalum (Ta), tungsten (W), titanium (Ti), molybdenum (Mo), chromium (Cr), aluminum (Al), copper (Cu), and niobium (Nb), or an alloy material or a compound material containing the above-described metal element. Further, a semiconductor material typified by polycrystalline silicon to which an impurity element which imparts one conductivity type, such as phosphorus is added can also be used.

Figure 21A:
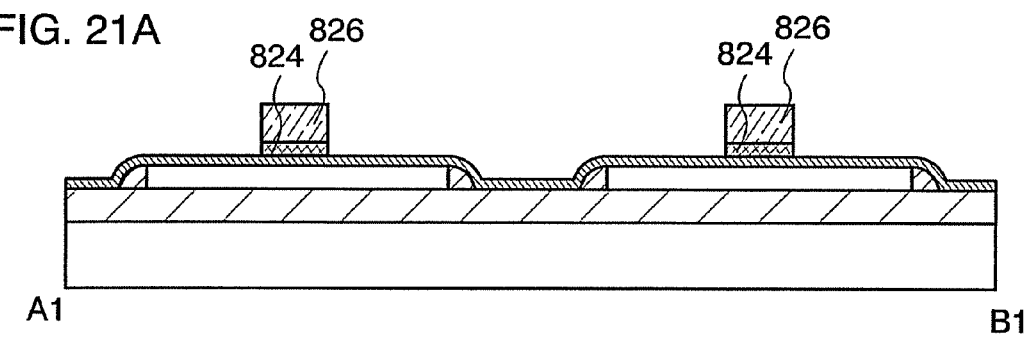
FIGS. 21A to 21D are diagrams showing an example of a manufacturing method of a semiconductor device of the present invention.
Figure 23C:
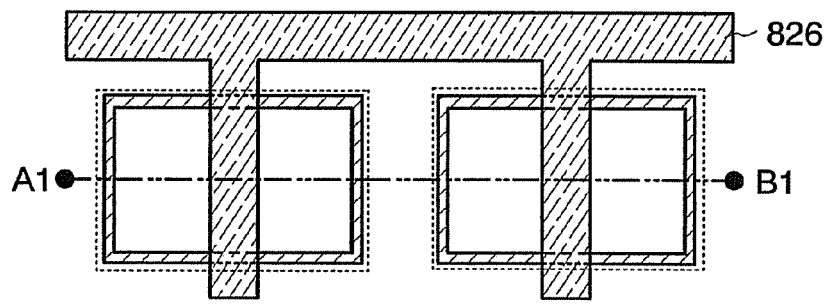

Next, the conductive layers 823 and 825 are selectively etched, whereby the conductive layers 824 and 826 which function as a gate electrode are formed (see FIGS. 21A and 23C).

In this embodiment mode, the conductive layers 823 and 825 are formed over an entire surface of the substrate and then selectively etched to be processed into a desired shape. Here, the etching process is performed such that each separated conductive layer gets across each of the island-shaped silicon layers 805 and 813. At this time, the conductive layers 823 and 825 are processed such that the separated conductive layers come together in the region which does not overlap with the island-shaped silicon layers 805 and 813. That is, two conductive layers branching from a continuous conductive layer are formed so as to get across the island-shaped silicon layers 805 and 813.

Figure 21B:
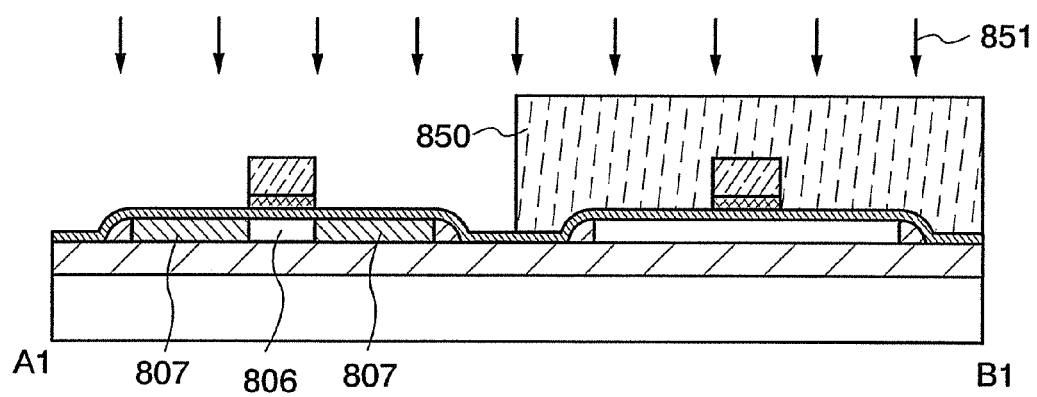

Next, a resist mask 850 is selectively formed so as to cover the silicon layer 813, and an impurity element 851 which imparts one conductivity type is added into the silicon layer 805 at a low concentration with the resist mask 850 and the conductive layers 824 and 826 as a mask, whereby impurity regions 807 are formed (see FIG. 21B). As the impurity element 851, an impurity element which imparts an n-type conductivity such as phosphorus (P) or arsenic (As) or an impurity element which imparts a p-type conductivity such as boron (B), aluminum (Al), or gallium (Ga) can be used. In this embodiment mode, phosphorus (P) is added as the impurity element 851. Note that the impurity regions 807 form part of low-concentration impurity regions which function as LDD regions. Further, the channel formation region 806 is formed in the silicon layer 805 under the conductive layers 824 and 826.

Figure 21C:
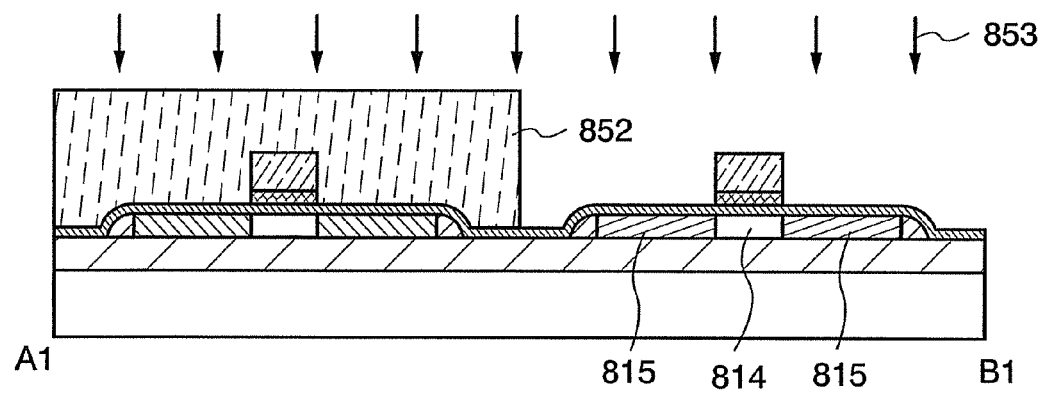

Next, a resist mask 852 is selectively formed so as to cover the silicon layer 805, and an impurity element 853 which imparts one conductivity type is added into the silicon layer 813 at a low concentration with the resist mask 852 and the conductive layers 824 and 826 as a mask, whereby impurity regions 815 are formed (see FIG. 21C). As the impurity element 853, an element which is similar to the impurity element 851 can be used. In this embodiment mode, an element which imparts a conductivity type which is different from that of the impurity element 851 is added; boron (B) is added. Note that the impurity regions 815 form part of low-concentration impurity regions which function as LDD regions. Further, the channel formation region 814 is formed in the silicon layer 813 under the conductive layers 824 and 826.

Figure 21D:
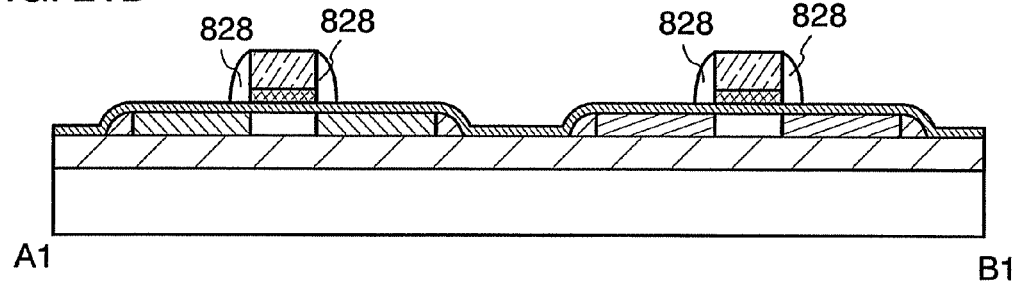
Figure 25B:
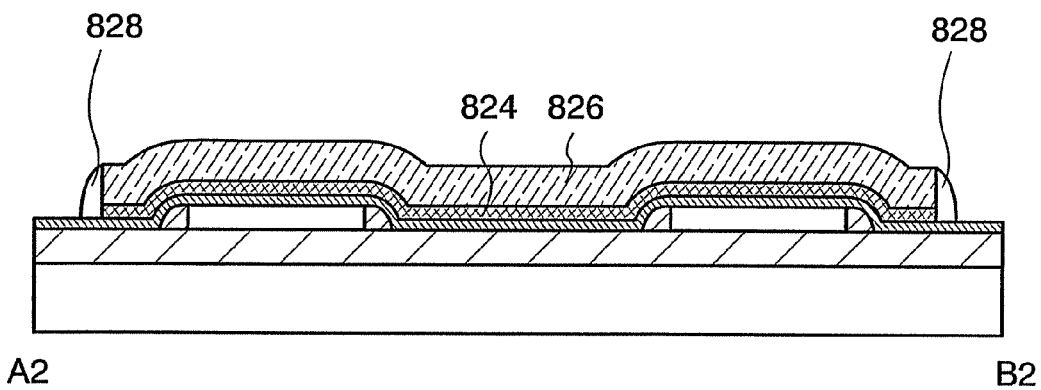

Next, the insulating layer 828 which is in contact with each side surface of the conductive layers 824 and 826 is formed (see FIGS. 21D and 25B). The insulating layer 828 which is in contact with each side surface of the conductive layers 824 and 826 is formed as follows; an insulating layer having a single layer structure or a stacked-layer structure is formed by a CVD method or a sputtering method using an inorganic material such as silicon oxide, silicon nitride, silicon oxynitride, or silicon nitride oxide, or an organic material such as an organic resin, and the insulating layer is selectively etched by anisotropic etching mainly in a perpendicular direction. The insulating layer 828 is also called a sidewall. Here, the surface of the insulating layer 828, on the side which is not in contact with the side surfaces of the conductive layers 824 and 826 is curved. Specifically, the insulating layer 828 is formed such that an appropriate curvature is provided to curve convexly with respect to the side surfaces of the conductive layers 824 and 826 which are in contact with the insulating layer 828. It is needless to say that the present invention is not limited particularly thereto, and the insulating layer 828 may have a shape having a corner instead of a rounded shape. Note that the insulating layer 828 can be also used as a doping mask for forming the low-concentration impurity regions which function as LDD regions.

Next, a resist mask 854 is selectively formed so as to cover the silicon layer 813. An impurity element 855 which imparts one conductivity type is added into the silicon layer 805 at a high concentration with the resist mask 854, the conductive layers 824 and 826, and the insulating layer 828 provided so as to be in contact with each side surface of the conductive layers 824 and 826, as a mask. As a result, the high-concentration impurity regions 810 which function as source and drain regions, the low-concentration impurity regions 808 which function as LDD regions, and the channel formation region 806 are formed in the silicon layer 805. As the impurity element 855, an element which is similar to the impurity element 851 can be used. Here, the element which imparts the same conductivity type as the impurity element 851, that is, phosphorus (P) is added as the impurity element 855. Note that the concentration of the impurity element 855 added into the silicon layer 805 is higher than that of the impurity element 851 added into the silicon layer 805.

Next, a resist mask 856 is selectively formed so as to cover the silicon layer 805. An impurity element 857 which imparts one conductivity type is added into the silicon layer 813 at a high concentration with the resist mask 856, the conductive layers 824 and 826, and the insulating layer 828 provided so as to be in contact with each side surface of the conductive layers 824 and 826, as a mask. As a result, the high-concentration impurity regions 818 which function as source and drain regions, the low-concentration impurity regions 816 which function as LDD regions, and the channel formation region 814 are formed in the silicon layer 813. As the impurity element 857, an element which is similar to the impurity element 851 can be used. Here, the element which imparts the same conductivity type as the impurity element 853, that is, boron (B) is added as the impurity element 857. Note that the concentration of the impurity element 857 added into the silicon layer 813 is higher than that of the impurity element 853 added into the silicon layer 813.

Through the above, the high-concentration impurity regions 810 which function as source and drain regions, the low-concentration impurity regions 808 which function as LDD regions, and the channel formation region 806 are formed in the silicon layer 805, and the high-concentration impurity regions 818 which function as source and drain regions, the low-concentration impurity regions 816 which function as LDD regions, and the channel formation region 814 are formed in the silicon layer 813. In this embodiment mode, the channel formation regions 806 and 814 can be formed in a self-aligned manner by using the conductive layers 824 and 826. Further, the low-concentration impurity regions 808 and 816 can be formed in a self-aligned manner by using the conductive layers 824 and 826 and the insulating layers 828 which are in contact with the side surfaces of the conductive layers 824 and 826.

Figure 22A:
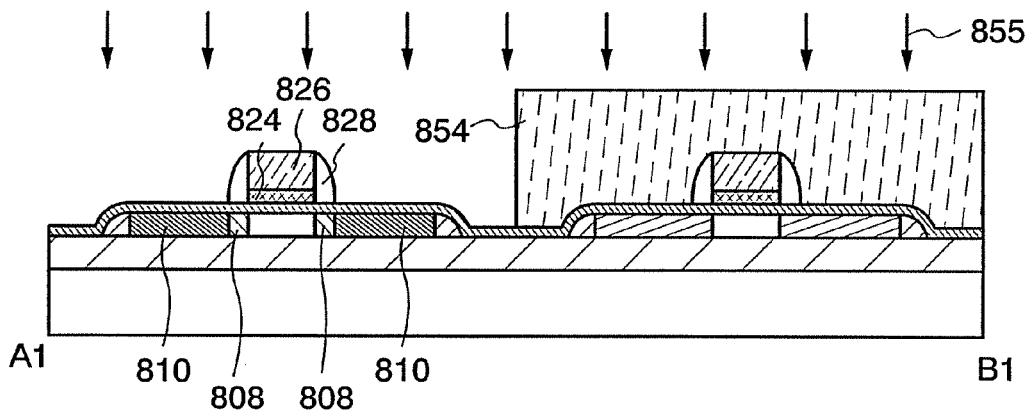
FIGS. 22A to 22C are diagrams showing an example of a manufacturing method of a semiconductor device of the present invention.
Figure 22B:
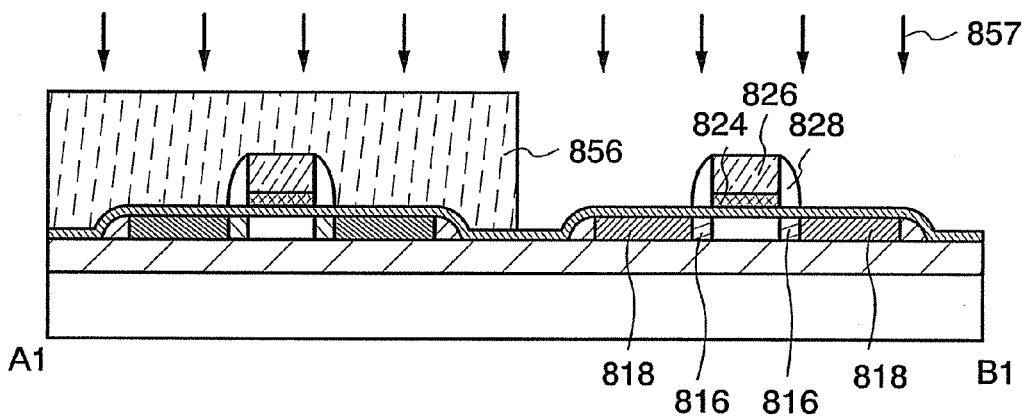
Figure 22C:
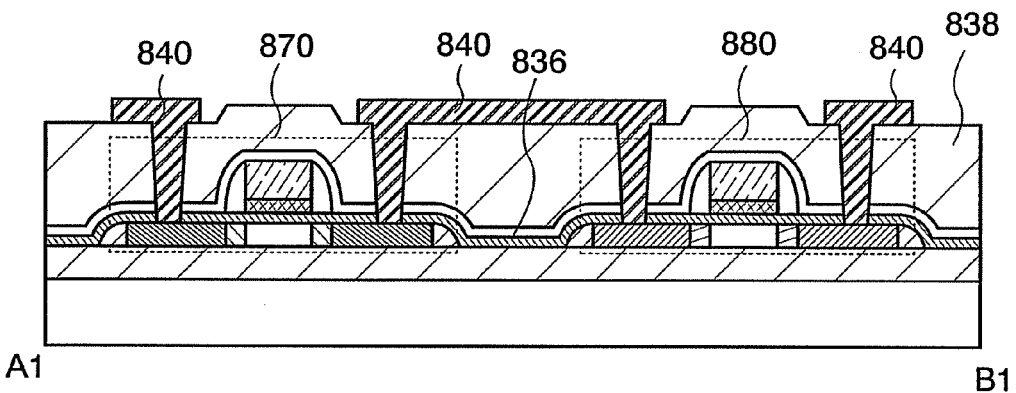
Figure 23D:
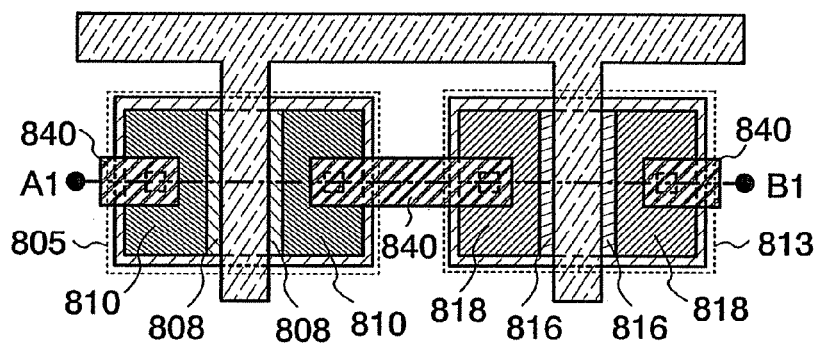
Figure 25C:
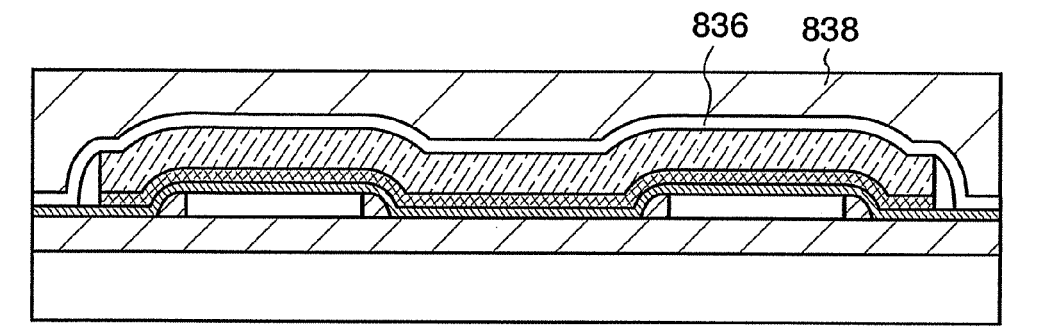

Next, the insulating layers 836 and 838 are formed so as to cover the insulating layer, the conductive layers, and the like provided over the support substrate 800, and the conductive layer 840 which is electrically connected to the high-concentration impurity regions 810 formed in the silicon layer 805 and the high-concentration impurity regions 818 formed in the silicon layer 813 is formed over the insulating layer 838 (see FIGS. 22C, 23D, and 25C). The conductive layer 840 functions as a source or drain electrode. Note that FIG. 25C shows a cross sectional view of a dashed line A2-B2 in FIG. 19A, and the conductive layer 840 is not shown in FIG. 25C since the dashed line A2-B2 does not pass through the conductive layer 840.

Each of the insulating layers 836 and 838 is formed by a CVD method, a sputtering method, a coating method, or the like, using an inorganic insulating material containing oxygen or nitrogen such as silicon oxide, silicon nitride, silicon oxynitride, silicon nitride oxide, or the like; an insulating material containing carbon such as DLC (Diamond-Like Carbon); an organic insulating material such as epoxy, polyimide, polyamide, polyvinyl phenol, benzocyclobutene, acrylic, or the like; or a siloxane material such as a siloxane resin. Note that the siloxane resin corresponds to a resin having Si—O—Si bonds. Siloxane includes a skeleton structure of a bond of silicon (Si) and oxygen (O). As a substituent, an organic group containing at least hydrogen (such as an alkyl group or an aryl group) is used. Alternatively, a fluoro group, or a fluoro group and an organic group containing at least hydrogen can be used as a substituent. Further, the insulating layers 836 and 838 may also be formed by forming an insulating layer with a CVD method or a sputtering method and then performing a high-density plasma treatment thereto in an oxygen atmosphere or a nitrogen atmosphere. Although a two-layer stacked structure of the insulating layers 836 and 838 is formed over the conductive layer 826 and the like here, the present invention may also employ a single layer structure or a stacked-layer structure including three or more layers.

The conductive layer 840 can be formed by a CVD method or a sputtering method, using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mg), neodymium (Nd), carbon (C), or silicon (Si), or an alloy material or a compound material containing the metal element, to have a single layer structure or a stacked-layer structure. As examples of an alloy material containing aluminum, an alloy material containing aluminum as a main component and nickel and an alloy material containing aluminum as a main component, nickel, and at least one of carbon and silicon can be given. The conductive layer 840 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin film formed of titanium, nitride of titanium, molybdenum, or nitride of molybdenum. Aluminum and aluminum silicon which have low resistance and are inexpensive are suitable for forming the conductive layer 840. Further, generation of a hillock of aluminum or aluminum silicon can be prevented when upper and lower barrier layers are provided.

Through the above, a semiconductor device including an N-channel transistor 870 formed using the silicon layer 805 and a P-channel transistor 880 formed using the silicon layer 813 can be manufactured. In this embodiment mode, the conductive layer 840 which is electrically connected to the high-concentration impurity regions 810 formed in the silicon layer 805 and the conductive layer 840 which is electrically connected to the high-concentration impurity regions 818 which are formed in the silicon layer 813 are electrically connected to each other so that a CMOS circuit including the N-channel transistor and the P-channel transistor is formed.

Note that although the example of manufacturing the CMOS circuit including two thin film transistors having different conductivity types is described in this embodiment mode, the present invention is not particularly limited. For example, an NMOS circuit including a plurality of N-channel thin film transistors, a PMOS circuit including a plurality of P-channel thin film transistors, or the like can also be manufactured. For forming such an NMOS circuit, a PMOS circuit, or the like, an impurity element to be added into a silicon layer may be selected as appropriate.

In a semiconductor device manufactured by applying the present invention, defects due to shape, characteristics, or the like of an end portion of a silicon layer can be prevented or reduced. Therefore, a highly reliable semiconductor device can be manufactured. Further, high-yield manufacturing of semiconductor devices can also be realized.

This embodiment mode can be combined with any other embodiment mode in this specification as appropriate.

Embodiment Mode 7

The semiconductor device according to the present invention can be applied to an integrated circuit such as a CPU (Central Processing Unit). In this embodiment mode, an example of a CPU to which the semiconductor device shown in FIGS. 19A to 19C is described below with reference to a drawing.

Figure 27:
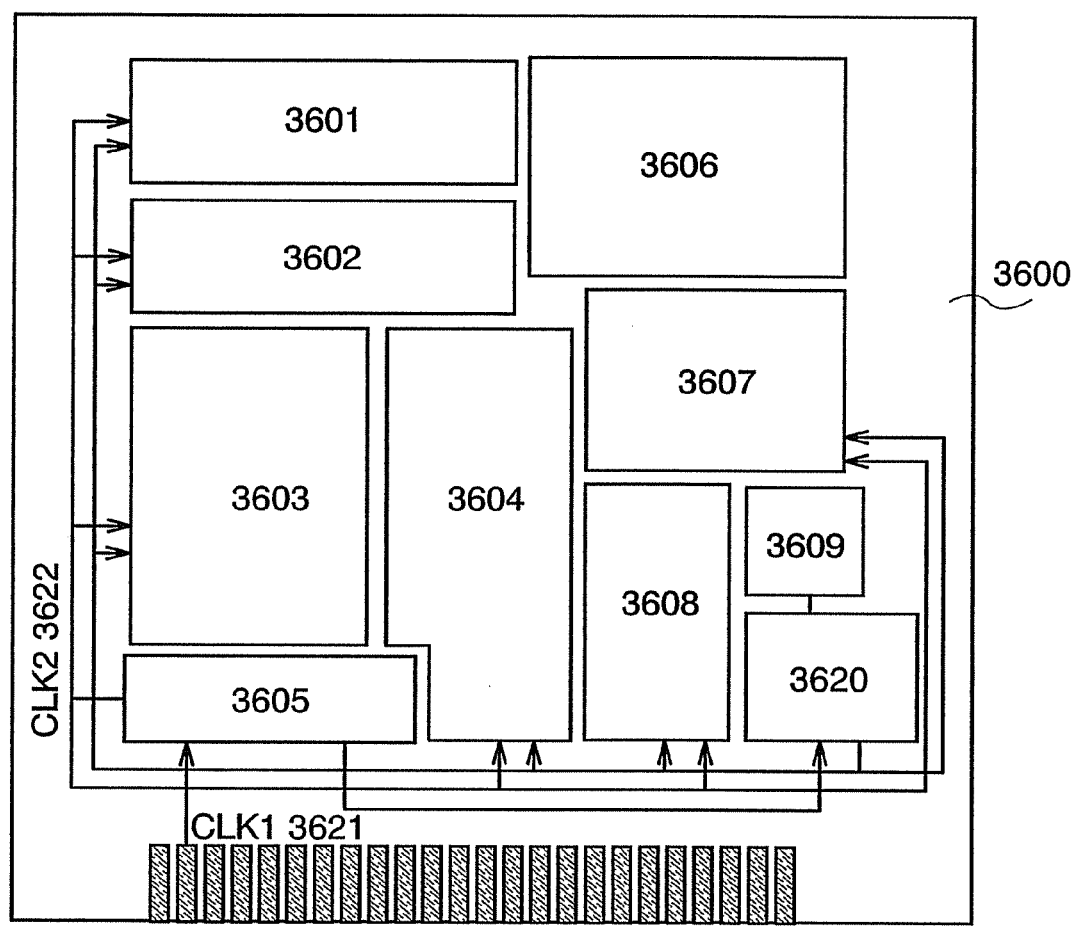
FIG. 27 is a block diagram showing one example of a semiconductor device of the present invention.
Figure 28A:
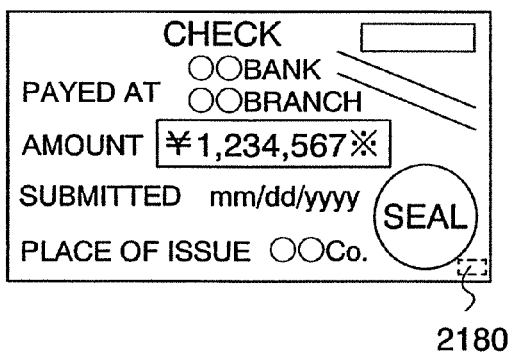
FIGS. 28A to 28H are diagrams showing examples of usage pattern of a semiconductor device of the present invention.
Figure 28B:
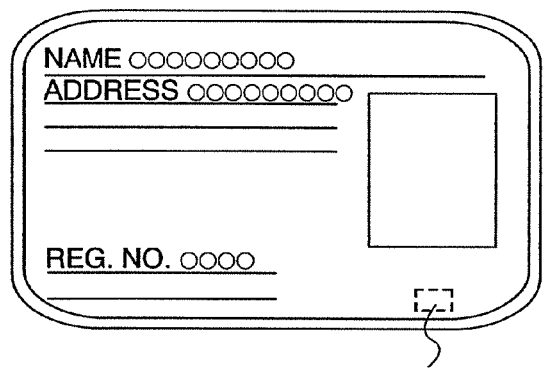
Figure 28C:
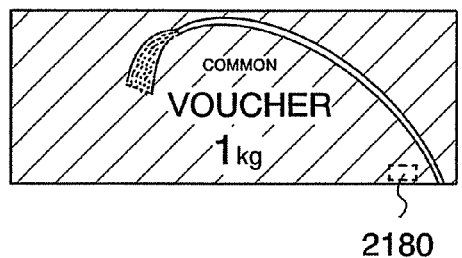
Figure 28D:
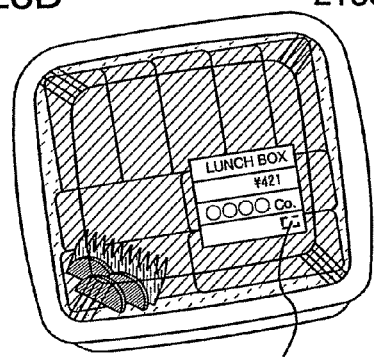
Figure 28E:
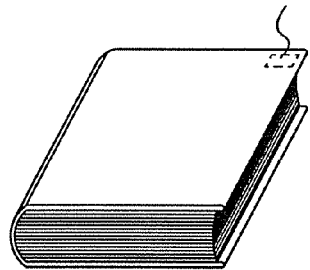
Figure 28F:
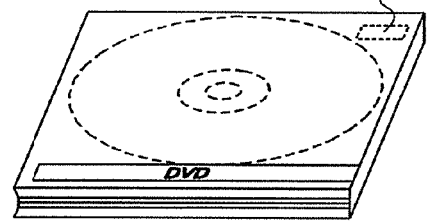
Figure 28G:
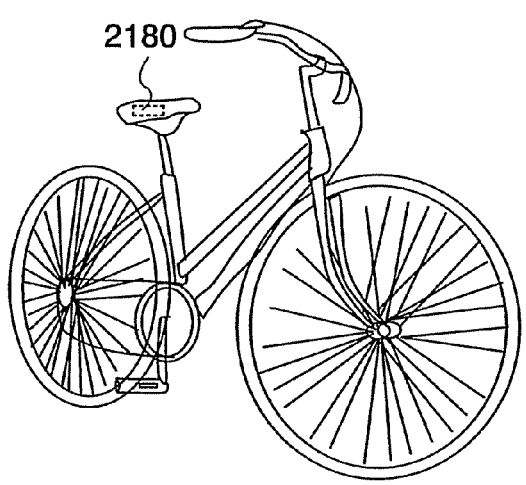
Figure 28H:
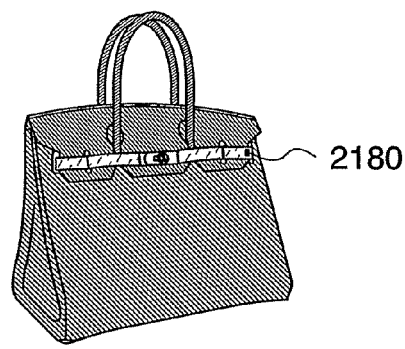

A CPU 3660 shown in FIG. 27 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, an erasable programmable ROM 3609, and a ROM interface (ROM I/F) 3620, over a substrate 3600. The ROM 3609 and the ROM interface 3620 may also be provided over a different chip. Such various circuits for forming the CPU 3660 can be formed by using the thin film transistor formed using an SOI substrate by any manufacturing method described in Embodiment Modes 1 to 6, a CMOS circuit, an NMOS circuit, a PMOS circuit, or the like formed by combining the thin film transistors.

Note that the CPU 3660 shown in FIG. 27 is only an example where the structure is simplified, and an actual CPU may have various structures depending on the uses. Therefore, the structure of the CPU to which the present invention is applied is not limited to FIG. 27.

An instruction inputted to the CPU 3660 through the bus interface 3608 is inputted to the instruction decoder 3603 and decoded therein, and then, inputted to the ALU controller 3602, the interrupt controller 3604, the register controller 3607, and the timing controller 3605.

The ALU controller 3602, the interrupt controller 3604, the register controller 3607, and the timing controller 3605 perform various controls based on the decoded instruction. Specifically, the ALU controller 3602 generates a signal for controlling the drive of the ALU 3601. While the CPU 3660 is executing a program, the interrupt controller 3604 judges an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates a signal for controlling a timing of drive of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the clock signal CLK2 to the above various circuits.

Note that although the example in which the semiconductor device according to the present invention is applied to a CPU is described in this embodiment mode, the present invention is not particularly limited. For example, by applying the present invention, the following can also be manufactured; a camera such as a digital camera, an audio reproducing device such as a car audio system, a laptop computer, a game machine, a portable information terminal (e.g., a cellular phone or a mobile game machine), an image reproducing device provided with a recording medium such as a home-use game machine, and the like.

In the semiconductor device according to the present invention which is formed using an SOI substrate, the parasitic capacitance can be reduced as compared to the case of being formed using a bulk single crystal silicon substrate, and speeding up and low power consumption can be achieved. This is because a buried oxide film layer is formed under a surface silicon layer in which a channel formation region and source and drain regions are formed, in the SOI substrate. Further, in the semiconductor device to which the present invention is applied, a defect due to shape, characteristics, or the like of an end portion of a silicon layer can be prevented, and occurrence of a leakage current can be prevented. Further, even in the case where the silicon layer is made to be a thin film, a defect due to characteristics of the end portion of the silicon layer can be prevented. Therefore, when the semiconductor device according to the present invention is applied to a CPU or the like, low power consumption and speeding up can be realized. In addition, high-yield manufacturing of highly reliable semiconductor devices can be realized.

Embodiment Mode 8

In this embodiment mode, one example of a usage mode of the semiconductor device described in the above embodiment modes is described. Specifically, an application example of a semiconductor device to/from which data can be inputted/outputted noncontactly is described with reference to drawings. The semiconductor device to/from which data can be inputted/outputted noncontactly is also called an RFID tag, an ID tag, an IC tag, an IC chip, an RF tag, a wireless tag, an electronic tag, or a wireless chip.

One example of an upper-surface structure of a semiconductor device described in this embodiment mode is described with reference to FIG. 29A. A semiconductor device 2180 shown in FIGS. 29A to 29C includes a thin film integrated circuit 2131 including a plurality of elements such as thin film transistors for forming a memory portion and a logic portion, and a conductive layer 2132 which functions as an antenna. The conductive layer 2132 which functions as an antenna is electrically connected to the thin film integrated circuit 2131. The thin film transistor according to the present invention described in Embodiment Modes 1 to 6 can be applied to the thin film integrated circuit 2131.

Figure 29A:
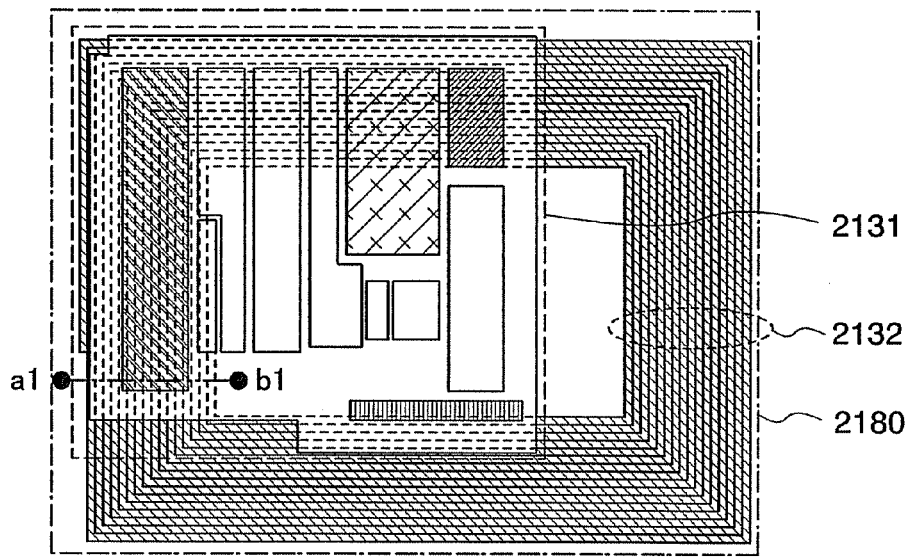
FIG. 29A is a top diagram and FIGS. 29B and 29C are cross-sectional diagrams, each showing one example of a semiconductor device of the present invention.
Figure 29B:
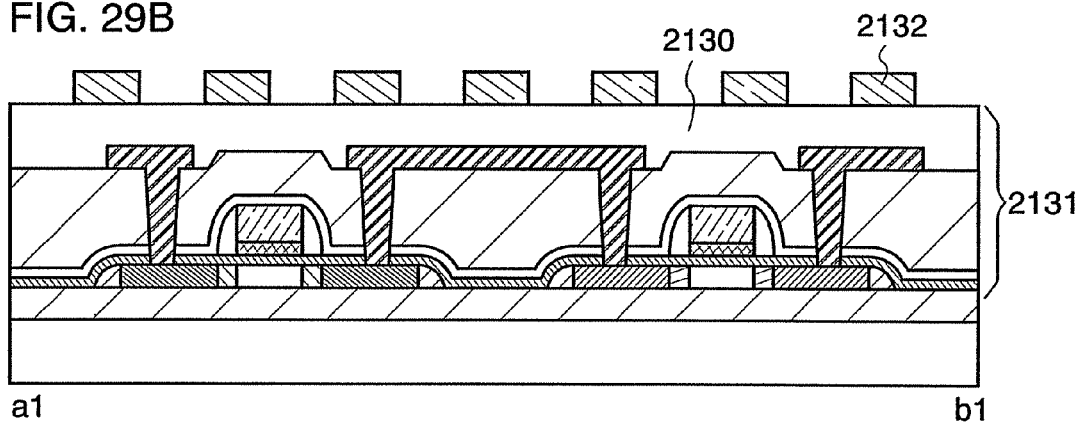
Figure 29C:
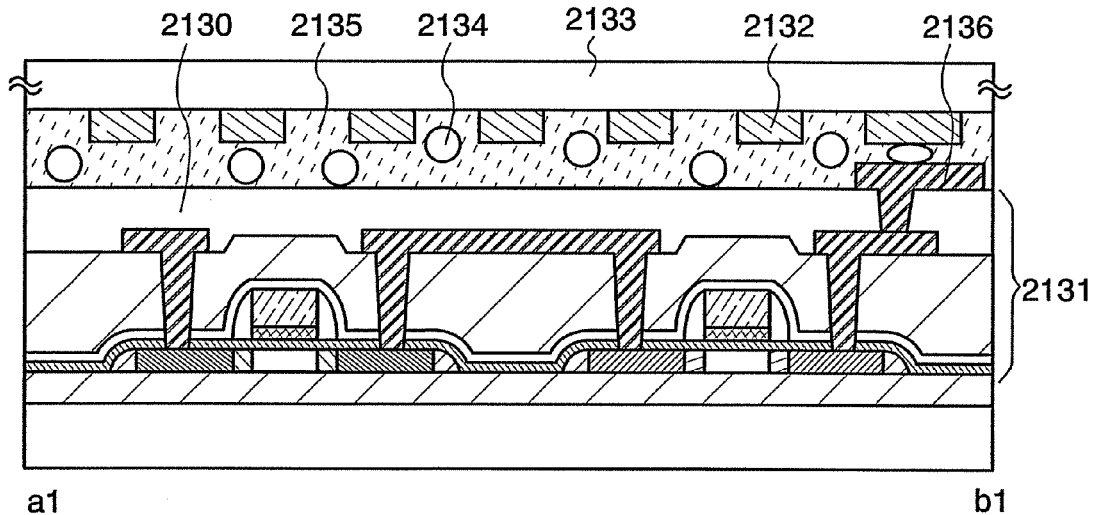

Pattern diagrams of a cross-sectional surface of a1-b1 in FIG. 29A are shown in FIGS. 29B and 29C. The conductive layer 2132 which functions as an antenna is provided above the elements for forming the memory portion and the logic portion; for example, the conductive layer 2132 which functions as an antenna can be provided above the structure described in Embodiment Mode 6 with an insulating layer 2130 interposed therebetween (see FIG. 29B). Alternatively, the conductive layer 2132 which functions as an antenna may be provided using a substrate 2133 and then the substrate 2133 and the thin film integrated circuit 2131 may be attached to each other so as to interpose the conductive layer 2132 (see FIG. 29C). Here, a conductive layer 2136 provided over the insulating layer 2130 and the conductive layer 2132 which functions as an antenna are electrically connected to each other with a conducting particle 2134 contained in an adhesive resin 2135.

Note that although the example in which the conductive layer 2132 which functions as an antenna is provided in the shape of a coil and either an electromagnetic induction method or an electromagnetic coupling method is employed is described in this embodiment mode, the semiconductor device of the present invention is not limited thereto, and a microwave method may also be employed. In the case of a microwave method, the shape of the conductive layer 2132 which functions as an antenna may be decided as appropriate depending on the wavelength of an electromagnetic wave.

Figure 30A:
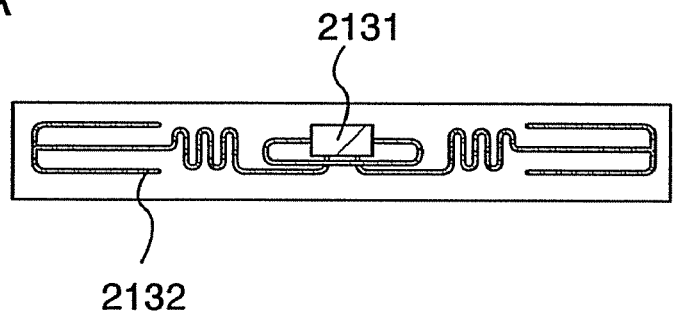
FIGS. 30A to 30D are diagrams describing antennas applicable to a semiconductor device of the present invention.
Figure 30B:
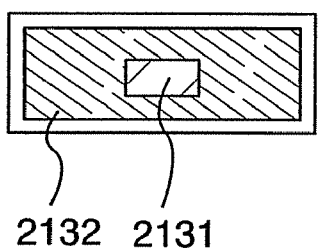
Figure 30C:
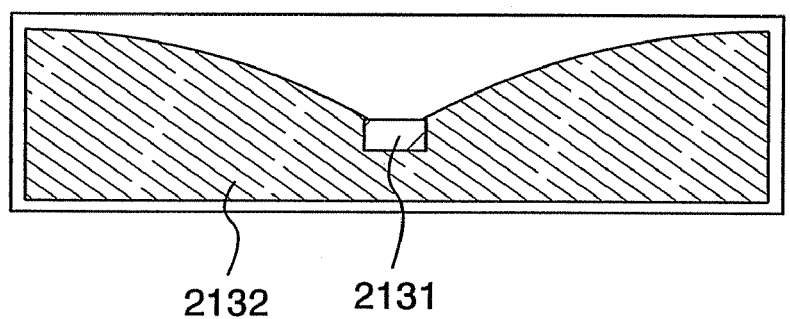
Figure 30D:
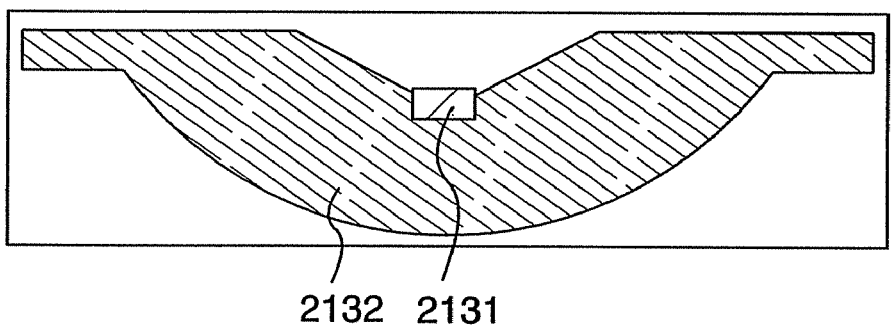

For example, when the microwave method (e.g., with an UHF band (in the range of 860 MHz to 960 MHz), a frequency band of 2.45 GHz, or the like) is employed as the signal transmission method of the semiconductor device 2180, the shape such as length of the conductive layer which functions as an antenna may be set as appropriate in consideration of the wavelength of an electromagnetic wave used in sending a signal. For example, the conductive layer which functions as an antenna can be formed in the shape of a line (e.g., a dipole antenna (see FIG. 30A)), in the flat shape (e.g., a patch antenna (see FIG. 30B)), in the shape of a ribbon (see FIGS. 30C and 30D), or the like. Further, the shape of the conductive layer 2132 which functions as an antenna is not limited to a line, and the conductive layer in the shape of a curved line, in an S-shape, or in a shape combining them may also be provided in consideration of the wavelength of the electromagnetic wave.

The conductive layer 2132 which functions as an antenna is formed of a conductive material by a CVD method, a sputtering method, a printing method such as a screen printing method or a gravure printing method, a droplet discharge method, a dispenser method, a plating method, or the like. As for the conductive material, any of a metal element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material including the element as a main component is used, and the conductive layer 2132 of a single layer structure or a stacked-layer structure may be employed.

For example, when the conductive layer 2132 which functions as an antenna is formed by a screen printing method, it can be provided by selective printing with a conductive paste in which conductive particles with a grain diameter of several nm to several tens of μm are dissolved or dispersed in an organic resin. As the conductive particle, at least one of metal particles selected from silver (Ag), gold (Ag), copper (Cu), nickel (Ni), platinum (Pt), palladium (Pd), tantalum (Ta), molybdenum (Mo), titanium (Ti), and the like; fine particles of silver halide; or dispersive nanoparticles can be used. In addition, as the organic resin included in the conductive paste, at least one of organic resins which function as a binder, a solvent, a dispersing agent, and a coating material of metal particles can be used. Typically, an organic resin such as an epoxy resin and a silicone resin can be given as examples. Further, in forming the conductive layer, it is preferable to bake the conductive paste after being provided. For example, in the case of using fine particles (e.g., with a grain diameter of 1 nm or more and 100 nm or less) containing silver as a main component as a material of the conductive paste, the conductive layer can be formed by baking the conductive paste at temperatures in the range of 150° C. to 300° C. to be hardened. Alternatively, fine particles containing solder or lead-free solder as a main component may be used. In this case, fine particles with a grain diameter of 20 μm or less are preferably used. Solder and lead-free solder have the advantage of low cost.

In this manner, low power consumption can be achieved when the present invention is applied to a semiconductor device to/from which data can be inputted/outputted noncontactly, which is particularly effective in the case of a small semiconductor device.

Next, an operation example of the semiconductor device according to this embodiment mode is described.

Figure 31A:
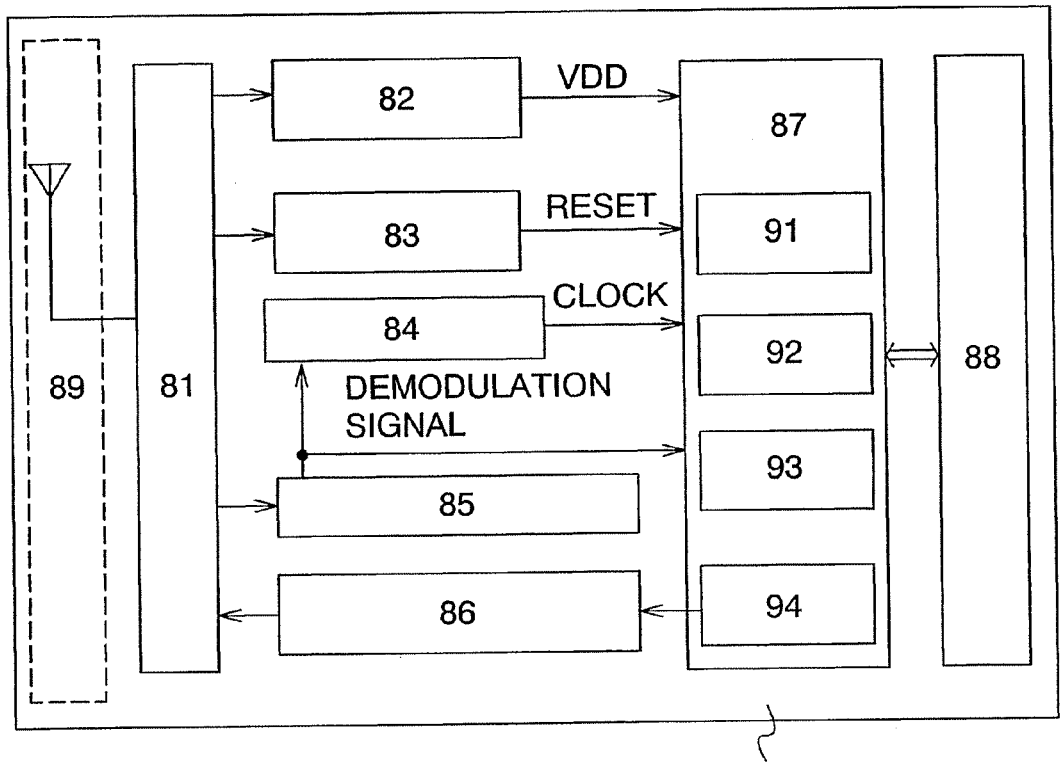
FIG. 31A is a block diagram showing one example of a semiconductor device of the present invention and FIGS. 31B and 31C are diagrams showing examples of usage pattern thereof.

The semiconductor device 2180 has a function of exchanging data noncontactly, and includes a high-frequency circuit 81, a power source circuit 82, a reset circuit 83, a clock generating circuit 84, a data demodulating circuit 85, a data modulating circuit 86, a controlling circuit 87 for controlling another circuit, a memory circuit 88, and an antenna 89 (see FIG. 31A). The high-frequency circuit 81 receives a signal from the antenna 89 and then outputs a signal received from the data modulating circuit 86, through the antenna 89. The power source circuit 82 generates a power source potential from a received signal. The reset circuit 83 generates a reset signal. The clock generating circuit 84 generates various clock signals based on a received signal inputted from the antenna 89. The data demodulating circuit 85 demodulates a received signal and outputs to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the controlling circuit 87. The code judging circuit 92 judges the content of the instruction by comparing each extracted code with a code corresponding to a reference. The CRC judging circuit 93 detects whether or not there is a transmission error or the like based on a judged code. In FIG. 31A, in addition to the controlling circuit 87, the high-frequency circuit 81 and the power source circuit 82 which are analog circuits are included.

Next, one example of an operation of the aforementioned semiconductor device is described. First, a wireless signal is received by the antenna 89 and then sent to the power source circuit 82 through the high-frequency circuit 81, so that a high power source potential (hereinafter referred to as VDD) is generated. VDD is supplied to each circuit in the semiconductor device 2180. A signal sent to the data demodulating circuit 85 through the high-frequency circuit 81 is demodulated (hereinafter this signal is called a demodulated signal). Moreover, signals passed through the reset circuit 83 and the clock generating circuit 84 from the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device stored in the memory circuit 88 is outputted.

The outputted information of the semiconductor device is encoded through the output unit circuit 94. Further, the encoded information of the semiconductor device 2180 passes through the data modulating circuit 86 and then is sent by the antenna 89 while being superimposed on a wireless signal. Note that a low power source potential (hereinafter called VSS) is common in the plurality of circuits included in the semiconductor device 2180 and GND can be used as VSS.

In this manner, by sending a signal from a reader/writer to the semiconductor device 2180 and receiving a signal sent from the semiconductor device 2180 by the reader/writer, data of the semiconductor device can be read.

Further, in the semiconductor device 2180, power source voltage may be supplied to each circuit by electromagnetic waves without providing a power supply (a battery), or a power supply (battery) may be provided so that power supply voltage is supplied to each circuit by both electromagnetic waves and the power supply (battery).

Figure 31B:
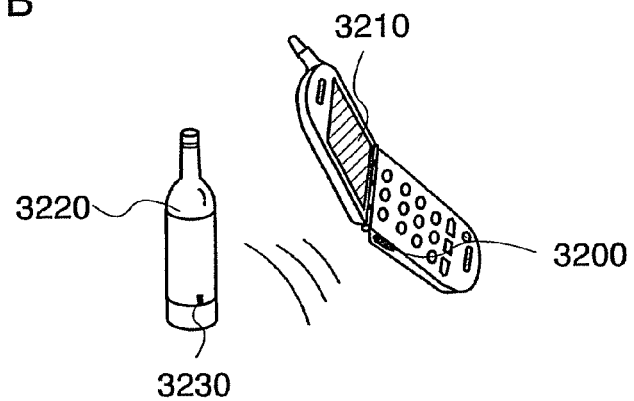
Figure 31C:
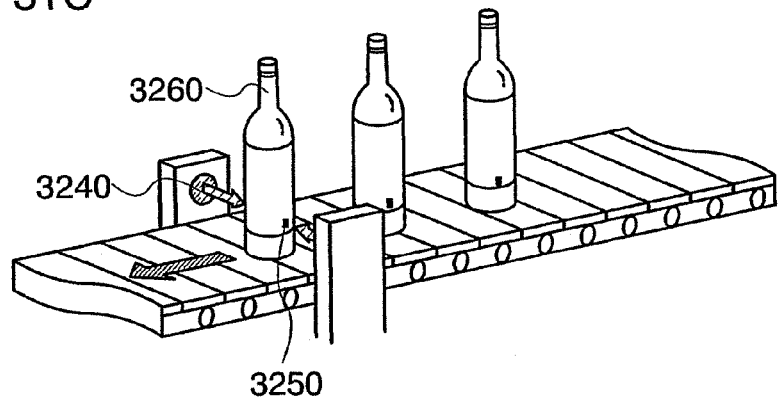

Next, one example of usage mode of a semiconductor device to/from which data can be inputted/outputted concontactly is described. A side surface of a mobile terminal including a display portion 3210 is provided with a reader/writer 3200, and a side surface of a product 3220 is provided with a semiconductor device 3230 (see FIG. 31B). When the reader/writer 3200 is held over the semiconductor device 3230 included in the product 3220, the display portion 3210 displays information on the product, such as a row material, a place of origin, an inspection result for each production step, a history of distribution process, description of the product, or the like. Further, when a product 3260 is transferred by a conveyer belt, the product 3260 can be inspected by using a reader/writer 3240 and a semiconductor device 3250 provided for the product 3260 (see FIG. 31C). As the semiconductor devices 3230 and 3250, the aforementioned semiconductor device 2180 can be applied. In this manner, by using the semiconductor device according to the present invention in the system, information can be obtained easily and high performance and a high added value are achieved. Further, since the semiconductor device according to the present invention can realize low power consumption, a semiconductor device provided for a product can be downsized.

Note that an applicable range of the semiconductor device according to the present invention is wide in addition to the above, and the semiconductor device can be applied to any product as long as it clarifies information of an object, such as the history thereof, noncontactly and is useful for production, management, or the like. For example, the semiconductor device can be provided for bills, coins, securities, certificates, bearer bonds, packing containers, books, recording media, personal belongings, vehicles, food, clothing, health products, commodities, medicine, electronic devices, and the like. Examples of them are described with reference to FIGS. 28A to 28H.

The bills and coins are money distributed to the market, and include one valid in a certain area (a cash voucher), memorial coins, and the like. The securities refer to checks, certificates, promissory notes, and the like (see FIG. 28A). The certificates refer to driver's licenses, certificates of residence, and the like (see FIG. 28B). The bearer bonds refer to stamps, rice coupons, various gift certificates, and the like (see FIG. 28C). The packing containers refer to wrapping paper for food containers and the like, plastic bottles, and the like (see FIG. 28D). The books refer to hardbacks, paperbacks, and the like (see FIG. 28E). The recording media refer to DVD software, video tapes, and the like (see FIG. 28F). The vehicles refer to wheeled vehicles such as bicycles, ships, and the like (see FIG. 28G). The personal belongings refer to bags, glasses, and the like (see FIG. 28H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), cellular phones, and the like.

Forgery can be prevented by providing the semiconductor device 2180 for the bills, the coins, the securities, the certificates, the bearer bonds, or the like. Further, the efficiency of an inspection system, a system used in a rental shop, or the like can be improved by providing the semiconductor device 2180 for the packing containers, the books, the recording media, the personal belongings, the food, the commodities, the electronic devices, or the like. Forgery or theft can be prevented by providing the semiconductor device 2180 on the vehicles, the health products, the medicine, or the like; in the case of the medicine, medicine can be prevented from being taken mistakenly. The semiconductor device 2180 can be provided by being attached to the surface or being embedded in the object. For example, in the case of a book, the semiconductor device 2180 may be embedded in the paper; and in the case of a package made from an organic resin, the semiconductor device 2180 may be embedded in the organic resin.

As described above, the efficiency of an inspection system, a system used in a rental shop, or the like can be improved by providing the semiconductor device for the packing containers, the recording media, the personal belonging, the food, the clothing, the commodities, the electronic devices, or the like. Further, by providing the semiconductor device for the vehicles, forgery or theft of the vehicles can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

This embodiment mode can be freely combined with any of the above embodiment modes.

This application is based on Japanese Patent Application Serial No. 2006-327921 filed with Japan Patent Office on Dec. 5, 2006, the entire contents of which are hereby incorporated by reference.

What is claimed is:
1. A semiconductor device comprising:
a substrate;
an insulating layer over the substrate;
an island-shaped single crystalline semiconductor layer over the insulating layer;
a gate insulating layer including:
 a first insulating layer in contact with a top surface of the island-shaped single crystalline semiconductor layer;
 a second insulating layer in contact with a side surface of the island-shaped single crystalline semiconductor layer; and
a gate electrode over the gate insulating layer, wherein the gate electrode is provided so as to get across the island-shaped single crystalline semiconductor layer,
wherein a dielectric constant of the second insulating layer is lower than a dielectric constant of the first insulating layer, and
wherein a surface of the second insulating layer is curved convexly with respect to the side surface of the island-shaped single crystalline semiconductor layer.

2. The semiconductor device according to claim 1, wherein a part of the second insulating layer is overlapped with the gate electrode.

3. The semiconductor device according to claim 1, wherein the gate insulating layer which is in contact with the side surface of the island-shaped single crystalline semiconductor layer is thicker than that in contact with the top surface of the island-shaped single crystalline semiconductor layer.

4. The semiconductor device according to claim 3, wherein a thickness of the gate insulating layer satisfies $t1<t2\leqq3t1$, where the t1 is a thickness of a region in contact with the top surface of the island-shaped single crystalline semiconductor layer, and the t2 is a thickness of a region in contact with the side surface of the island-shaped single crystalline semiconductor layer.

5. The semiconductor device according to claim 1, wherein the gate insulating layer includes a third insulating layer which is interposed between the first insulating layer and the second insulating layer.

6. The semiconductor device according to claim 1, wherein a taper angle of an end portion of the island-shaped single crystalline semiconductor layer is 45° or more and less than 95°.

7. The semiconductor device according to claim 1, wherein the substrate is a single crystalline silicon substrate.

8. The semiconductor device according to claim 1, wherein the insulating layer is a buried oxide film.

9. The semiconductor device according to claim 1, wherein the semiconductor device is one selected from the group consisting of an RFID tag, an ID tag, an IC tag, an IC chip, an RF tag, a wireless tag, an electronic tag, and a wireless chip.

10. A semiconductor device comprising:
a substrate;
an insulating layer over the substrate;
an island-shaped single crystalline semiconductor layer over the insulating layer;
a gate insulating layer including:
a first insulating layer in contact with a top surface of the island-shaped single crystalline semiconductor layer;
a second insulating layer in contact with a side surface of the island-shaped single crystalline semiconductor layer; and
a gate electrode over the gate insulating layer, wherein the gate electrode is provided so as to get across the island-shaped single crystalline semiconductor layer, and wherein the gate electrode contains a first conductive layer and a second conductive layer over the first conductive layer,
wherein a dielectric constant of the second insulating layer is lower than a dielectric constant of the first insulating layer, and
wherein a surface of the second insulating layer is curved convexly with respect to the side surface of the island-shaped single crystalline semiconductor layer.

11. The semiconductor device according to claim 10, wherein a part of the second insulating layer is overlapped with the gate electrode.

12. The semiconductor device according to claim 10, wherein the gate insulating layer which is in contact with the side surface of the island-shaped single crystalline semiconductor layer is thicker than that in contact with the top surface of the island-shaped single crystalline semiconductor layer.

13. The semiconductor device according to claim 12, wherein a thickness of the gate insulating layer satisfies $t1<t2\leqq3t1$, where the t1 is a thickness of a region in contact with the top surface of the island-shaped single crystalline semiconductor layer, and the t2 is a thickness of a region in contact with the side surface of the island-shaped single crystalline semiconductor layer.

14. The semiconductor device according to claim 10, wherein the gate insulating layer includes a third insulating layer which is interposed between the first insulating layer and the second insulating layer.

15. The semiconductor device according to claim 10, wherein a taper angle of an end portion of the island-shaped single crystalline semiconductor layer is 45° or more and less than 95°.

16. The semiconductor device according to claim 10, wherein the substrate is a single crystalline silicon substrate.

17. The semiconductor device according to claim 10, wherein the insulating layer is a buried oxide film.

18. The semiconductor device according to claim 10, wherein the semiconductor device is one selected from the group consisting of an RFID tag, an ID tag, an IC tag, an IC chip, an RF tag, a wireless tag, an electronic tag, and a wireless chip.

19. A semiconductor device comprising:
a substrate;
an insulating layer over the substrate;
an island-shaped single crystalline semiconductor layer over the insulating layer;
a gate insulating layer including:
a first insulating layer in contact with a top surface of the island-shaped single crystalline semiconductor layer;
a second insulating layer in contact with a side surface of the island-shaped single crystalline semiconductor layer; and
a gate electrode over the gate insulating layer, wherein the gate electrode is provided so as to get across the island-shaped single crystalline semiconductor layer, wherein the gate electrode contains a first conductive layer and a second conductive layer over the first conductive layer, and wherein the first conductive layer is wider than the second conductive layer,
wherein a dielectric constant of the second insulating layer is lower than a dielectric constant of the first insulating layer, and
wherein a surface of the second insulating layer is curved convexly with respect to the side surface of the island-shaped single crystalline semiconductor layer.

20. The semiconductor device according to claim 19, wherein the second insulating layer is overlapped with the gate electrode.

21. The semiconductor device according to claim 19, wherein the gate insulating layer which is in contact with the side surface of the island-shaped single crystalline semiconductor layer is thicker than that in contact with the top surface of the island-shaped single crystalline semiconductor layer.

22. The semiconductor device according to claim 21, wherein a thickness of the gate insulating layer satisfies $t1<t2\leqq3t1$, where the t1 is a thickness of a region in contact with the top surface of the island-shaped single crystalline semiconductor layer, and the t2 is a thickness of a region in contact with the side surface of the island-shaped single crystalline semiconductor layer.

23. The semiconductor device according to claim 19, wherein the gate insulating layer includes a third insulating layer which is interposed between the first insulating layer and the second insulating layer.

24. The semiconductor device according to claim 19, wherein a taper angle of an end portion of the island-shaped single crystalline semiconductor layer is 45° or more and less than 95°.

25. The semiconductor device according to claim 19, wherein the substrate is a single crystalline silicon substrate.

26. The semiconductor device according to claim 19, wherein the insulating layer is a buried oxide film.

27. The semiconductor device according to claim 19, wherein the semiconductor device is one selected from the group consisting of an RFID tag, an ID tag, an IC tag, an IC chip, an RF tag, a wireless tag, an electronic tag, and a wireless chip.

* * * * *